(12) United States Patent
Peri et al.

(10) Patent No.: US 9,780,182 B2
(45) Date of Patent: Oct. 3, 2017

(54) MOLYBDENUM-CONTAINING CONDUCTIVE LAYERS FOR CONTROL GATE ELECTRODES IN A MEMORY STRUCTURE

(71) Applicant: SANDISK TECHNOLOGIES INC., Plano, TX (US)

(72) Inventors: Somesh Peri, San Jose, CA (US); Raghuveer S. Makala, Campbell, CA (US); Sateesh Koka, Milpitas, CA (US); Yao-Sheng Lee, Tampa, FL (US); Johann Alsmeier, San Jose, CA (US); George Matamis, Danville, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/751,689

(22) Filed: Jun. 26, 2015

(65) Prior Publication Data
US 2016/0225866 A1    Aug. 4, 2016

Related U.S. Application Data

(63) Continuation-in-part of application No. 14/613,956, filed on Feb. 4, 2015.

(51) Int. Cl.
*H01L 29/49* (2006.01)
*H01L 21/28* (2006.01)
(Continued)

(52) U.S. Cl.
CPC .... *H01L 29/4966* (2013.01); *H01L 21/28273* (2013.01); *H01L 21/28282* (2013.01);
(Continued)

(58) Field of Classification Search
CPC .......... H01L 29/4966; H01L 27/11575; H01L 27/11573; H01L 29/7926; H01L 27/11582;
(Continued)

(56) References Cited

U.S. PATENT DOCUMENTS 5,084,417 A    1/1992  Joshi et al.
5,583,360 A    12/1996 Roth et al.
(Continued)

FOREIGN PATENT DOCUMENTS

WO    WO02/15277 A2    2/2002

OTHER PUBLICATIONS

Tanaka et al., "Bit-Cost Scalable Technology for Low-Cost and Ultrahigh-Density Flash Memory," Toshiba Review, vol. 63, No. 2, 2008, pp. 28-31.
(Continued)

*Primary Examiner* — Yu Chen
*Assistant Examiner* — Nilufa Rahim
(74) *Attorney, Agent, or Firm* — The Marbury Law Group PLLC

(57) ABSTRACT

A memory film and a semiconductor channel can be formed within each memory opening that extends through a stack including an alternating plurality of insulator layers and sacrificial material layers. After formation of backside recesses through removal of the sacrificial material layers selective to the insulator layers, a metallic barrier material portion can be formed in each backside recess. A molybdenum-containing portion can be formed in each backside recess. Each backside recess can be filled with a molybdenum-containing portion alone, or can be filled with a combination of a molybdenum-containing portion and a metallic material portion including a material other than molybdenum.

16 Claims, 44 Drawing Sheets

(51) Int. Cl.

| | | |
|---|---|---|
| H01L 29/792 | (2006.01) | |
| H01L 27/11582 | (2017.01) | |
| H01L 27/11573 | (2017.01) | |
| H01L 27/11575 | (2017.01) | |
| H01L 29/66 | (2006.01) | |
| H01L 29/788 | (2006.01) | |
| H01L 27/11556 | (2017.01) | |
| H01L 27/11534 | (2017.01) | |
| H01L 27/11548 | (2017.01) | |

(52) U.S. Cl.
CPC .. *H01L 27/11573* (2013.01); *H01L 27/11575* (2013.01); *H01L 27/11582* (2013.01); *H01L 29/66833* (2013.01); *H01L 29/7926* (2013.01); *H01L 27/11534* (2013.01); *H01L 27/11548* (2013.01); *H01L 27/11556* (2013.01); *H01L 29/66825* (2013.01); *H01L 29/7889* (2013.01)

(58) Field of Classification Search
CPC ......... H01L 29/66833; H01L 21/28282; H01L 21/28273; H01L 27/11548; H01L 27/11534; H01L 29/7889; H01L 27/11556; H01L 29/66825; H01L 29/495; H01L 29/6682

See application file for complete search history.

(56) References Cited

U.S. PATENT DOCUMENTS

| | | | |
|---|---|---|---|
| 5,807,788 A | 9/1998 | Brodsky et al. | |
| 5,897,354 A | 4/1999 | Kachelmeier | |
| 5,915,167 A | 6/1999 | Leedy | |
| 6,238,978 B1 | 5/2001 | Huster | |
| 6,759,343 B2 | 7/2004 | Lee et al. | |
| 6,953,697 B1 | 10/2005 | Castle et al. | |
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,745,312 B2 | 6/2010 | Herner et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi et al. | |
| 8,008,722 B2 | 8/2011 | Kim et al. | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,237,213 B2 | 8/2012 | Liu | |
| 8,283,228 B2 | 10/2012 | Alsmeier | |
| 8,349,681 B2 | 1/2013 | Alsmeier et al. | |
| 8,445,347 B2 | 5/2013 | Alsmeier | |
| 8,461,000 B2 | 6/2013 | Alsmeier et al. | |
| 8,580,639 B2 | 11/2013 | Alsmeier et al. | |
| 8,765,543 B2 | 7/2014 | Alsmeier et al. | |
| 8,829,591 B2 | 9/2014 | Alsmeier | |
| 8,928,061 B2 | 1/2015 | Chien et al. | |
| 8,946,810 B2 | 2/2015 | Alsmeier | |
| 2007/0138643 A1 | 6/2007 | Joo | |
| 2007/0210338 A1 | 9/2007 | Orlowski | |
| 2007/0252201 A1 | 11/2007 | Kito et al. | |
| 2008/0173928 A1 | 7/2008 | Arai et al. | |
| 2009/0283819 A1 | 11/2009 | Ishikawa et al. | |
| 2009/0294828 A1 | 12/2009 | Ozawa et al. | |
| 2010/0044778 A1 | 2/2010 | Seol et al. | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho et al. | |
| 2010/0163968 A1 | 7/2010 | Kim et al. | |
| 2010/0181610 A1 | 7/2010 | Kim et al. | |
| 2010/0207195 A1 | 8/2010 | Fukuzumi et al. | |
| 2010/0213527 A1* | 8/2010 | Shim | H01L 27/11565 257/314 |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0012921 A1 | 1/2012 | Liu | |
| 2013/0059422 A1* | 3/2013 | Lee | H01L 21/764 438/268 |
| 2013/0248974 A1 | 9/2013 | Alsmeier et al. | |
| 2013/0264631 A1 | 10/2013 | Alsmeier et al. | |
| 2013/0313627 A1 | 11/2013 | Lee et al. | |
| 2014/0008714 A1 | 1/2014 | Makala et al. | |
| 2014/0225181 A1 | 8/2014 | Makala et al. | |
| 2014/0353738 A1 | 12/2014 | Makala et al. | |
| 2015/0035073 A1* | 2/2015 | Ando | H01L 21/28229 257/369 |
| 2015/0072488 A1 | 3/2015 | Chien et al. | |
| 2015/0115348 A1* | 4/2015 | Nam | H01L 27/11582 257/324 |
| 2015/0171099 A1 | 6/2015 | Alsmeier | |
| 2015/0179662 A1 | 6/2015 | Makala et al. | |
| 2016/0118399 A1* | 4/2016 | Son | G11C 5/025 365/185.18 |

OTHER PUBLICATIONS

Masahide Kimura, "3D Cells Make Terabit NAND Flash Possible," Nikkei Electronics Asia, Sep. 17, 2009, 6pgs.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM—2010 Proceedings, Dec. 6-8, 2010, pp. 668-671.
International Search Report & Written Opinion, PCT/US2011/042566, dated Jan. 17, 2012.
Invitation to Pay Additional Fees and Partial International Search Report, PCT/US2011/042566, dated Sep. 28, 2011.
Endoh et al., "Novel Ultra High Density Memory with a Stacked-Surrounding Gate Transistor (S-SGT) Structured Cell," IEDM Proc., (2001), 33-36.
Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-shaped BiCS Flash Memory," 2009 Symposium on VLSI Technology Digest of Technical Papers, pp. 22-23.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
International Preliminary Report on Patentability, PCT/US2011/042566, dated Jan. 17, 2013.
Au et al., "Filling Narrow Trenches by Iodine-Catalyzed CVD of Copper and Manganese on Manganese Nitride Barrier/Adhesion Layers," Journal of the Electrochemical Society, 158(5) (2011).

(56) References Cited

OTHER PUBLICATIONS

Kim et al., "Direct Copper Electroless Deposition on a Tungsten Barrier Layer for Ultralarge Scale Integration," Journal of the Electrochemical Society, vol. 152, Issue 2, 2005.
European Patent Office Communication Article 94(3), Application No. EP 11745848.9, dated May 12, 2015.
Cha et al., "Effect of Thermal Annealing on the Structure, Morphology, and Electrical Properties of Mo Bottom Electrodes for Solar Cell Applications," Journal of the Korean Physical Society, vol. 59, No. 3, pp. 2280-2285.
U.S. Appl. No. 14/587,368, filed Dec. 31, 2014, SanDisk Technologies Inc.
International Search Report for PCT/US2015/045205, dated Feb. 2, 2016, 7 pages.
Written Opinion of the International Searching Authority for PCT/US2015/045205, dated Feb. 2, 2016, 10 pages.
U.S. Office Action Communication for U.S. Appl. No. 14/613,956, issued Apr. 11, 2016, 30 pages.
European Office Communication Pursuant to Article 94(3) EPC for EP Application No. 11745848.9, dated Feb. 26, 2016, 5 pages.
International Preliminary Report on Patentability and Written Opinion of the International Searching Authority for International Patent Application No. PCT/US2015/045205, issued Mar. 2, 2017, 12 pages.
Wang, Shi-Qing, "Barriers Against Copper Diffusion into Silicon and Drift Through Silicon Dioxide," Abstract of MRS Bulletin, vol. 19, Issue 8, pp. 30-40, (1994).
First Chinese Office Action from State Intellectual Property Office for Chinese Application No. 201510175188.8, dated Apr. 19, 2017, with English-language translation, 19 pages.
U.S. Appl. No. 15/223,729, Office Action dated Jul. 25, 2017, 18pgs.

\* cited by examiner

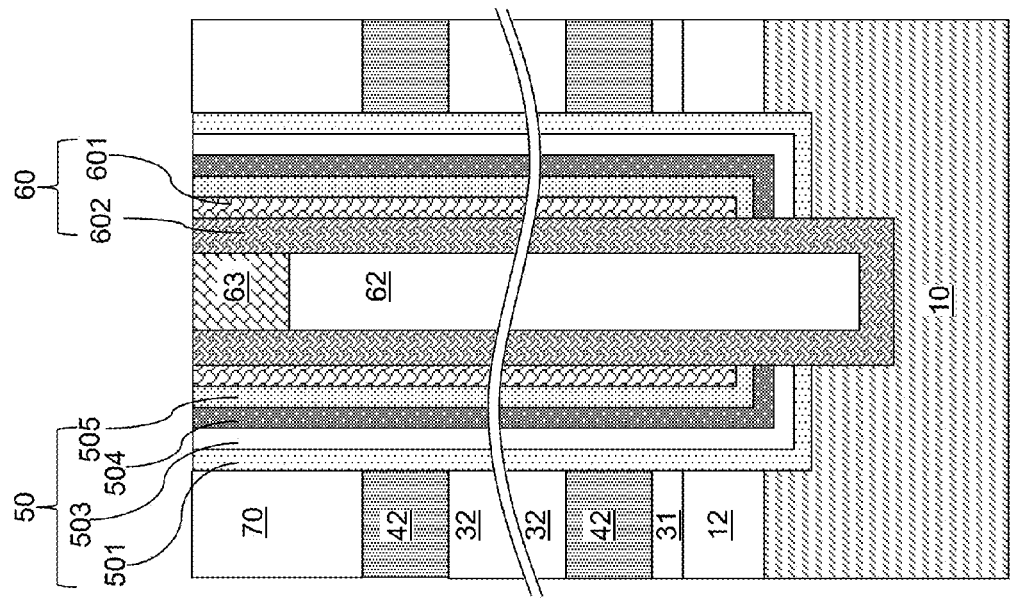
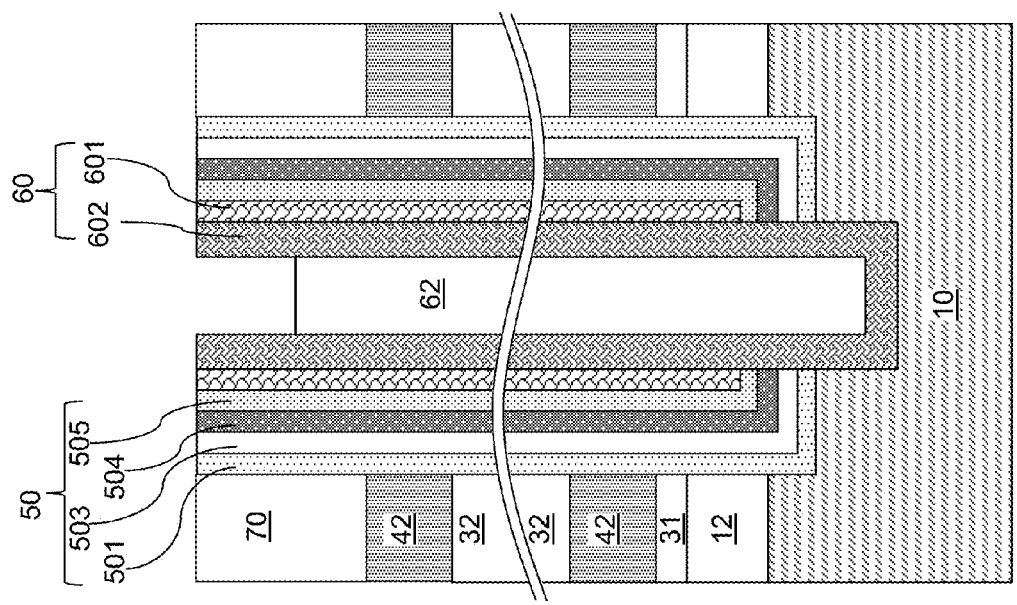

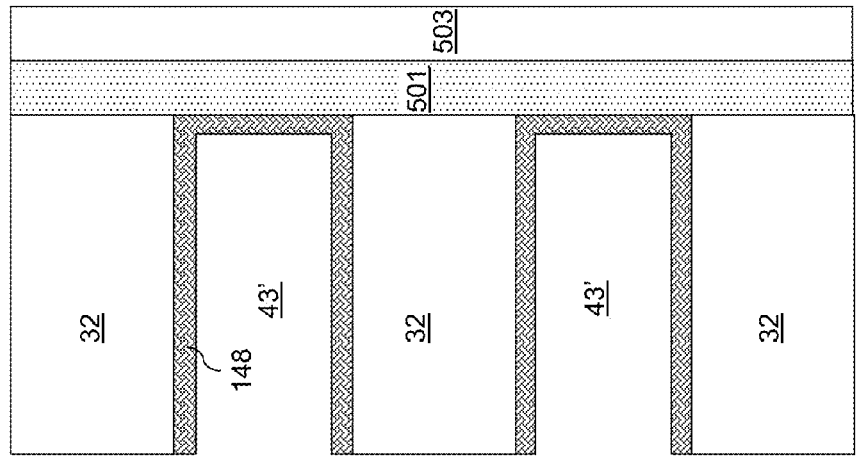
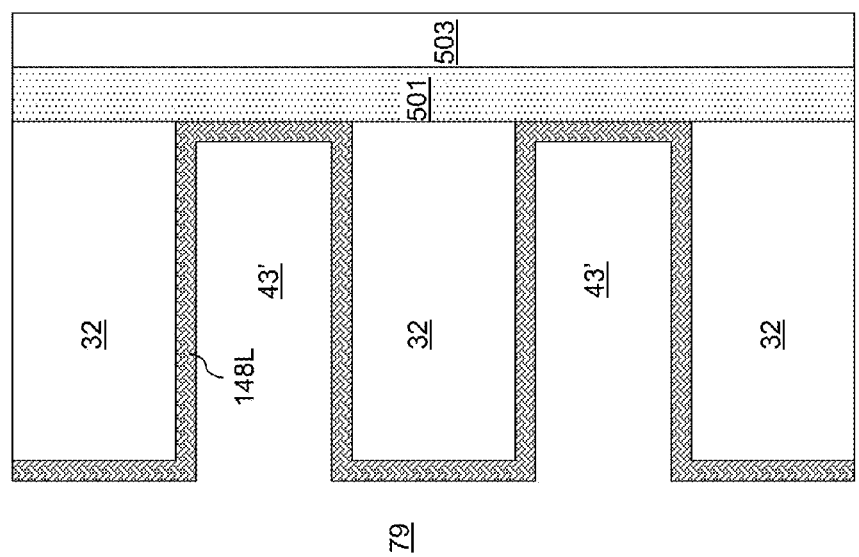

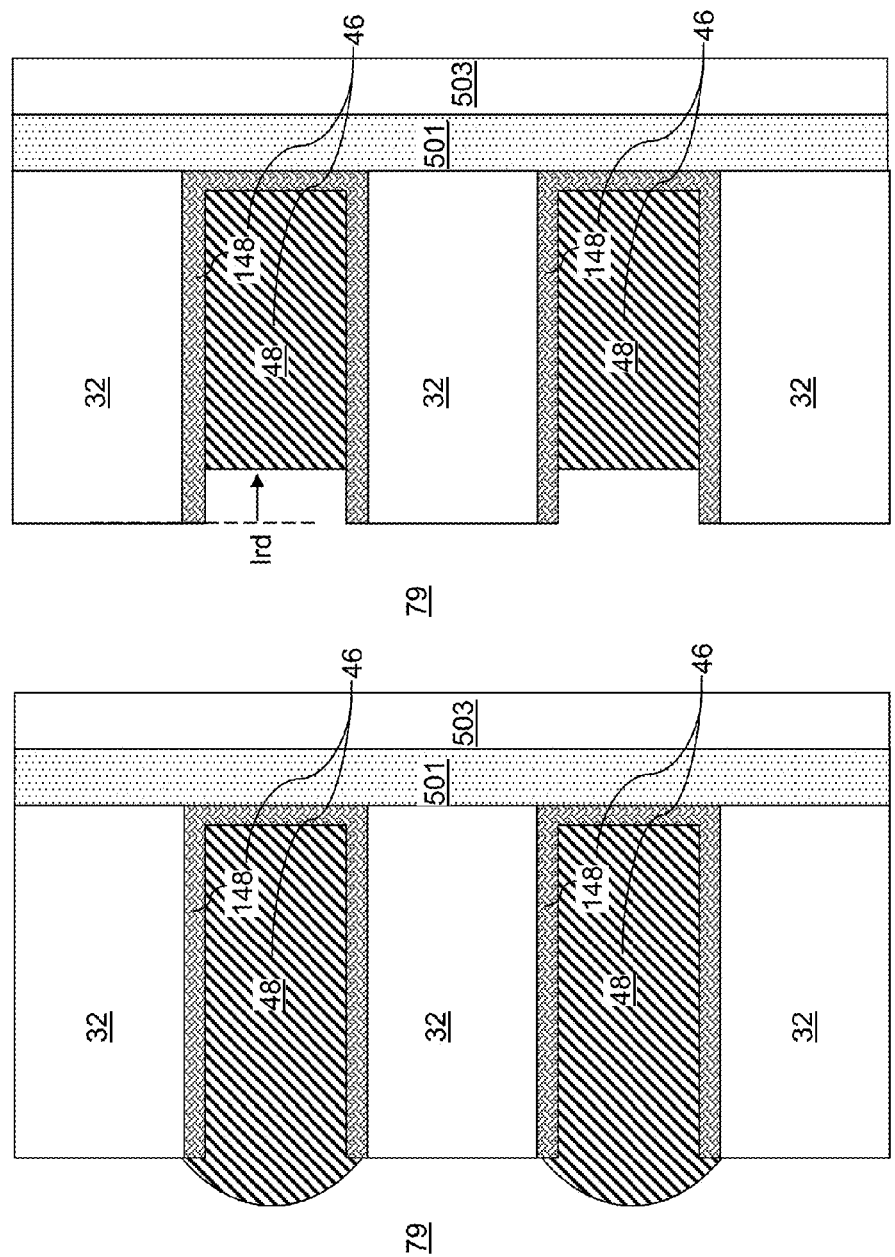

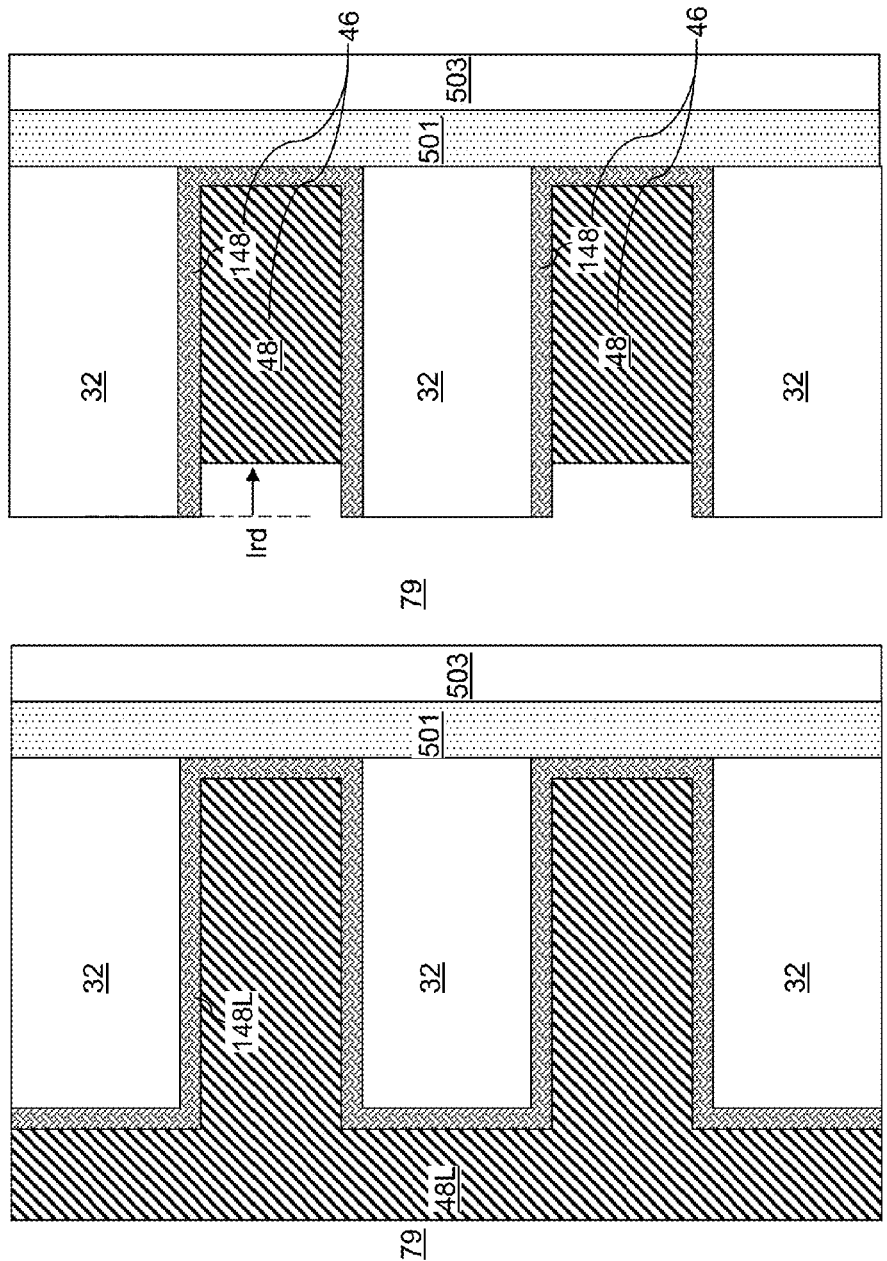

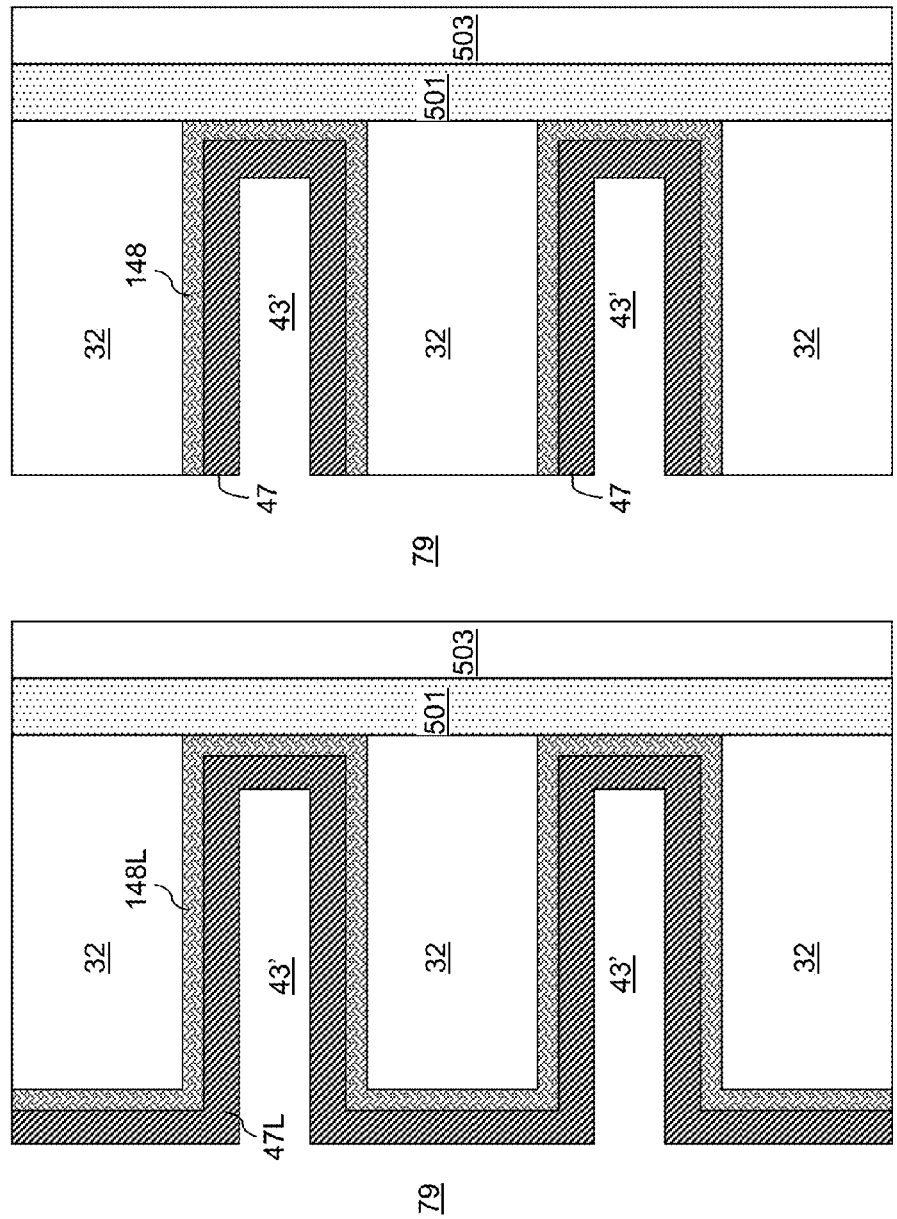

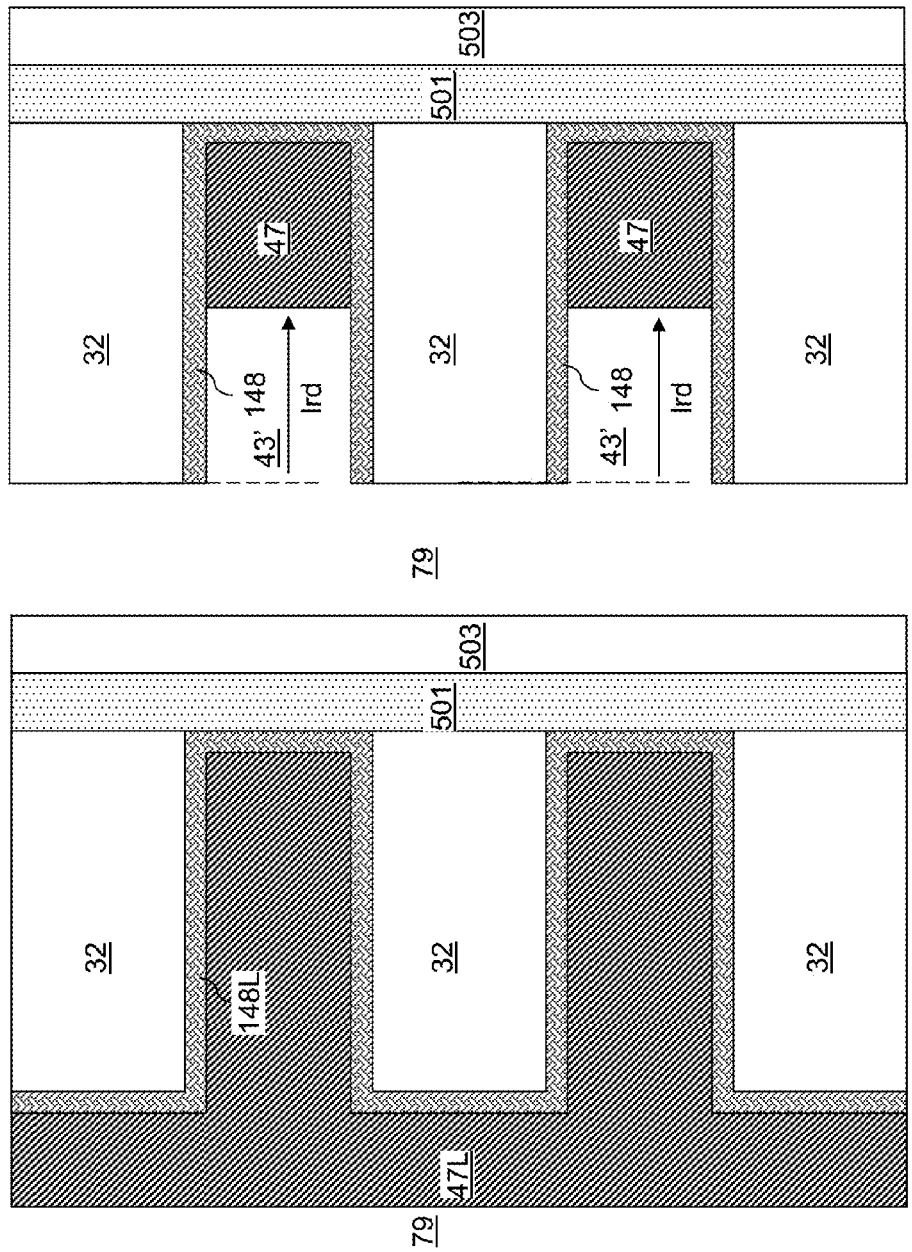

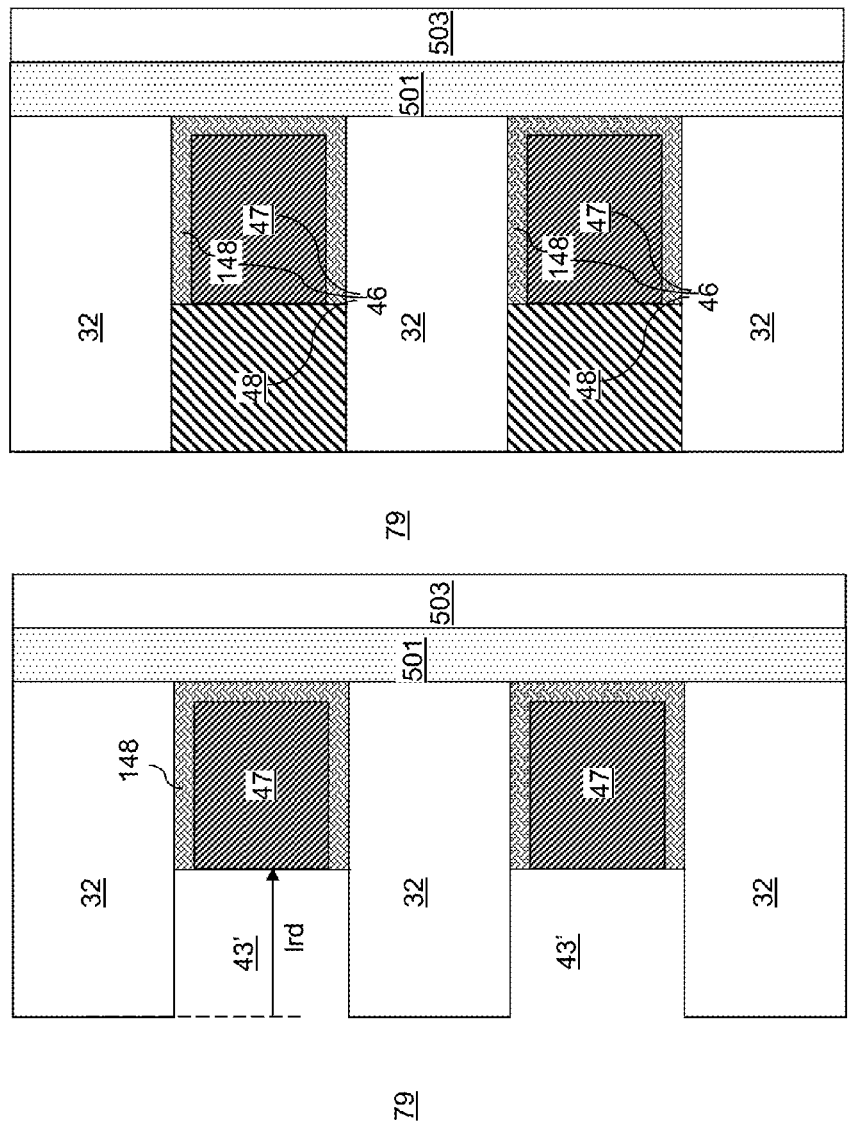

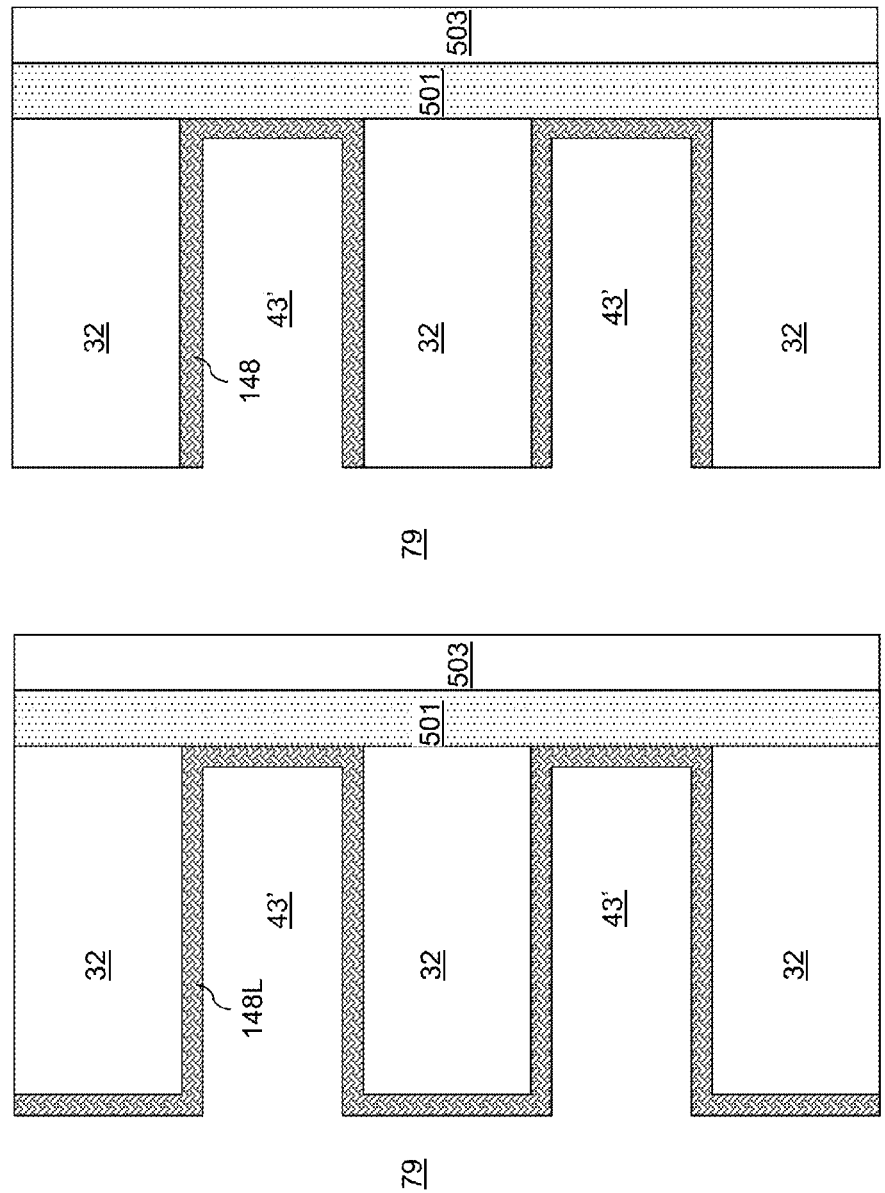

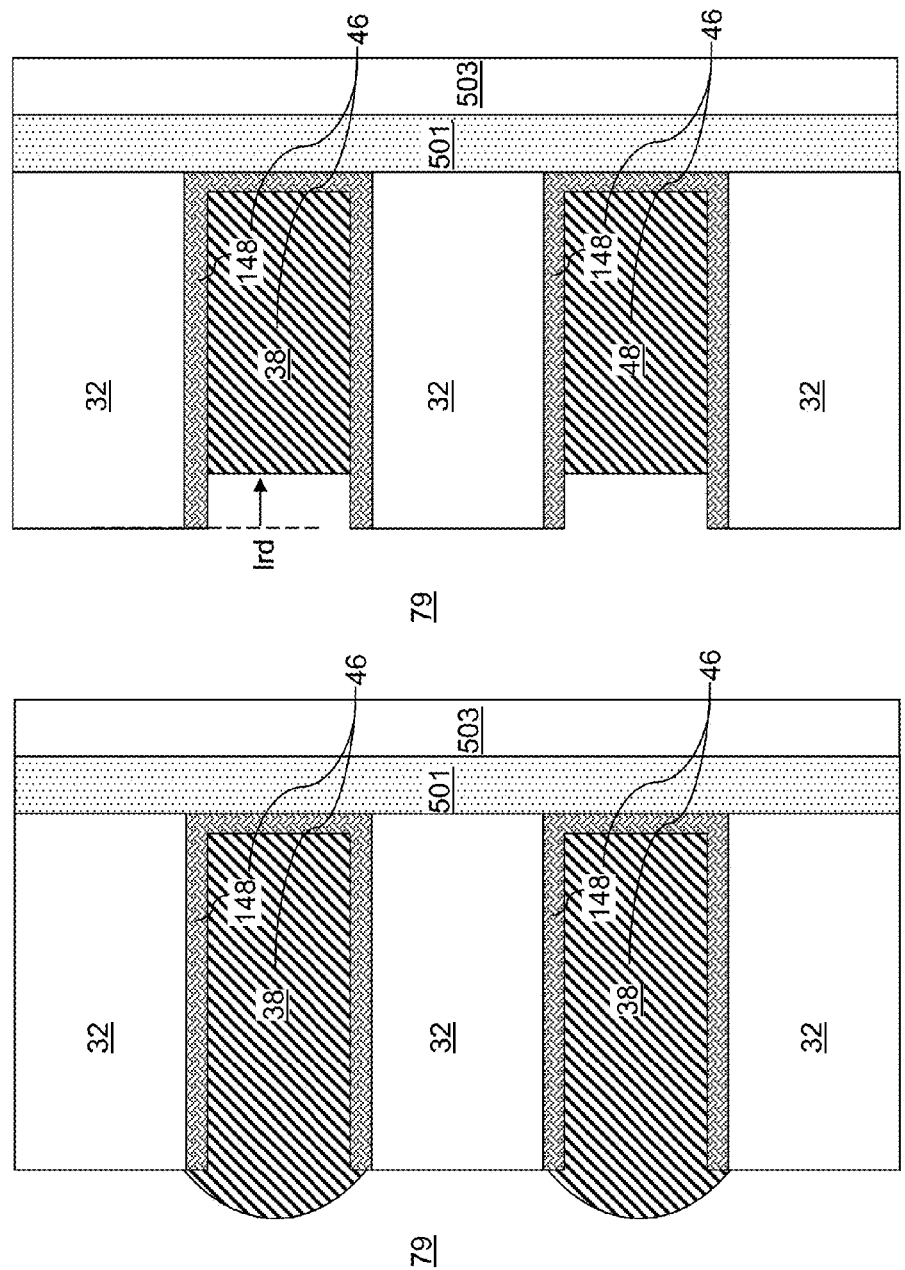

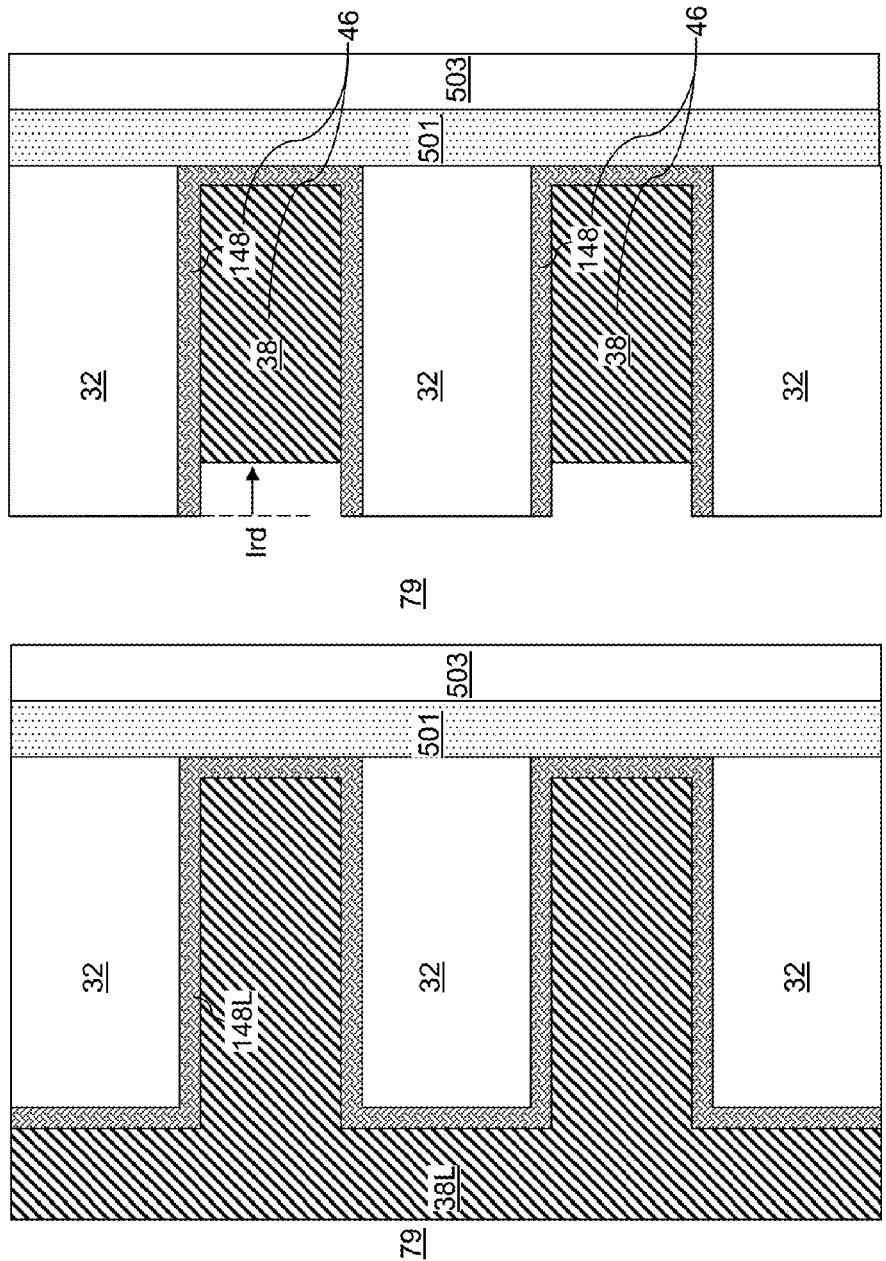

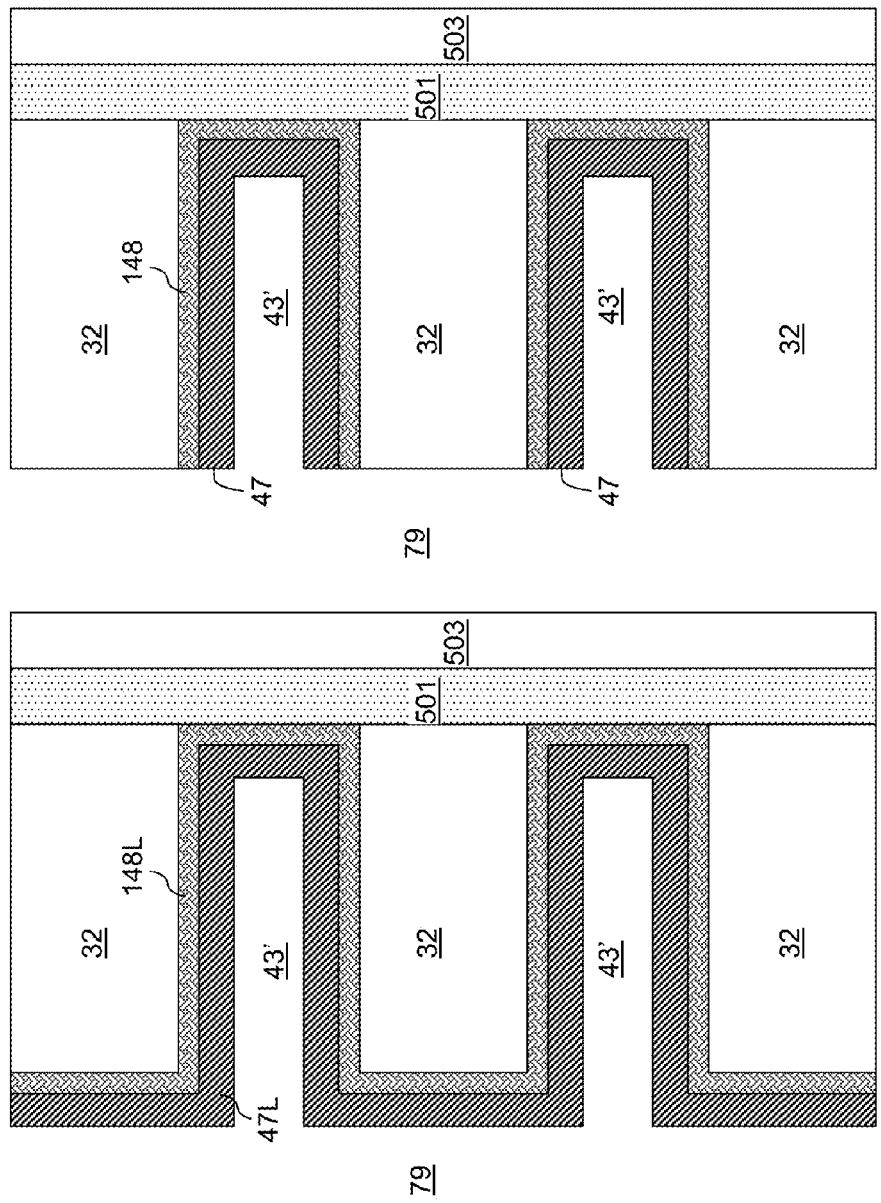

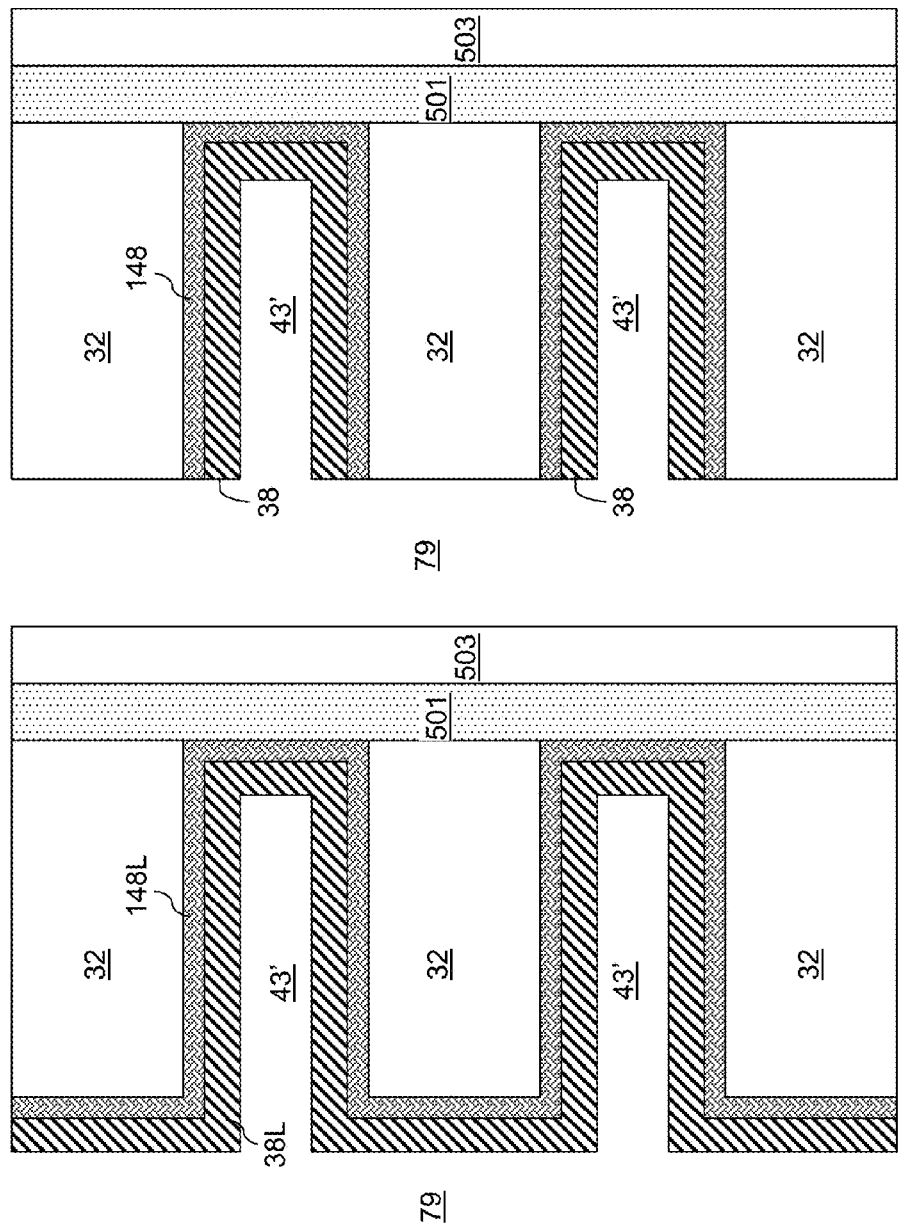

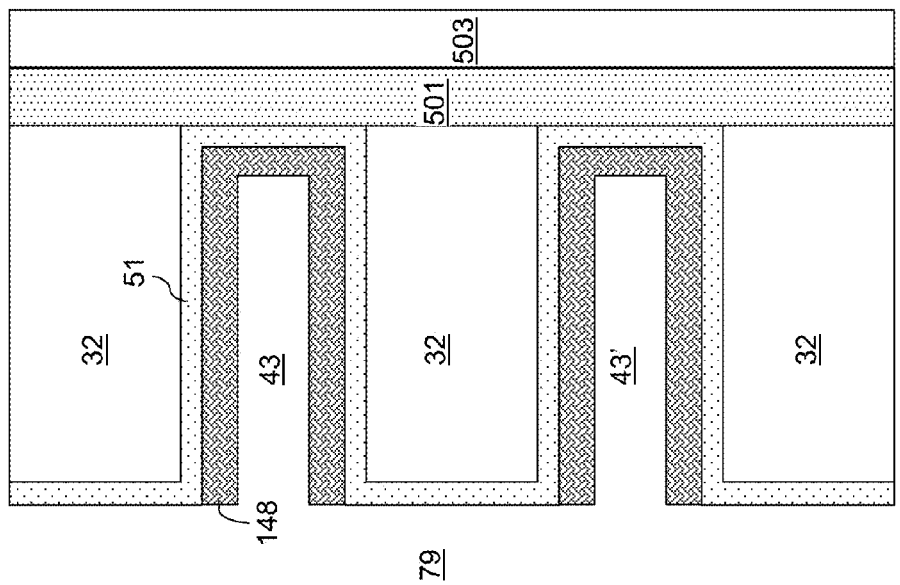
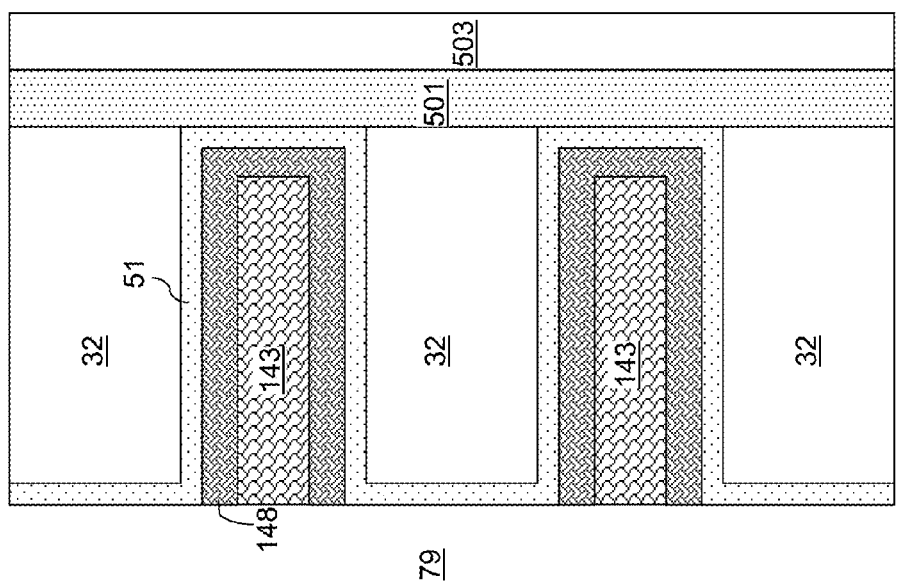

MOLYBDENUM-CONTAINING CONDUCTIVE LAYERS FOR CONTROL GATE ELECTRODES IN A MEMORY STRUCTURE

CROSS REFERENCE TO RELATED APPLICATIONS

The present application is a continuation-in-part of U.S. application Ser. No. 14/613,956, filed Feb. 4, 2015, which is incorporated herein by reference in their entirety.

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises a stack of alternating layers comprising insulator layers and electrically conductive layers and located over a substrate, a memory opening extending through the stack, and a memory film and a semiconductor channel located within the memory opening. Each of the electrically conductive layers comprises a molybdenum-containing portion.

According to an aspect of the present disclosure, a three-dimensional memory device is provided, which comprises a stack of alternating layers comprising insulator layers and electrically conductive layers and located over a substrate, an opening extending through the stack, a blocking dielectric, at least one charge storage element and a tunneling dielectric located within the opening, and a semiconductor channel located within the opening. Each of the electrically conductive layers comprises at least a molybdenum-containing portion.

According to another aspect of the present disclosure, a method of manufacturing a three-dimensional memory device is provided. A stack of alternating layers comprising insulator layers and sacrificial material layers is formed over a substrate. A memory opening is formed through the stack. A memory film and a semiconductor channel are formed in the memory opening. Backside recesses are formed around the memory film by removing the sacrificial material layers. Electrically conductive layers are formed within the backside recesses. Each of the electrically conductive layers is formed by depositing at least a molybdenum-containing portion within a respective backside recess.

According to an aspect of the present disclosure, a three-dimensional memory device is provided, which comprises a stack of alternating layers comprising insulator layers and electrically conductive layers and located over a substrate, a memory opening extending through the stack, and a memory film and a semiconductor channel located within the memory opening. Each of the electrically conductive layers comprises a cobalt portion.

According to an aspect of the present disclosure, a three-dimensional memory device is provided, which comprises a stack of alternating layers comprising insulator layers and electrically conductive layers and located over a substrate, an opening extending through the stack, a blocking dielectric, at least one charge storage element and a tunneling dielectric located within the opening, and a semiconductor channel located within the opening. Each of the electrically conductive layers comprises at least a cobalt portion.

According to another aspect of the present disclosure, a method of manufacturing a three-dimensional memory device is provided. A stack of alternating layers comprising insulator layers and sacrificial material layers is formed over a substrate. A memory opening is formed through the stack. A memory film and a semiconductor channel are formed in the memory opening. Backside recesses are formed around the memory film by removing the sacrificial material layers. Electrically conductive layers are formed within the backside recesses. Each of the electrically conductive layers is formed by depositing at least a cobalt portion within a respective backside recess.

BRIEF DESCRIPTION OF THE DRAWINGS

FIGS. 2A-2F are sequential vertical cross-sectional views of a memory opening within the exemplary structure during various processing steps employed to form a memory stack structure according to an embodiment of the present disclosure.

FIGS. 6A-6D are sequential vertical cross-sectional views of a magnified region M in FIGS. 5A and 5B during formation of first exemplary electrically conductive layers according to a first embodiment of the present disclosure.

FIGS. 7A and 7B are sequential vertical cross-sectional views of a magnified region M in FIGS. 5A and 5B during formation of second exemplary electrically conductive layers according to a second embodiment of the present disclosure.

FIGS. 8A-8C are sequential vertical cross-sectional views of a magnified region M in FIGS. 5A and 5B during formation of third exemplary electrically conductive layers according to a third embodiment of the present disclosure.

FIGS. 9A-9C are sequential vertical cross-sectional views of a magnified region M in FIGS. 5A and 5B during formation of fourth exemplary electrically conductive layers according to a fourth embodiment of the present disclosure.

FIGS. 10A and 10B are sequential vertical cross-sectional views of a magnified region M in FIGS. 5A and 5B during formation of fifth exemplary electrically conductive layers according to a fifth embodiment of the present disclosure.

FIGS. 18A-18D are sequential vertical cross-sectional views of a magnified region M in FIGS. 5A and 5B during formation of tenth exemplary electrically conductive layers according to a tenth embodiment of the present disclosure.

FIGS. 19A and 19B are sequential vertical cross-sectional views of a magnified region M in FIGS. 5A and 5B during formation of eleventh exemplary electrically conductive layers according to an eleventh embodiment of the present disclosure.

FIGS. 20A-20C are sequential vertical cross-sectional views of a magnified region M in FIGS. 5A and 5B during formation of twelfth exemplary electrically conductive layers according to a twelfth embodiment of the present disclosure.

FIGS. 23A-23C are sequential vertical cross-sectional views of a magnified region M in FIGS. 5A and 5B during formation of fifteenth exemplary electrically conductive layers according to a fifteenth embodiment of the present disclosure.

FIGS. 26A-26E are sequential vertical cross-sectional views of a magnified region M in FIGS. 5A and 5B during formation of eighteenth exemplary electrically conductive layers according to a ninth embodiment of the present disclosure.

DETAILED DESCRIPTION

Figure 1:
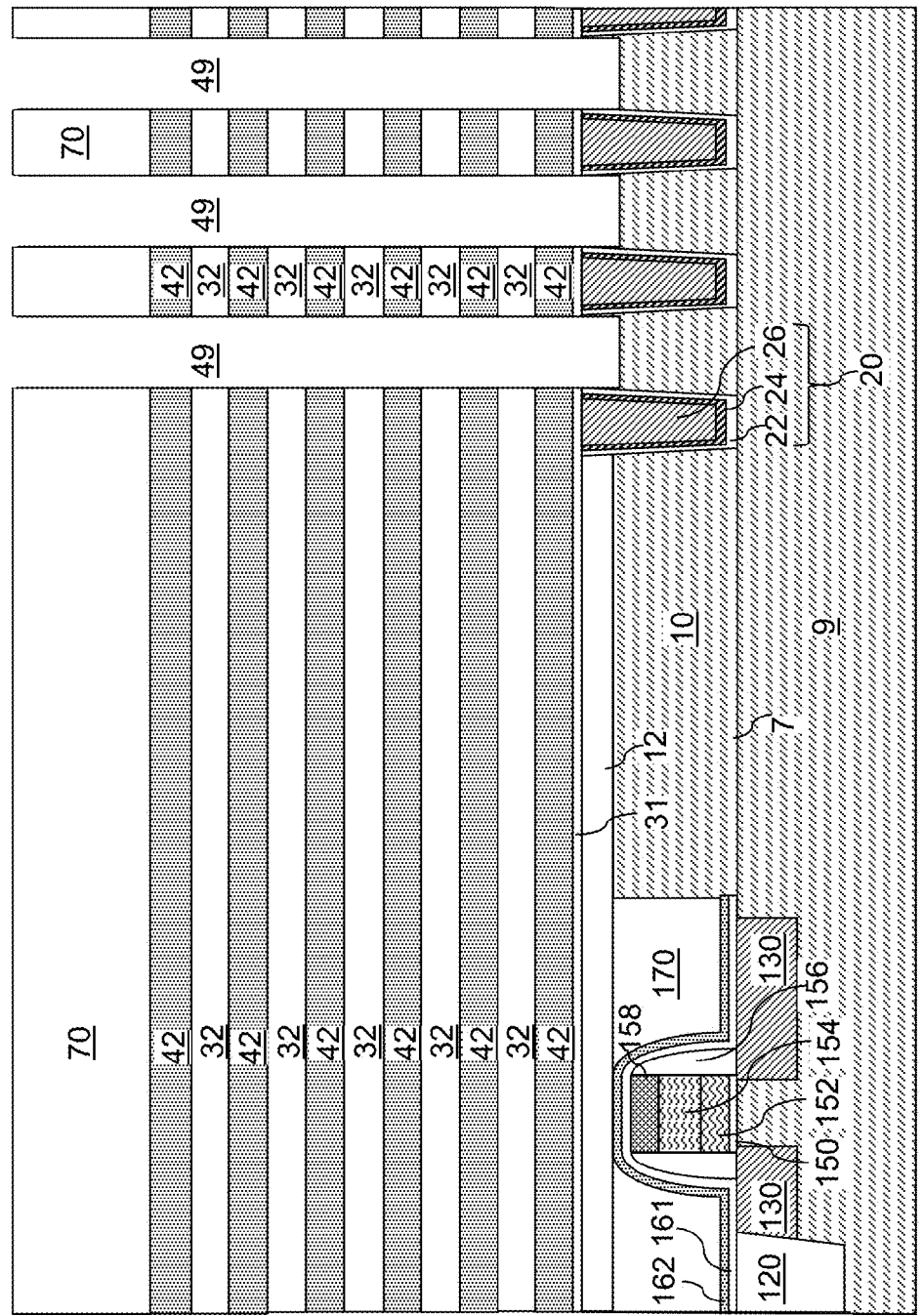
FIG. 1 is a vertical cross-sectional view of an exemplary structure after formation of a stack including an alternating plurality of material layers and memory openings extending through the stack according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Tungsten is widely employed for the material of conductive metal lines. The inventors of the present disclosure recognized that high tensile stress generated by tungsten can generate warpage of a device structure. Further, the inventors of the present disclosure recognized that molybdenum is a softer metal than tungsten, and may be deposited employing a thinner metallic barrier material layer than a metallic barrier metal layer required for tungsten deposition. Use of a thinner metallic barrier material layer for cobalt deposition relative to tungsten deposition is possible because cobalt can be deposited employing precursor gases that do not contain fluorine. For example, bis(cyclopentadienyl)cobalt, bis(ethylcyclopentadienyl)cobalt, bis(ethylcyclopentadienyl)cobalt, or bis(pentamethylcyclopentadienyl)cobalt may be employed to deposit cobalt. In addition, cobalt has a bulk resistivity of 6.24 μOhm-cm, which is comparable with the bulk resistivity of tungsten of 5.28 μOhm-cm. As the thickness of conductive metal layers decreases, therefore, it is possible to provide a metal interconnect structure having a lesser or comparable total resistance employing a combination of a thinner metallic barrier layer and a cobalt portion than a combination of a thicker metallic barrier layer and a tungsten portion.

Further, the inventors of the present disclosure recognized that molybdenum is a softer metal than tungsten, and may be deposited employing a thinner metallic barrier material layer than a metallic barrier metal layer required for tungsten deposition. The barrier material layer may have a thickness of 1 to 2 nm and may comprise a metal nitride, such as tungsten nitride or titanium nitride. Use of a thinner metallic barrier material layer for molybdenum deposition relative to tungsten deposition is possible because molybdenum can be deposited employing precursor gases that do not contain fluorine. In addition, molybdenum has a bulk resistivity of 5.34 μOhm-cm, which is comparable with the bulk resistivity of tungsten of 5.28 μOhm-cm. As the thickness of conductive metal layers decreases, therefore, it is possible to provide a metal interconnect structure having a lesser or comparable total resistance employing a combination of a thinner metallic barrier layer and a molybdenum-containing material portion than a combination of a thicker metallic barrier layer and a tungsten portion.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include an electrically conductive liner 24 and a conductive material portion 26. The electrically conductive liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes, which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the unrecessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 1.

Figure 2B:
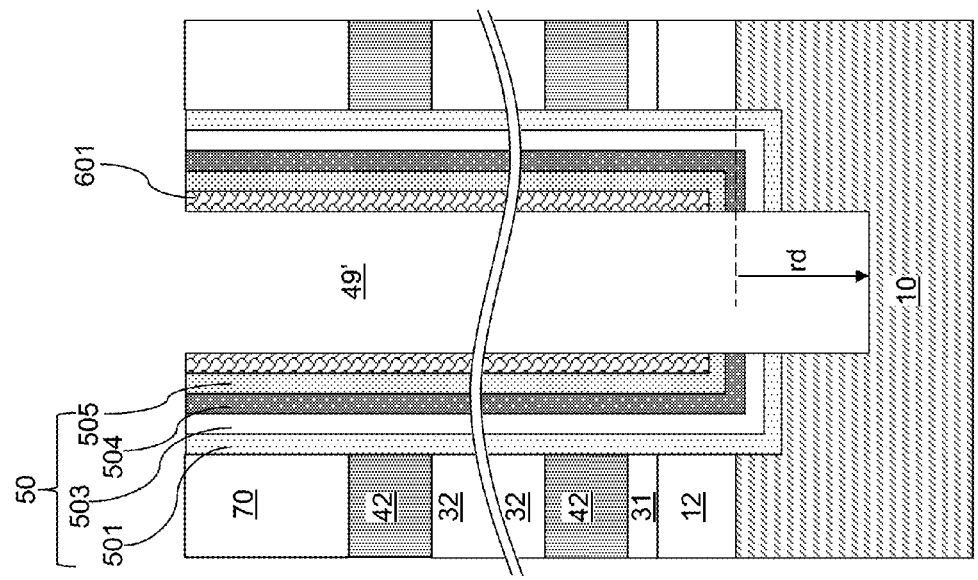
Figure 2A:
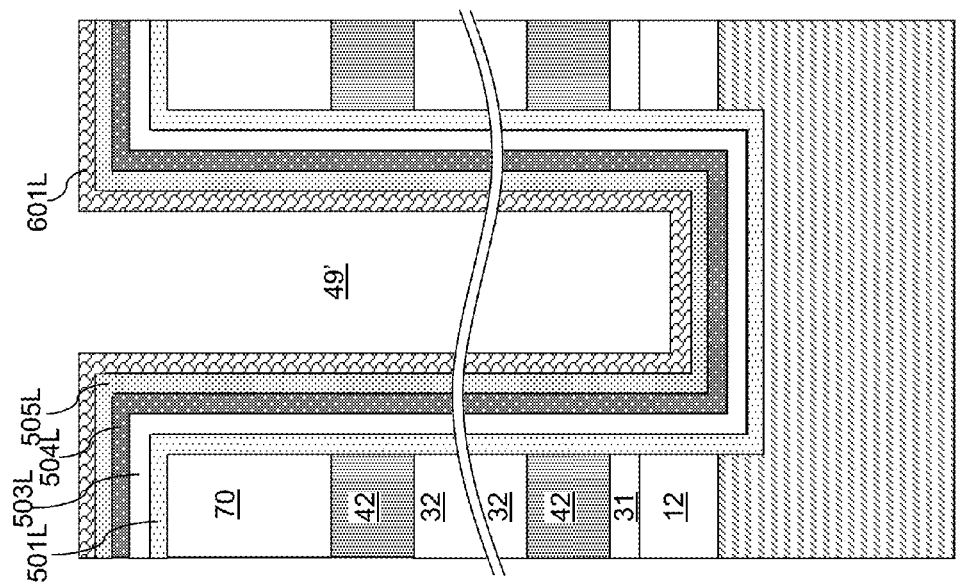

Referring to FIG. 2A, a memory opening 49 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

A series of layers including at least one blocking dielectric layer (501L, 503L), a memory material layer 504L, a tunneling dielectric layer 505L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

The memory material layer 504L, the tunneling dielectric layer 505L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 505*l*, 601L).

Referring to FIG. 2B, the optional first semiconductor channel layer 601L, the tunneling dielectric layer 505L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 505L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 505L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 505L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 505L constitutes a tunneling dielectric 505. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the semiconductor material layer 10 can be physically exposed underneath the opening through the first semiconductor channel portion 601, the tunneling dielectric 505, the charge storage element 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance rd. A tunneling dielectric 505 is embedded within a charge storage element 504. The charge storage element 504 can comprise a charge trapping material or a floating gate material.

In one embodiment, the first semiconductor channel portion 601, the tunneling dielectric 505, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 2C:
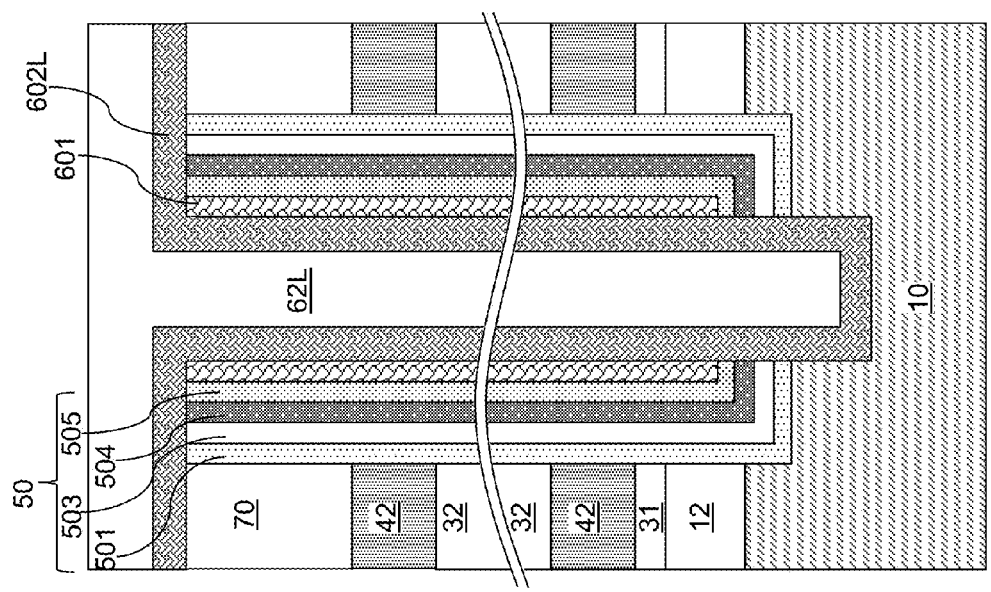

Referring to FIG. 2C, a second semiconductor channel layer 602L can be deposited directly on the semiconductor surface of the semiconductor material layer 10 in the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Figure 2D:
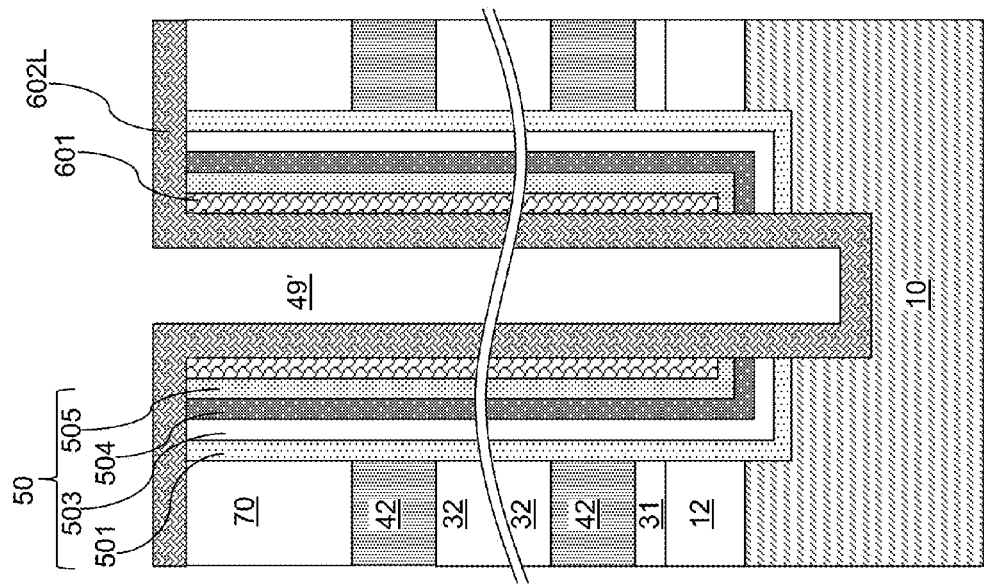

Referring to FIG. 2D, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2E, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 505 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2F, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
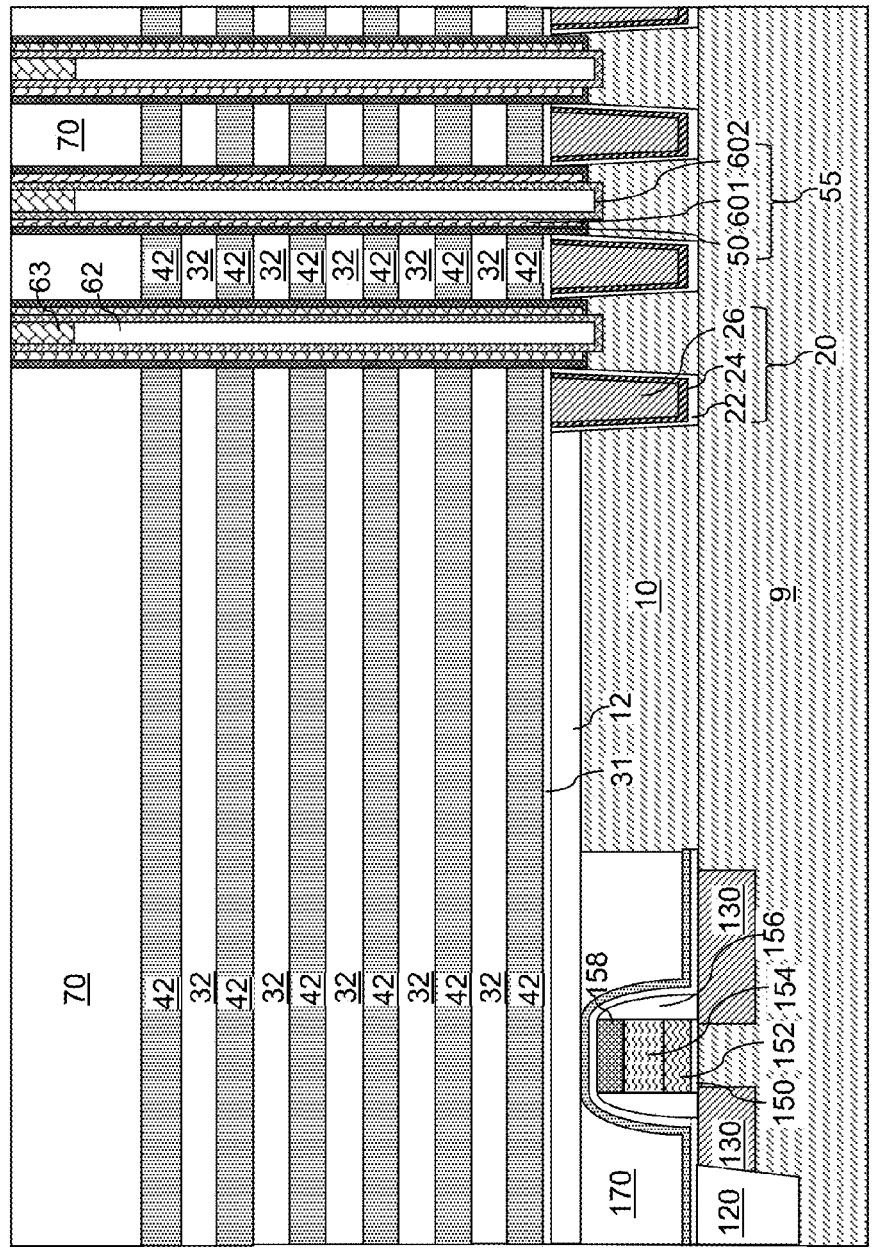
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2F. The exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
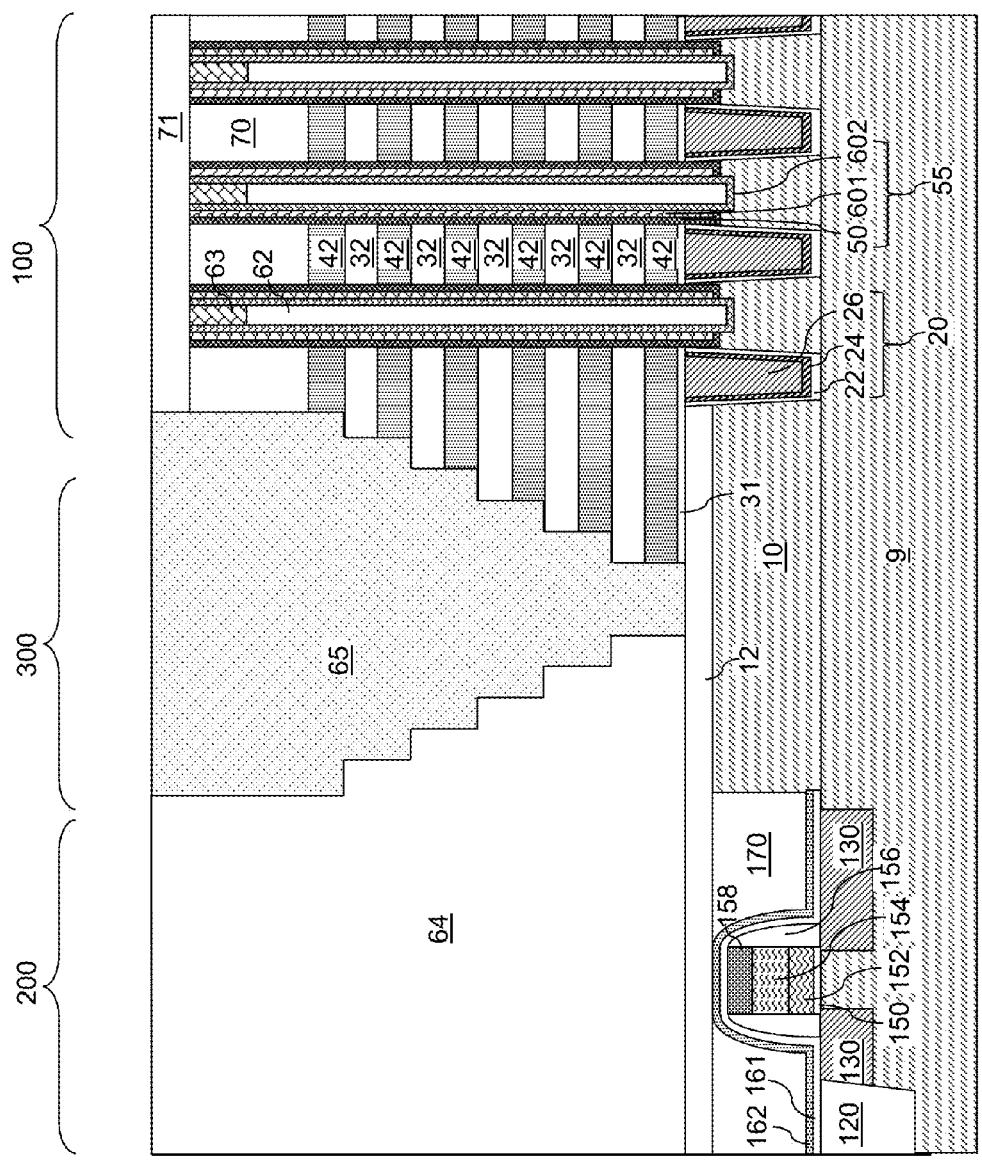
FIG. 4 is a vertical cross-sectional view of the exemplary structure after formation of a set of stepped surfaces and a retro-stepped dielectric material portion according to an embodiment of the present disclosure.

Referring to FIG. 4, at least one dielectric cap layer 71 can be optionally formed over the planarization dielectric layer 70. In one embodiment, the at least one dielectric cap layer 71 can include dielectric materials through which deuterium atoms can permeate. For example, the at least one dielectric cap layer can include silicon oxide and/or a dielectric metal oxide.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the at least one dielectric cap layer 71 by a planarization process such as chemical mechanical planarization and/or a recess etch. The top surfaces of the at least one dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
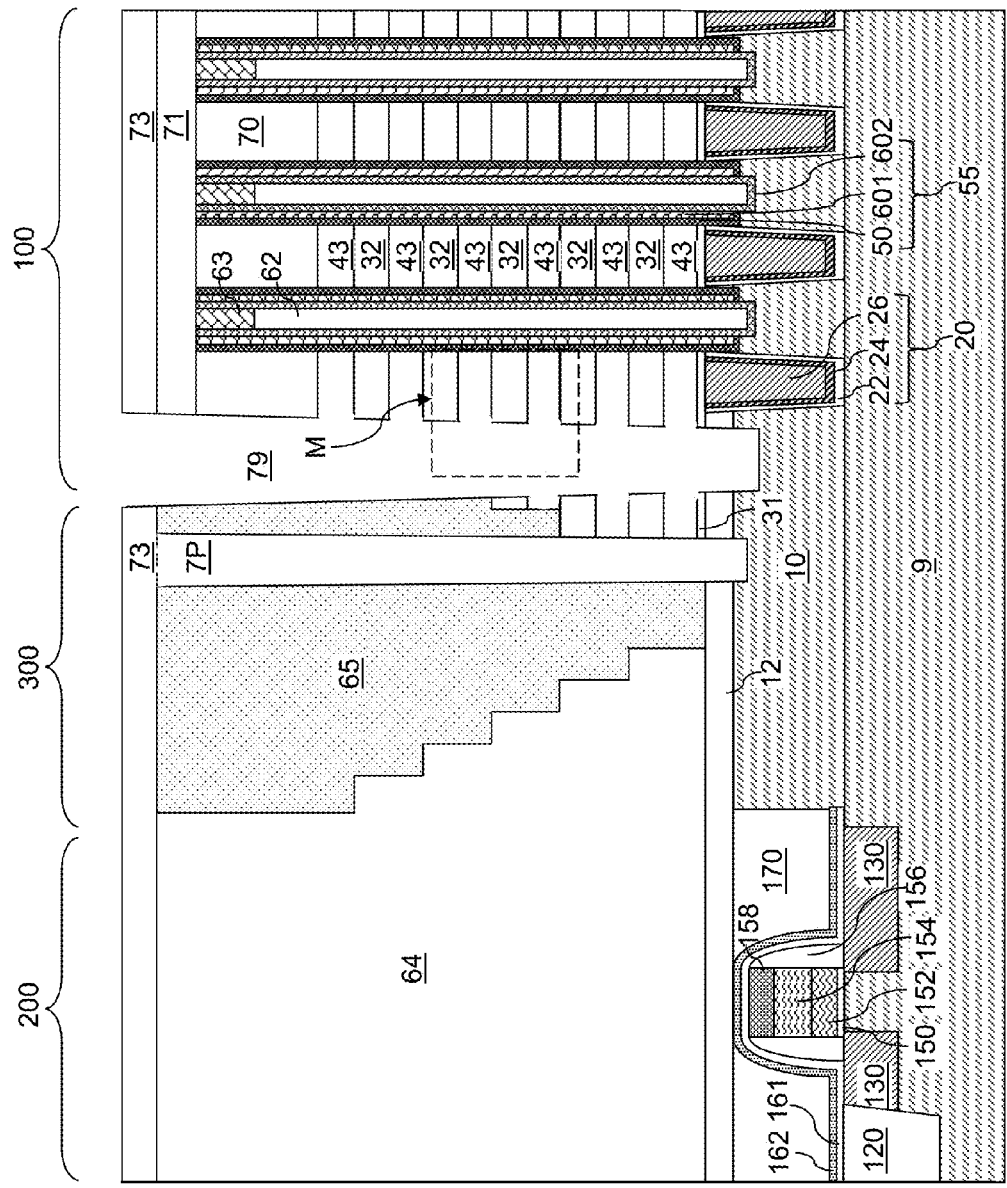
FIG. 5A is a vertical cross-sectional view of the exemplary structure after formation of a backside via cavity and backside recesses according to an embodiment of the present disclosure.
Figure 5B:
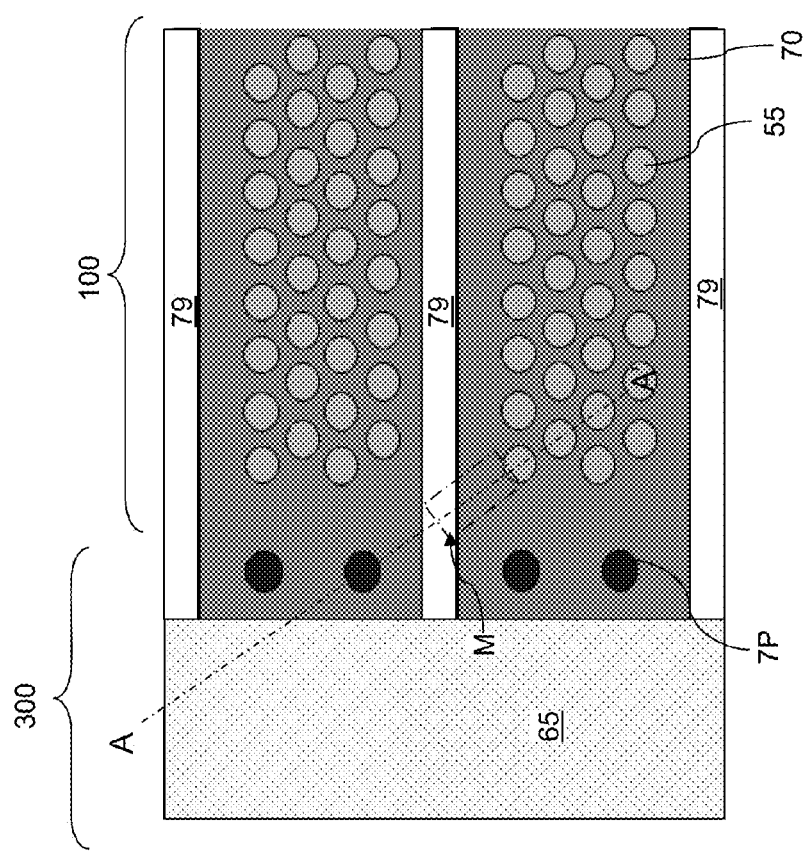
FIG. 5B is a see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer 71 concurrently with deposition of the at least one dielectric support pillar 7P can be present over the at least one dielectric cap layer 71 as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer 71 concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the semiconductor material layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout. Optionally, a backside blocking dielectric layer can be formed in the backside recesses.

FIGS. 6A-6D illustrate processing steps that can be employed to form first exemplary electrically conductive layers according to a first embodiment of the present disclosure. Referring to FIG. 6A, a vertical cross-sectional magnified view of a magnified region M in FIGS. 5A and 5B is illustrated, which includes a portion of the backside contact trench 79 and a plurality of backside recesses 43. In one embodiment, a sidewall surface of at least one blocking dielectric (501, 503) can be physically exposed at end portions of backside recesses 43. The sidewall surface of the at least one blocking dielectric (501, 503) is an outer sidewall surface of a memory film 50 illustrated in FIG. 2F. Optionally, a backside blocking dielectric layer (not shown) including a blocking dielectric material can be formed on the physically exposed surfaces of the insulator layers 32 and the physically exposed sidewalls of the memory film 50 (See FIG. 2F).

An optional metallic barrier material layer 148L can be deposited in the backside recesses 43 and over the sidewall of the backside contact trench 79. The metallic barrier material layer 148L includes a metallic barrier material, which is a metallic material that blocks diffusion of metal elements therethrough. The metallic barrier material layer 148L can be a conductive metallic nitride layer such as TiN, TaN, WN, or a combination or an alloy thereof. The thickness of the metallic barrier material layer 148L can be in a range from 0.5 nm to 1.5 nm, although lesser and greater thicknesses can also be employed. The metallic barrier material layer 148L can be deposited, for example, by chemical vapor deposition (CVD) or atomic layer deposition (ALD). In general, the thickness of the metallic barrier material layer 148L can be thinner if cobalt is to be subsequently deposited on the sidewalls of the metallic barrier material layer 148L than if tungsten is to be subsequently deposited on the sidewalls of the metallic barrier material layer 148L. A backside cavity 43' is present in each unfilled volume of the backside recess 43, i.e., in each volume of the backside recess 43 that is not filled with the metallic barrier material layer 148L.

Referring to FIG. 6B, an anisotropic etch is performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Vertical portions of the metallic barrier material layer 148L are removed from the sidewall of the backside contact trench 79. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148. Each metallic barrier material portion 148 can be a conformal material portion having a uniform thickness throughout. Sidewalls of the insulator layers 32 are physically exposed within each backside contact trench 79. The metallic barrier material portions 148 are formed as a plurality structures that are vertically disjoined from one another.

Referring to FIG. 6C, cobalt can be selectively deposited inside the backside cavities to form cobalt portions 48. Deposition of cobalt can be performed by chemical vapor deposition (CVD) or atomic layer deposition (ALD). Chemical vapor deposition or atomic layer deposition of cobalt employs a cobalt precursor that can be easily vaporized to leave high-purity cobalt on a surface without causing surface damage. In one embodiment, an organometallic compound with relatively high vapor pressures and good thermal stability can be employed as the cobalt precursor gas to deposit cobalt without requiring hydrogen. In a non-limiting example, bis(cyclopentadienyl)cobalt, bis(ethylcyclopentadienyl)cobalt, bis(ethylcyclopentadienyl)cobalt, or bis(pentamethylcyclopentadienyl)cobalt can be employed as a cobalt precursor gas in a CVD or ALD process. Alternatively, different precursor gases (such as $Co_2(CO)_8$) can also be employed for cobalt deposition.

Cobalt may be selectively nucleated on a metallic surface such as the surfaces of the metallic barrier material portions 148. Thus, cobalt portions 48 can grow selectively only from the surfaces of the metallic barrier material portions 148, and do not grow from the sidewalls of the insulator layers 32. As such, the cobalt deposition process is a selective deposition process that proceeds from the surfaces of the metallic barrier material portions 148, while cobalt is not deposited on the surfaces of the insulator layers 32. Each cobalt portion 48 can be formed on surfaces of a respective metallic barrier material portion 148, and specifically, on a pair of horizontal surfaces of the respective metallic barrier material portion 148 and an outer sidewall of the respective metallic barrier material portion 148. Each deposited portion of cobalt constitutes one of the cobalt portions 48.

The duration of the cobalt deposition process can be selected such that the cobalt portions 48 completely fill the backside cavities 43'. In one embodiment, a convex sidewall of each cobalt portion 48 can protrude into the backside contact trench 79 due to the selective nature of the cobalt deposition process. A combination of a metallic barrier material portion 148 and a cobalt portion 48 embedded within the metallic barrier material portion 148 constitutes an electrically conductive layer 46 at each level. Thus, each electrically conductive layer 46 can consist of a cobalt portion 48 and a metallic barrier material portion 148. Each electrically conductive layer 46 can be formed directly on horizontal surfaces of the insulating layers 32 and directly on an outer sidewall of the memory film 50. In one embodiment, the electrically conductive layers 46 can be employed as is, and subsequent processing steps of FIG. 16 can be performed.

Alternatively, the cobalt portions 48 can be laterally recessed. FIG. 6D illustrates the optional step of laterally recessing the cobalt portions 48, in which cobalt can be isotropically etched employing an isotropic etch chemistry. The lateral recessing of the cobalt portions 48 can be performed by an isotropic dry etch or a wet etch. The lateral recess distance lrd, as measured between a vertical plane including a sidewall of the backside contact trench 79 and a sidewall of a cobalt portion 48 after the lateral recess, can be in a range from 3 nm to 5 nm, although lesser and greater thickness can be employed. A proximal sidewall of each cobalt portion 48 is laterally spaced from the memory film 50 (See FIG. 2F) by a vertical portion of a respective metallic barrier material portion 148. Each cobalt portion 48 can be laterally recessed from the backside contact trench 79. Specifically, a distal sidewall of each cobalt portion 48 (e.g., a left side sidewall in FIG. 6D) is more proximal to the memory film 50 than the sidewall of the backside contact trench 79 is to the memory film 50 by the lateral recess distance lrd. The lateral recessing of the sidewalls of the cobalt portions 48 is an optional process.

FIGS. 7A and 7B illustrate processing steps for forming second exemplary electrically conductive layers according to a second embodiment of the present disclosure. The structure of FIG. 7A can be derived from the structure of FIG. 6A by depositing a cobalt layer 48L on the metallic barrier material layer 148L. The cobalt layer 48L can be deposited employing the same deposition methods as the deposition methods employed to deposit the cobalt portions 48. Because the surfaces of the metallic barrier material layer 148L are present within the backside recesses 43 and in the backside contact trench 79, the cobalt layer 48L can be deposited as a contiguous layer filling the backside cavities 43' and extending through the entire height of the backside contact trench 79.

Referring to FIG. 7B, the cobalt layer 48L can be etched to physically expose sidewalls of the insulator layers 32. The etch of cobalt can be performed by an isotropic dry etch process or a wet etch process. The isotropic etch of cobalt may, or may not, be selective to the material of the metallic barrier material layer 148L. The cobalt layer 48L can be divided into disjoined discrete material portions located within each respective level. Each disjoined discrete material portion of the cobalt layer 48L is herein referred to as a cobalt portion 48. In one embodiment, an outer sidewall of each cobalt portion 48 can be laterally recessed from the sidewall of the backside contact trench 79 by a lateral recess distance lrd. A proximal sidewall of each cobalt portion 48 is laterally spaced from the memory film 50 (See FIG. 2F) by a vertical portion of a respective metallic barrier material portion 148. Each cobalt portion 48 can be laterally recessed from the backside contact trench 79. Specifically, a distal sidewall of each cobalt portion 48 is more proximal to the memory film 50 than the sidewall of the backside contact trench 79 is to the memory film 50 by the lateral recess distance lrd.

Subsequent to the etching of the cobalt layer 48L or concurrently with etching of the cobalt layer 48L, an anisotropic etch can be performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148.

Thus, portions of the contiguous cobalt layer 48L are etched back prior to removing the vertical portions of the metallic barrier material layer 148L. Each remaining portion of the contiguous cobalt layer 48L constitutes a cobalt portion 48 of the electrically conductive layers 46. The cobalt portions 48 may have distal sidewalls that are laterally recessed from the sidewalls of the backside trench 79, or may have distal sidewalls that are vertically coincident with the sidewalls of the backside trench 79. Each metallic barrier material portion 148 can be a conformal material portion having a uniform thickness throughout. Sidewalls of the insulator layers 32 are physically exposed within each backside contact trench 79. Each cobalt portion 48 can be formed on surfaces of a respective metallic barrier material portion 148, and specifically, on a pair of horizontal surfaces of the respective metallic barrier material portion 148 and an outer sidewall of the respective metallic barrier material portion 148. A combination of a metallic barrier material portion 148 and a cobalt portion 48 embedded within the metallic barrier material portion 148 constitutes an electrically conductive layer 46 at each level. Each electrically conductive layer 46 can consist of a cobalt portion 48 and a metallic barrier material portion 148.

Figure 8C:
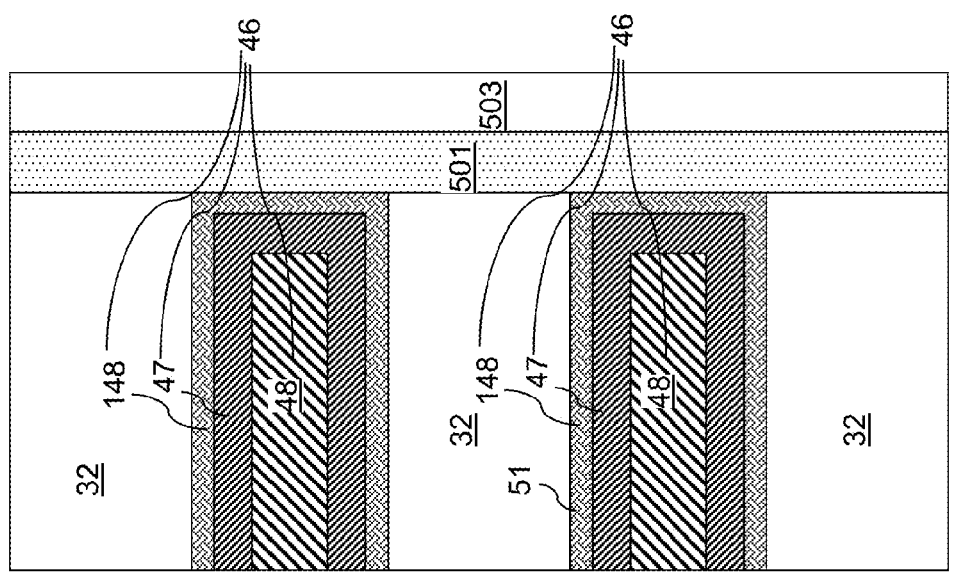

FIGS. 8A-8C illustrate processing steps for forming third exemplary electrically conductive layers according to a third embodiment of the present disclosure. The structure of FIG. 8A can be derived from the structure of FIG. 6A by depositing a metallic material layer 47L on the metallic barrier material layer 148L. The metallic material layer 47L can be a contiguous layer extending through the entire vertical height of the backside contact trench 79. The metallic material layer 47L can include any metallic material other than cobalt. In one embodiment, the metallic material layer 47L can consist essentially of a single elemental metal or an intermetallic alloy of at least two elemental metals. For example, the metallic material layer 47L can comprise molybdenum, tungsten, copper, ruthenium, or titanium, or a combination thereof. In one embodiment, the metallic material layer 47L can comprise tungsten or a tungsten-containing intermetallic alloy. The thickness of the metallic material layer 47L can be selected such that the backside cavities 43' are not completely filled with the metallic material layer 47L.

Referring to FIG. 8B, an anisotropic etch is performed to remove vertical portions of the metallic barrier material layer 148L and the metallic material layer 47L from the sidewalls of each backside contact trench 79. The anisotropic etch can be a reactive ion etch that removes the materials of the metallic barrier material layer 148L and the metallic material layer 47L selective to the material of the insulator layers 32 and the material of the semiconductor material layer 10. Portions of the metallic barrier material layer 148L and the metallic material layer 47L inside the backside recesses 43 are not removed by the anisotropic etch. Each remaining portion of the metallic barrier material layer 148L inside the backside recesses 43 constitutes a metallic barrier portion 148. Each remaining portion of the metallic material layer 47L inside the backside recesses 43 constitutes a metallic material portion 47. Each metallic barrier material portion 148 can be a conformal material portion having a uniform thickness throughout. Likewise, each metallic material portion 47 can be a conformal material portion having another uniform thickness throughout. Sidewalls of the insulator layers 32 are physically exposed within each backside contact trench 79. The metallic barrier material portions 148 are formed as a plurality structures that are vertically disjoined from one another. Further, the metallic material portions 47 are formed as a plurality structures that are vertically disjoined from one another. Alternately, the processing steps of FIGS. 6A and 6B can be performed, and the metallic material portions 47 can be deposited by a selective deposition process.

Referring to FIG. 8C, cobalt can be deposited inside the backside cavities 43' to form cobalt portions 48. Deposition of cobalt can be performed employing the same methods as in the first embodiment. Cobalt portions 48 grow only from the surfaces of the metallic material portions 47 and the metallic barrier material portions 148, and do not grow from the sidewalls of the insulator layers 32. As such, the cobalt deposition process is a selective deposition process that proceeds from the surfaces of the metallic material portions 47, while cobalt is not deposited on the surfaces of the insulator layers 32. Each cobalt portion 48 can be formed on surfaces of a respective metallic material portion 47, and specifically, on a pair of horizontal surfaces of the respective metallic material portion 47 and an outer sidewall of the respective metallic material portion 47. Each deposited portion of cobalt constitutes one of the cobalt portions 48.

The duration of the cobalt deposition process can be selected such that the cobalt portions 48 completely fill the backside cavities 43'. A combination of a metallic barrier material portion 148, a metallic material portion 47 embedded within the metallic barrier material portion 148, and a cobalt portion 48 embedded within the metallic material portion 47 constitutes an electrically conductive layer 46 at each level. Thus, each electrically conductive layer 46 can comprise a cobalt portion 48, a metallic material portion 47 including a metallic material other than cobalt, and a metallic barrier material portion 148. Each electrically conductive layer 46 can be formed directly on horizontal surfaces of the insulating layers 32 and directly on an outer sidewall of the memory film 50. Optionally, the cobalt portions 48 and/or the metallic material portions 47 can be laterally recessed from the sidewall of the backside contact trench 79. In this case, each of the electrically conductive layers 46 comprises a metallic barrier material portion 148 contacting an outer sidewall of the memory film 50, a metallic material portion 47 containing a material other than cobalt and contacting the metallic barrier material portion 148, and a respective cobalt portion 48 contacting horizontal surfaces of the metallic material portion 47 and not contacting the metallic barrier material portion 148.

Figure 9C:
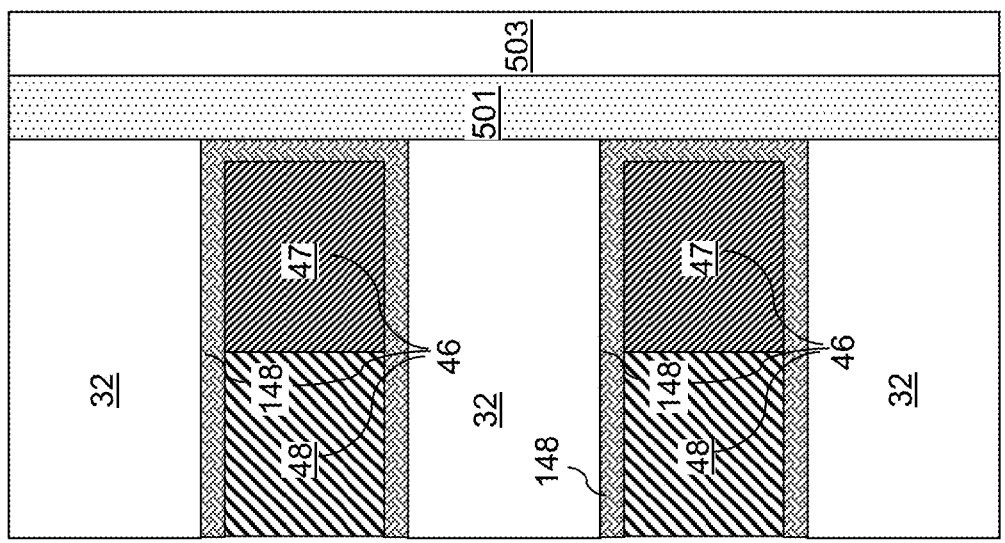

FIGS. 9A-9C illustrate processing steps for forming fourth exemplary electrically conductive layers according to a fourth embodiment of the present disclosure. The structure of FIG. 9A can be derived from the structure of FIG. 6A by depositing a metallic material layer 47L on the metallic barrier material layer 148L. The metallic material layer 47L can include any metallic material other than cobalt. In one embodiment, the metallic material layer 47L can consist essentially of a single elemental metal or an intermetallic alloy of at least two elemental metals. For example, the metallic material layer 47L can comprise molybdenum, tungsten, copper, titanium, ruthenium, or a combination thereof. In one embodiment, the metallic material layer 47L can comprise tungsten or a tungsten-containing intermetallic alloy. The thickness of the metallic material layer 47L can be selected such that the backside cavities 43' are completely filled with the metallic material layer 47L.

Referring to FIG. 9B, vertical portions of the metallic material layer 47L and the metallic barrier material layer 148L are removed from the sidewall of the backside contact trench 79. The metallic material layer 47L can be isotropically etched to physically expose the sidewall of the metallic barrier material layer 148L located adjacent to the sidewall of each backside contact trench 79. The isotropic etch of tungsten can be performed by an isotropic dry etch process or a wet etch process. The isotropic etch of the metallic material layer 47L can be selective to the material of the metallic barrier material layer 148L. The duration of the isotropic etch can be selected such that remaining portions of the metallic material layer 47L are laterally recessed from the sidewall of the backside contact trench 79 by a lateral recess distance lrd. The metallic material layer 47L is divided into disjoined discrete material portions located within each respective level. Each disjoined discrete material portion of the metallic material layer 47L constitutes a metallic material portion 47.

Subsequently, an anisotropic etch is performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148. Thus, portions of the metallic material layer 47L are etched back prior to removing the vertical portions of the metallic barrier material layer 148L. Each remaining portion of the metallic material layer 47L constitutes a metallic material portion 47 of electrically conductive layers to be formed. Alternately, an anisotropic etch may be employed to remove the vertical portions of the metallic material layer 47L and the metallic barrier material layer 148L, and an isotropic etch may be employed to laterally recess the metallic material portions 47.

In one embodiment, the lateral recess distance lrd can be greater than the height of a backside recess 43, which is the same as the height of a metallic barrier material portion 148 within the backside recess 43. In one embodiment, the lateral recess distance lrd can be in a range from 15% to 85% of the lateral distance between the sidewall of the backside contact trench 79 and the outer sidewall of the memory film 50, e.g., the outer sidewall of the at least one blocking dielectric layer (501L, 503L). In one embodiment, the lateral recess distance lrd can be determined to optimize the resistance of the electrically conductive layers to be formed in the backside recesses and the overall stress that the electrically conductive layers will generate. A distal sidewall of each metallic material portion 47 is more proximal to the memory film 50 than the sidewall of the backside contact trench 79 is to the memory film 50 by the lateral recess distance lrd. A proximal sidewall of each metallic material portion 47 can contact an outer sidewall of a metallic barrier material portion 148.

Referring to FIG. 9C, cobalt can be deposited inside the backside cavities 43' to form cobalt portions 48. Deposition of cobalt can be performed employing the same methods as in the first embodiment. Cobalt portions 48 grow only from the surfaces of the metallic material portions 47 and the metallic barrier material portions 148, and do not grow from the sidewalls of the insulator layers 32. As such, the cobalt deposition process is a selective deposition process that proceeds from the surfaces of the metallic barrier material portions 148 and the surfaces of the metallic material portions 47, while cobalt is not deposited on the surfaces of the insulator layers 32. Thus, each cobalt portion 48 can be formed on a respective metallic material portion 47 and a respective metallic barrier material portion 148, and specifically, on a pair of horizontal surfaces of the respective metallic barrier material portion 148 and an outer sidewall of the respective metallic material portion 47. Each deposited portion of cobalt constitutes one of the cobalt portions 48.

In one embodiment, the duration of the cobalt deposition process can be selected such that the cobalt portions 48 completely fill the backside cavities 43'. A combination of a metallic barrier material portion 148, a cobalt portion 48 contacting horizontal surfaces of the metallic barrier material portion 148, and a metallic material portion 47 encapsulated by the metallic barrier material portion 148 and the cobalt portion 48 constitutes an electrically conductive layer 46 at each level. Thus, each electrically conductive layer 46 can comprise a cobalt portion 48, a metallic material portion 47 including a metallic material other than cobalt, and a metallic barrier material portion 148. Each electrically conductive layer 46 can be formed directly on horizontal surfaces of the insulating layers 32 and directly on an outer sidewall of the memory film 50. Optionally, an anisotropic etch or an isotropic etch can be performed to remove regions of the cobalt portions 48 inside backside contact trench 79. In this case, the cobalt portions 48 can have sidewalls that are vertically coincident with sidewalls of the insulator layers 32 around the backside contact trench 79. Optionally, the cobalt portions 48 may be laterally recessed from the sidewall of the backside contact trench 79, for example, by a recess etch. In one embodiment, each cobalt portion 48 is laterally spaced from a vertical portion of a metallic barrier material portion 148 located at a same level by a respective metallic material portion 47 that comprises tungsten or a tungsten alloy.

FIGS. 10A and 10B illustrate processing steps for forming fifth exemplary electrically conductive layers according to a fifth embodiment of the present disclosure. The structure of FIG. 10A can be derived from the structure of FIG. 9B by etching physically exposed portions of the metallic barrier material portions 148.

Alternatively, the structure of FIG. 10A can be derived from the structure of FIG. 9A by simultaneously etching, or by sequentially etching, the metallic material layer 47L and the metallic barrier material layer 148L. At least one isotropic etch process can be employed to laterally recess the metallic material layer 47L and the metallic barrier material layer 148L, and to form backside recesses 43'. After the isotropic etching of the metallic material layer 47L, the metallic material layer 47L can be divided into disjoined discrete material portions located within each respective level. Each disjoined discrete material portion of the metallic material layer 47L is herein referred to as a metallic material portion 47.

Subsequently, an isotropic etch process is employed to etch the physically exposed portions of the metallic barrier material layer 148L. In other words, an isotropic etch is employed to remove physically exposed portions of the metallic barrier material layer 148L at the processing step of FIG. 10A in lieu of an anisotropic etch that is employed to remove the portions of the metallic barrier material layer 148L within the backside contact trench 79 at the processing steps of FIG. 9B. The isotropic etch process that etches the physically exposed portions of the metallic barrier material layer 148L can be an isotropic dry etch or a wet etch.

The isotropic etch divides the metallic barrier material layer 148L into disjoined discrete material portions located within each respective level. Each disjoined discrete material portion of the metallic barrier material layer 148L is herein referred to as a metallic barrier material portion 148. Thus, portions of the metallic material layer 47L are etched back prior to removing the physically exposed portions of the metallic barrier material layer 148L. A distal sidewall of each metallic material portion 47 and a distal sidewall of each metallic barrier material portion 148 can be more proximal to the memory film 50 than the sidewall of the backside contact trench 79 is to the memory film 50 by the lateral recess distance lrd. A proximal sidewall of each metallic material portion 47 can contact an outer sidewall of a metallic barrier material portion 148.

Referring to FIG. 10B, cobalt can be deposited inside the backside cavities 43' to form cobalt portions 48. Deposition of cobalt can be performed employing the same methods as in the first embodiment. Cobalt portions 48 grow only from the surfaces of the metallic material portions 47 and the metallic barrier material portions 148, and do not grow from the sidewalls of the insulator layers 32. As such, the cobalt deposition process is a selective deposition process that proceeds from the surfaces of the metallic barrier material portions 148 and the surfaces of the metallic material portions 47, while cobalt is not deposited on the surfaces of the insulator layers 32. Thus, each cobalt portion 48 can be formed on a respective metallic material portion 47 and a respective metallic barrier material portion 148, and specifically, on vertical sidewalls of the respective metallic material portion 47 and the respective metallic barrier material portion 148. Each deposited portion of cobalt constitutes one of the cobalt portions 48.

In one embodiment, the duration of the cobalt deposition process can be selected such that the cobalt portions 48 completely fill the backside cavities 43'. A combination of a metallic barrier material portion 148, a cobalt portion 48 contacting horizontal surfaces of a pair of insulator layers 32, and a metallic material portion 47 encapsulated by the metallic barrier material portion 148 and the cobalt portion 48 constitutes an electrically conductive layer 46 at each level. Thus, each electrically conductive layer 46 can comprise a cobalt portion 48, a metallic material portion 47 including a metallic material other than cobalt, and a metallic barrier material portion 148. Each electrically conductive layer 46 can be formed directly on horizontal surfaces of the insulating layers 32 and directly on an outer sidewall of the memory film 50. Optionally, an anisotropic etch or an isotropic etch can be performed to remove regions of the cobalt portions 48 inside backside contact trench 79. In this case, the cobalt portions 48 can have sidewalls that are vertically coincident with sidewalls of the insulator layers 32 around the backside contact trench 79. Optionally, the cobalt portions 48 may be laterally recessed from the sidewall of the backside contact trench 79, for example, by a recess etch. Each cobalt portion 48 contacts a horizontal surface of an overlying dielectric layer (e.g., an overlying insulator layer 32) and a horizontal surface of an underlying dielectric layer (e.g., an underlying insulator layer 32).

Figure 11B:
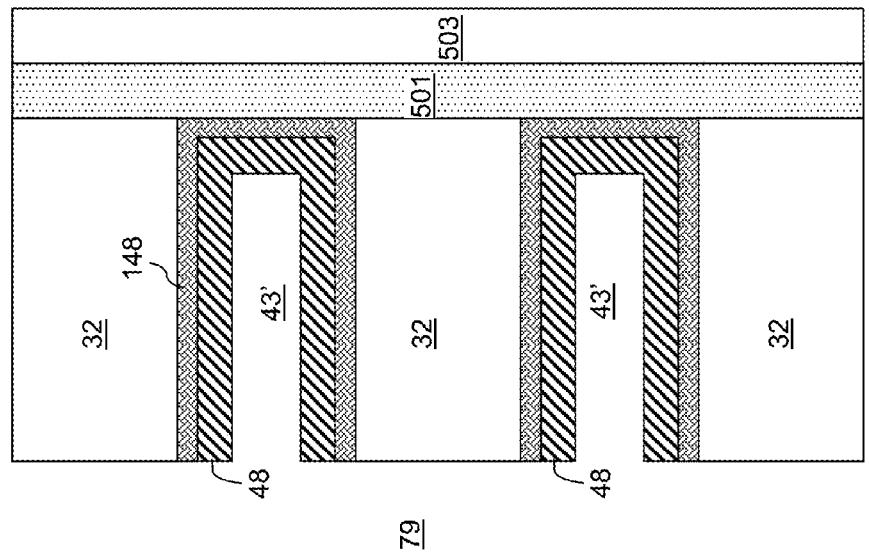
FIGS. 11A-11C are sequential vertical cross-sectional views of a magnified region M in FIGS. 5A and 5B during formation of sixth exemplary electrically conductive layers according to a sixth embodiment of the present disclosure.
Figure 11A:
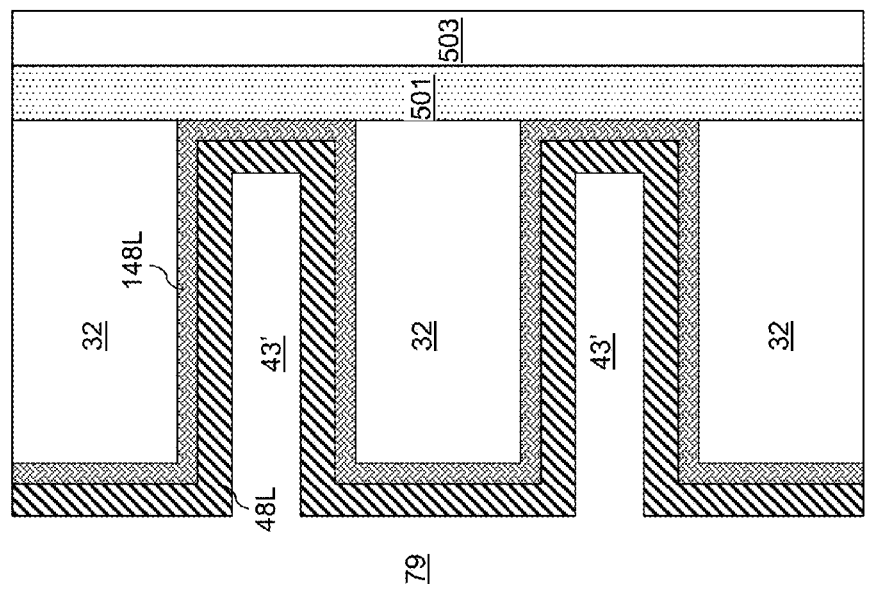

FIGS. 11A and 11B illustrate processing steps for forming sixth exemplary electrically conductive layers according to a sixth embodiment of the present disclosure. The structure of FIG. 11A can be derived from the structure of FIG. 6A by depositing a cobalt layer 48L on the metallic barrier material layer 148L. The cobalt layer 48L can be deposited employing the same deposition methods as the deposition methods employed to deposit the cobalt portions 48 of FIG. 6C or the cobalt layer 48L of FIG. 7A. The thickness of the cobalt layer 48L can be selected such that the backside cavities 43' are not completely filled with the cobalt layer 48L. For example, the duration of the cobalt deposition process in a chemical vapor deposition process or the number of cycles in an atomic layer deposition process can be selected such that the backside recesses 43 are not completely filled at the end of the deposition process. Thus, a backside cavity 43' is present within each backside recess 43 after formation of the cobalt layer 48L.

Referring to FIG. 11B, an anisotropic etch is performed to remove vertical portions of the metallic barrier material layer 148L and the cobalt layer 48L from the sidewalls of each backside contact trench 79. The anisotropic etch can be a reactive ion etch that removes the materials of the metallic barrier material layer 148L and the cobalt layer 48L selective to the material of the insulator layers 32 and the material of the semiconductor material layer 10. Portions of the metallic barrier material layer 148L and the cobalt layer 48L inside the backside recesses 43 are not removed by the anisotropic etch. Each remaining portion of the metallic barrier material layer 148L inside the backside recesses 43 constitutes a metallic barrier portion 148. Each remaining portion of the cobalt layer 48L inside the backside recesses 43 constitutes a cobalt portion 48. Each metallic barrier material portion 148 can be a conformal material portion having a uniform thickness throughout. Likewise, each cobalt portion 48 can be a conformal material portion having another uniform thickness throughout. Sidewalls of the insulator layers 32 are physically exposed within each backside contact trench 79. The metallic barrier material portions 148 are formed as a plurality structures that are vertically disjoined from one another. Further, the cobalt portions 48 are formed as a plurality structures that are vertically disjoined from one another. Each cobalt portion 48 of the electrically conductive layers 46 is formed on surfaces of a respective metallic barrier material portion 148.

Figure 11C:
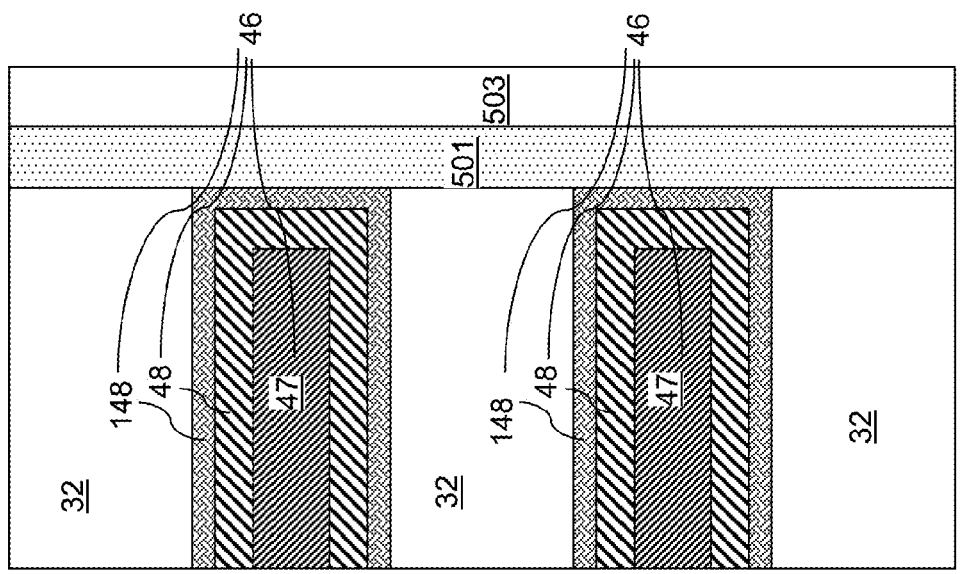

Referring to FIG. 11C, a metallic material can be deposited inside the backside cavities 43' to form metallic material portions 47. The metallic material portions 47 can include any metallic material other than cobalt. In one embodiment, the metallic material portions 47 can consist essentially of a single elemental metal or an intermetallic alloy of at least two elemental metals. For example, the metallic material portions 47 can comprise molybdenum, tungsten, copper, titanium, ruthenium, or a combination thereof. In one embodiment, the metallic material portions 47 can comprise tungsten or a tungsten-containing intermetallic alloy.

Deposition of the metallic material can be performed employing the same methods as in the third embodiment. In one embodiment, the metallic material portions 47 grow from the surfaces of the cobalt portions 48, and do not grow from the sidewalls of the insulator layers 32. As such, the metallic material deposition process is a selective deposition process that proceeds from the surfaces of the cobalt portions 48, while the metallic material is not deposited on the surfaces of the insulator layers 32. Thus, each metallic material portion 47 can be formed on surfaces of a respective cobalt portion 48, and specifically, on a pair of horizontal surfaces of the respective cobalt portion 48 and an outer sidewall of the respective cobalt portion 48. Each deposited portion of metallic material constitutes one of the metallic material portions 47.

The duration of the metallic material deposition process can be selected such that the metallic material portions 47 completely fill the backside cavities 43'. A metallic material portion 47 is formed on a respective cobalt portion 48 in each backside cavity 43', i.e., in the vacant portion of each backside recess. A combination of a metallic barrier material portion 148, a cobalt portion 48 embedded within the metallic barrier material portion 148, and a metallic material portion 47 embedded within the cobalt portion 48 constitutes an electrically conductive layer 46 at each level. Thus, each electrically conductive layer 46 can comprise a cobalt portion 48, a metallic material portion 47 including a metallic material other than cobalt, and a metallic barrier material portion 148. Each electrically conductive layer 46 can be formed directly on horizontal surfaces of the insulating layers 32 and directly on an outer sidewall of the memory film 50. Each metallic material portion 47 is vertically and laterally spaced from a metallic barrier material portion 148 located at a same level by a respective cobalt portion 48. Optionally, the cobalt portions 48 and/or the metallic material portions 47 can be laterally recessed from the sidewall of the backside contact trench 79.

Figure 12A:
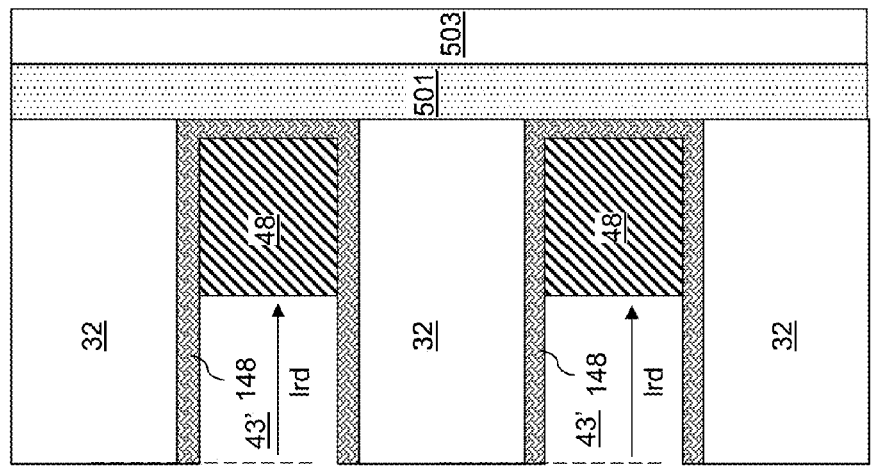
FIGS. 12A-12C are sequential vertical cross-sectional views of a magnified region M in FIGS. 5A and 5B during formation of seventh exemplary electrically conductive layers according to a seventh embodiment of the present disclosure.
Figure 12B:
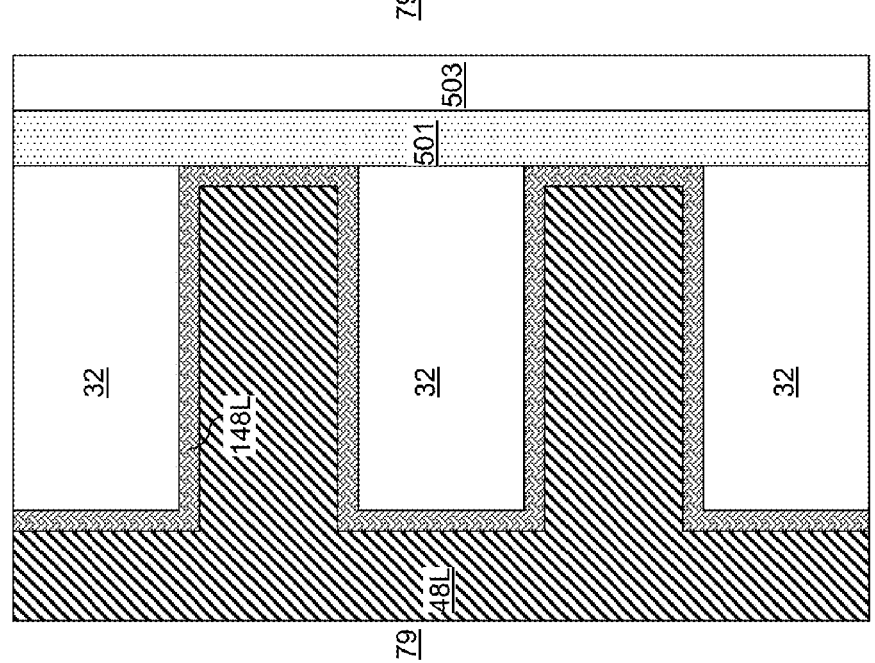
Figure 12C:
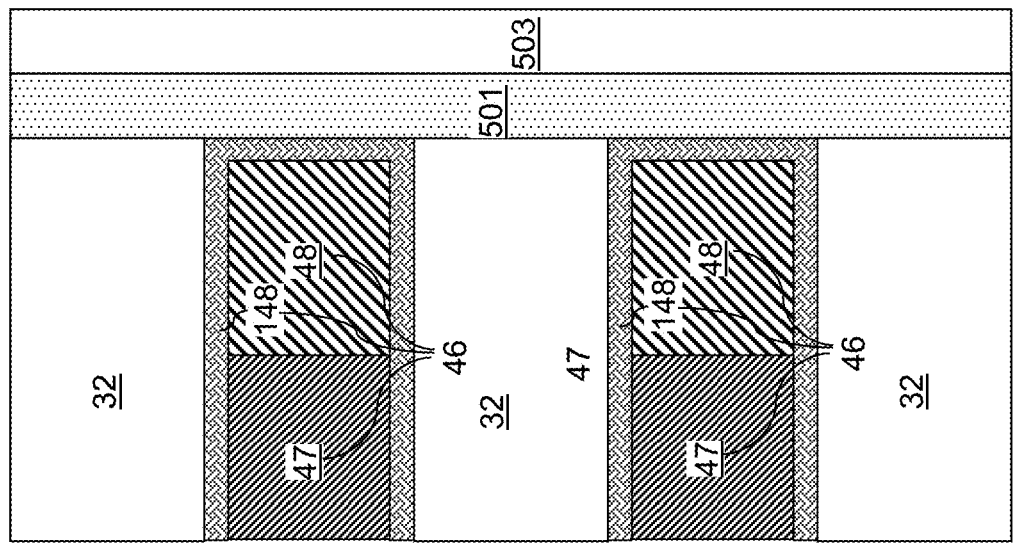

FIGS. 12A-12C illustrate processing steps for forming seventh exemplary electrically conductive layers according to a seventh embodiment of the present disclosure. The structure of FIG. 12A can be the same as the structure of FIG. 7A according to the second embodiment, and can be formed employing the same method as the second embodiment. In one embodiment, the cobalt layer 48L can consist essentially of cobalt.

Referring to FIG. 12B, the cobalt layer 48L can be isotropically etched to physically expose the sidewall of the metallic barrier material layer 148L located adjacent to the sidewall of each backside contact trench 79. The isotropic etch of cobalt can be performed by an isotropic dry etch process or a wet etch process. The isotropic etch of the cobalt layer 48L can be selective to the material of the metallic barrier material layer 148L. The duration of the isotropic etch can be selected such that remaining portions of the cobalt layer 48L are laterally recessed from the sidewall of the backside contact trench 79 by a lateral recess distance lrd. The cobalt layer 48L is divided into disjoined discrete material portions located within each respective level. Each disjoined discrete material portion of the cobalt layer 48L is herein referred to as a cobalt portion 48. Each cobalt portion 48 of the electrically conductive layers 46 is formed on surfaces of a respective metallic barrier material portion 148. Alternatively, a combination of an anisotropic etch and an isotropic etch can be employed to form the structure of FIG. 12B.

In one embodiment, the lateral recess distance lrd can be greater than the height of a backside recess 43, which is the same as the height of a metallic barrier material portion 148 within the backside recess 43. In one embodiment, the lateral recess distance lrd can be in a range from 15% to 85% of the lateral distance between the sidewall of the backside contact trench 79 and the outer sidewall of the memory film 50, e.g., the outer sidewall of the at least one blocking dielectric layer (501L, 503L). In one embodiment, the lateral recess distance lrd can be determined to optimize the resistance of the electrically conductive layers to be formed in the backside recesses and the overall stress that the electrically conductive layers will generate. A distal sidewall of each cobalt portion 48 is more proximal to the memory film 50 than the sidewall of the backside contact trench 79 is to the memory film 50 by the lateral recess distance lrd. A proximal sidewall of each cobalt portion 48 can contact an outer sidewall of a metallic barrier material portion 148. A proximal sidewall of each cobalt portion 48 is laterally spaced from the memory film 50 by a vertical portion of a respective metallic barrier material portion 148, and each cobalt portion 48 is laterally recessed from the backside contact trench 79.

Subsequently, an anisotropic etch is performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148. Thus, portions of the cobalt layer 48L are etched back prior to removing the vertical portions of the metallic barrier material layer 148L. Each remaining portion of the cobalt layer 48L constitutes a cobalt portion 48 of electrically conductive layers to be formed.

Referring to FIG. 12C, a metallic material can be deposited inside the backside cavities 43' to form metallic material portions 47. The metallic material portions 47 can include any metallic material other than cobalt. In one embodiment, the metallic material portions 47 can consist essentially of a single elemental metal or an intermetallic alloy of at least two elemental metals. For example, the metallic material portions 47 can comprise molybdenum, tungsten, copper, titanium, ruthenium, or a combination thereof. In one embodiment, the metallic material portions 47 can comprise tungsten or a tungsten-containing intermetallic alloy. Deposition of metallic material can be performed employing the same methods as in the third embodiment. The metallic material portions 47 grow only from the surfaces of the cobalt portions 48 and the metallic barrier material portions 148, and do not grow from the sidewalls of the insulator layers 32. As such, the metallic material deposition process is a selective deposition process that proceeds from the surfaces of the metallic barrier material portions 148 and the surfaces of the cobalt portions 48, while the metallic material is not deposited on the surfaces of the insulator layers 32. Thus, each metallic material portion 47 can be formed on a respective cobalt portion 48 and a respective metallic barrier material portion 148, and specifically, on a pair of horizontal surfaces of the respective metallic barrier material portion 148 and an outer sidewall of the respective cobalt portion 48. Each deposited portion of metallic material constitutes one of the metallic material portions 47.

In one embodiment, the duration of the metallic material deposition process can be selected such that the metallic material portions 47 completely fill the backside cavities 43'. A metallic material portion 47 is formed on a respective cobalt portion 48 in each backside cavity 43', i.e., in the vacant portion of each backside recess. A combination of a metallic barrier material portion 148, a metallic material portion 47 contacting horizontal surfaces of the metallic barrier material portion 148, and a cobalt portion 48 encapsulated by the metallic barrier material portion 148 and the metallic material portion 47 constitutes an electrically conductive layer 46 at each level. Thus, each electrically conductive layer 46 can comprise a metallic material portion 47, a cobalt portion 48 including cobalt, and a metallic barrier material portion 148 including a metallic material other than cobalt. Each electrically conductive layer 46 can be formed directly on horizontal surfaces of the insulating layers 32 and directly on an outer sidewall of the memory film 50. Each metallic material portion 47 contacts a pair of horizontal surfaces of a metallic barrier material portion 148 located at the same level and a distal sidewall of the cobalt portion 48 located at the same level. Optionally, an anisotropic etch can be performed to remove regions of the metallic material portions 47 inside backside contact trench 79. In this case, the metallic material portions 47 can have sidewalls that are vertically coincident with sidewalls of the insulator layers 32 around the backside contact trench 79. Optionally, the metallic material portions 47 may be laterally recessed from the sidewall of the backside contact trench 79, for example, by a recess etch.

Figure 13B:
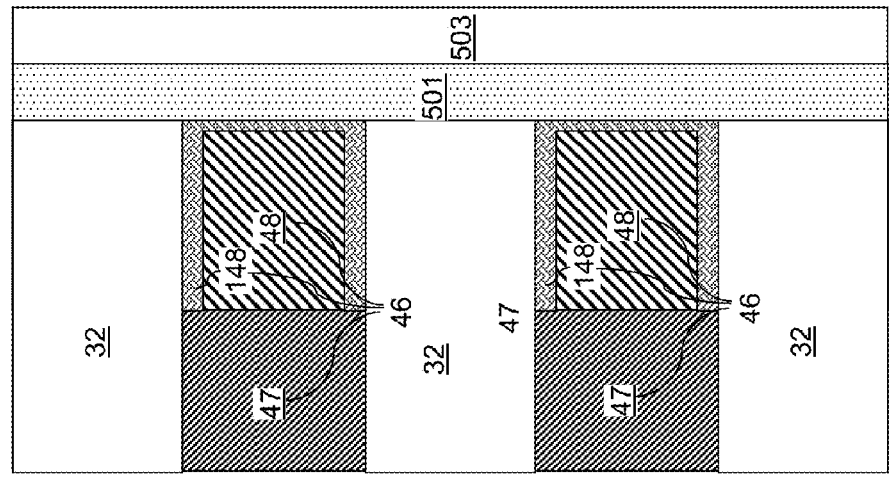
FIGS. 13A and 13B are sequential vertical cross-sectional views of a magnified region M in FIGS. 5A and 5B during formation of eighth exemplary electrically conductive layers according to an eighth embodiment of the present disclosure.
Figure 13A:
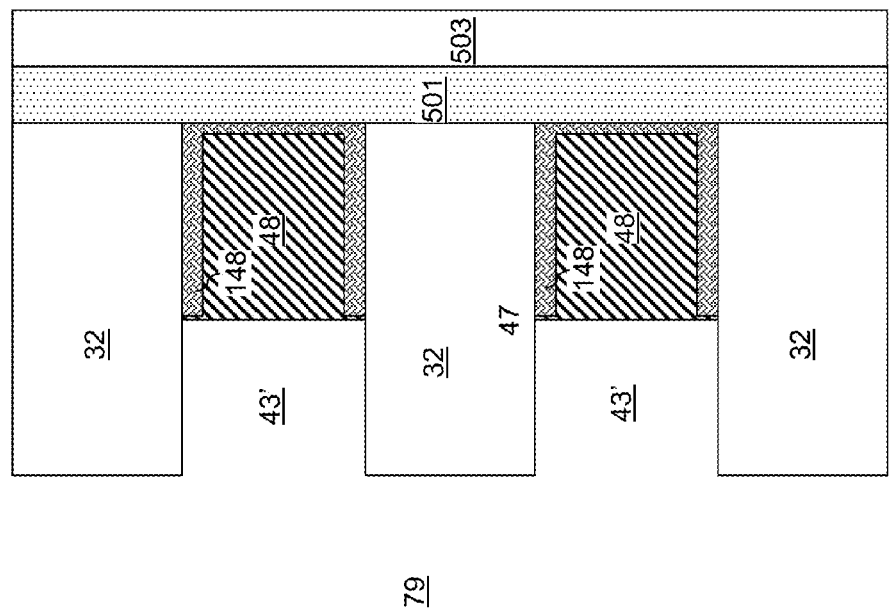

FIGS. 13A-13B illustrate processing steps for forming eighth exemplary electrically conductive layers according to an eighth embodiment of the present disclosure. The structure of FIG. 13A can be derived from the exemplary structure of FIG. 12B by isotropically etching physically exposed portions of each metallic barrier material portion 148. Alternately, the metallic barrier material portions 148 can be laterally recessed at about the same etch rate as the cobalt portion 48 from the exemplary structure of FIG. 12A.

Referring to FIG. 13B, the processing steps of FIG. 12C can be performed to form the metallic material portions 47, which can be, for example, tungsten portions. The metallic material portions 47 grow from the respective vertical metallic surfaces of the metallic barrier material portion 148 and the cobalt portion 48 at each level. Each metallic material portion 47 can contact a horizontal surface of an underlying dielectric layer (which can be, for example, an underlying insulator layer 32) and a horizontal surface of an overlying dielectric layer (which can be, for example, an overlying insulator layer 32).

FIGS. 14A-14E illustrate processing steps for forming ninth exemplary electrically conductive layers according to a ninth embodiment of the present disclosure. The structure of FIG. 14A can be derived from the structure of FIGS. 5A and 5B by forming a backside blocking dielectric layer 51 prior to formation of a metallic barrier material layer 148L. The backside blocking dielectric layer 51 includes a dielectric material, which can comprise a high dielectric constant (high-k) dielectric material having a dielectric constant greater than 7.9 (such as aluminum oxide), and/or silicon oxide and/or silicon nitride. The backside blocking dielectric layer 51 can be formed, for example, by chemical vapor deposition (CVD) or atomic layer deposition (ALD). The thickness of the backside blocking dielectric layer 51 can be in a range from 0.5 nm to 1.5 nm, although lesser and greater thicknesses can also be employed. The metallic barrier material layer 148L can be formed in the same manner as in the first embodiment.

Figure 14B:
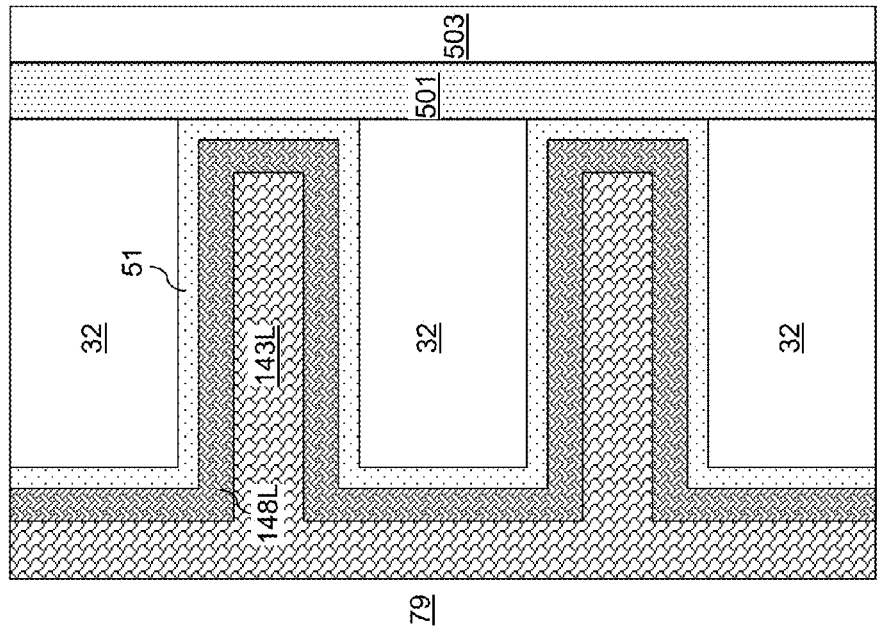
FIGS. 14A-14E are sequential vertical cross-sectional views of a magnified region M in FIGS. 5A and 5B during formation of ninth exemplary electrically conductive layers according to a ninth embodiment of the present disclosure.
Figure 14A:
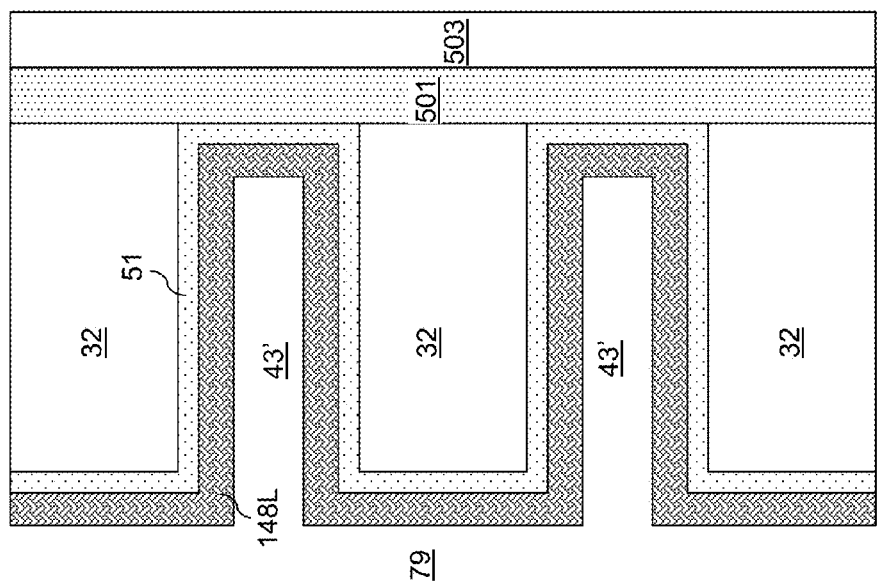

Referring to FIG. 14B, a disposable material layer 143L is formed in the backside cavities 43'. The disposable material layer 143L can fill the entirety of the backside cavities 43'. As used herein, a "disposable" material refers to a temporary material that is subsequently removed. The disposable material layer 143L includes a material that can be removed selective to the material of the metallic barrier material layer 148L. In one embodiment, the disposable material layer 143L can comprise a semiconductor material such as polysilicon, amorphous silicon, a silicon-germanium alloy, or a combination thereof. The disposable material layer 143L can be deposited, for example, by chemical vapor deposition.

Figure 14C:
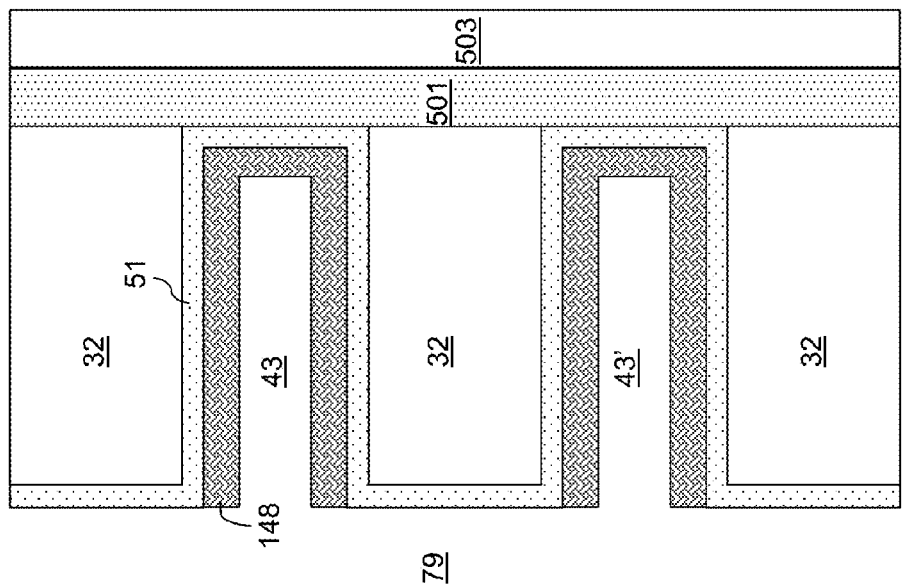

Referring to FIG. 14C, the material of the disposable material layer 143L and the metallic barrier material layer 148L are isotropically or anisotropically etched to physically expose sidewalls of the backside blocking dielectric layer 51. The etch of the disposable material layer 143L can be performed by a dry etch or a wet etch. For example, if the disposable material layer 143L comprises silicon, the disposable material layer 143L can be etched by an etch process employing one or more of $BCl_3$; a combination of $SiCl_4$, $Cl_2$, and HCl; a combination of $O_2$, $SiCl_4$, and HCl; $SF_6$; and $NF_3$. Each remaining portion of the disposable material layer 143L within a backside recess is herein referred to as a disposable material portion 143.

Subsequent to, or concurrently with, the etch of the vertical portion of the disposable material layer 143L, physically exposed portions of the metallic barrier material layer 148L is removed by an etch selective to the backside blocking dielectric layer 51. Each remaining portion of the metallic barrier material layer 148L constitutes a metallic barrier material portion 148. In other words, a metallic barrier material portion 148 and a disposable material portion 143 can be formed at each level of the of backside recesses by removing vertical portions of the disposable material layer 143L and the metallic barrier material layer 148L, respectively.

Figure 14D:
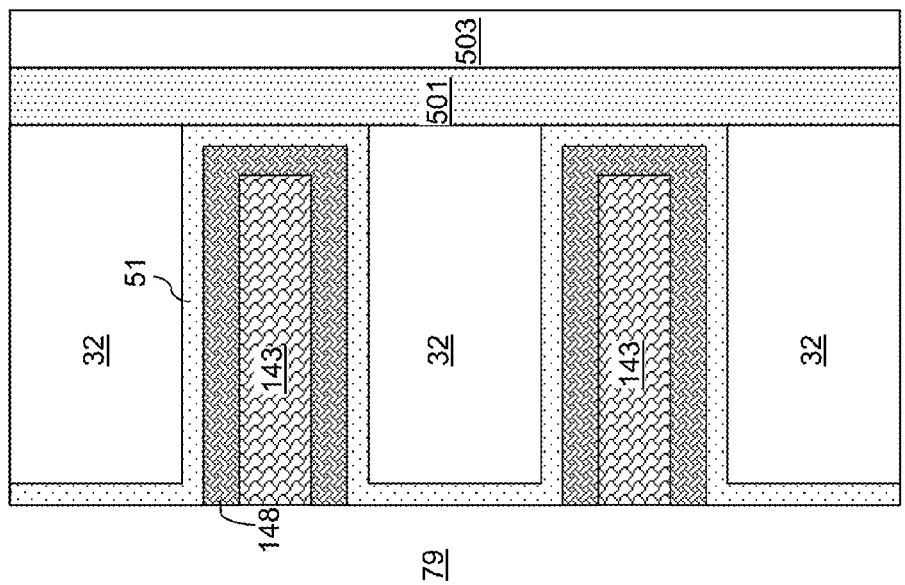

Referring to FIG. 14D, the disposable material portions 143 can be removed by an isotropic etch that etches the material of the disposable material portions 143. A backside cavity 43' can be formed within the volume of each backside recess.

Figure 14E:
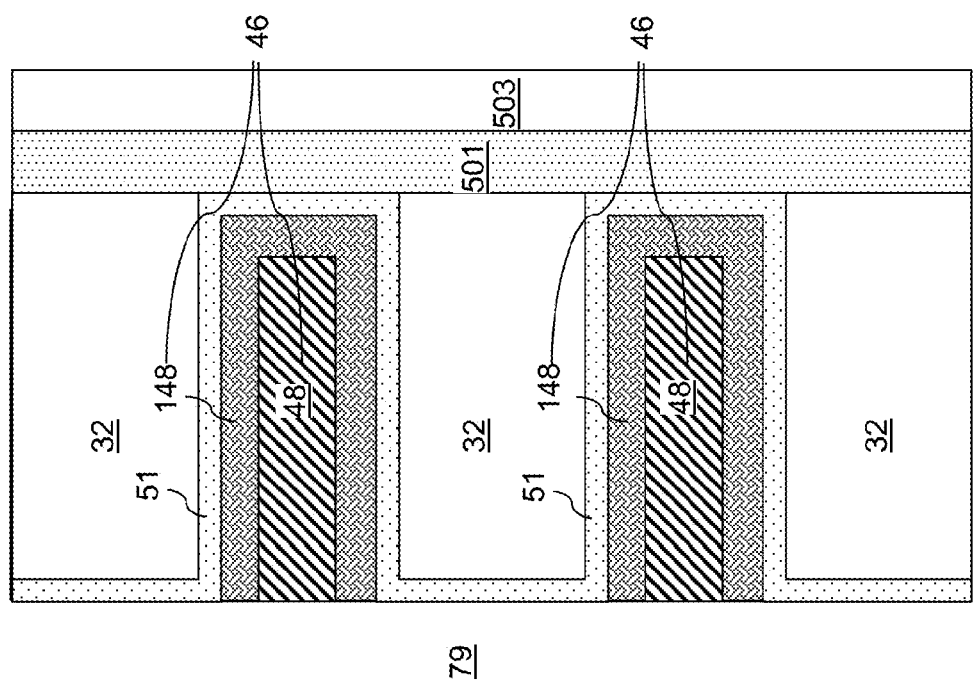

Referring to FIG. 14E, the processing step of FIG. 6C can be performed to form cobalt portions 48. Each cobalt portion 48 is embedded within a metallic barrier material portion 148. Optionally, the processing steps of FIG. 6D may be performed.

A combination of a metallic barrier material portion 148 and a cobalt portion 48 embedded within the metallic barrier material portion 148 constitutes an electrically conductive layer 46 at each level. Thus, each electrically conductive layer 46 can consist of a cobalt portion 48 and a metallic barrier material portion 148. Each electrically conductive layer 46 can be vertically spaced from an overlying insulating layer 32, an underlying insulating layer 32, and the memory film 50 by the backside blocking dielectric layer 51. Each cobalt portion 48 of the electrically conductive layers 46 is formed on surfaces of a respective metallic barrier material portion 148. Specifically, each cobalt portion 48 of the electrically conductive layers 46 is formed on a pair of horizontal surfaces of the respective metallic barrier material portion and an outer sidewall of the respective metallic barrier material portions. The disposable material layer 143L may be used in conjunction with other embodiments.

Figure 15:
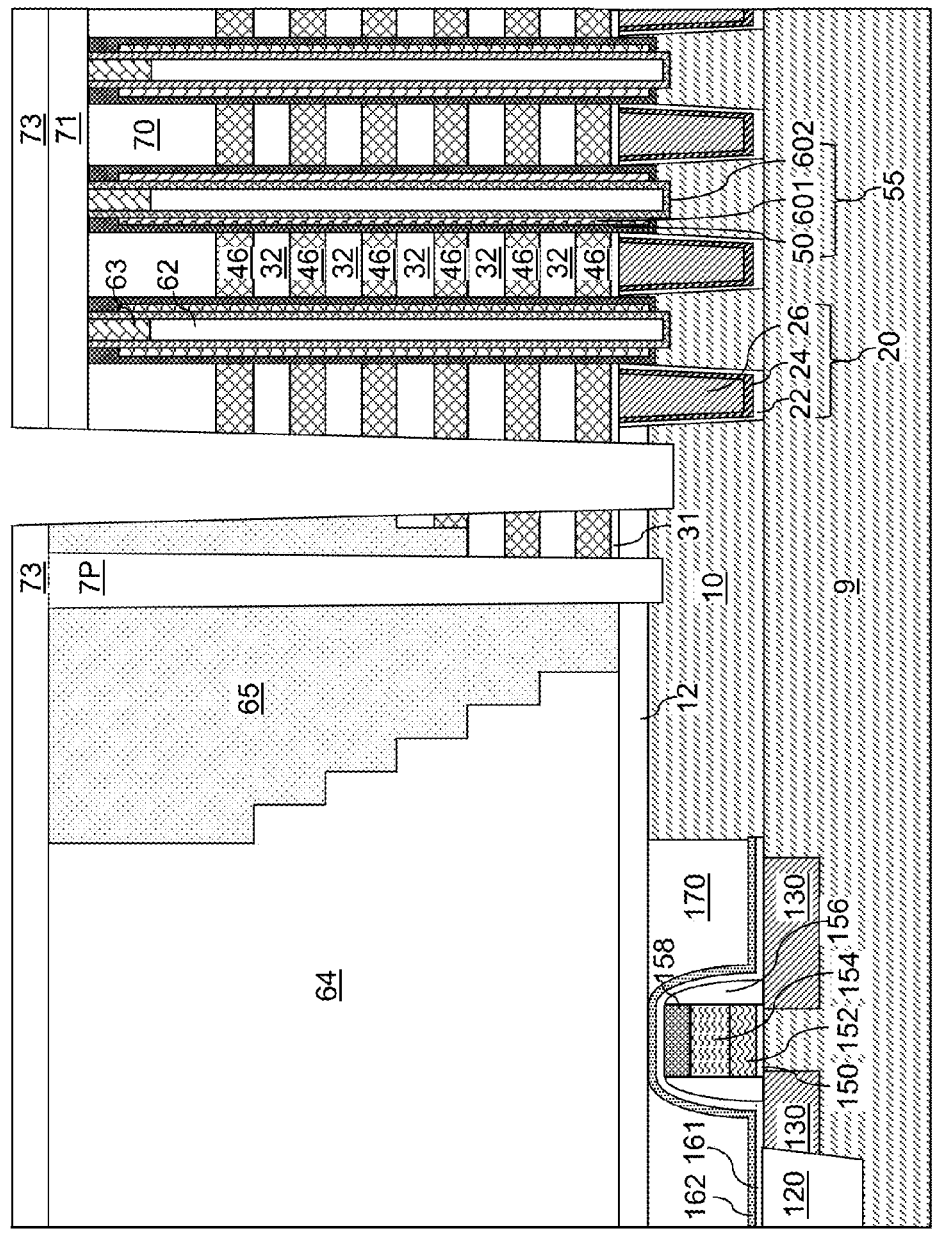
FIG. 15 is a vertical cross-sectional view of the exemplary structure after formation of electrically conductive lines according to an embodiment of the present disclosure.

Referring to FIG. 15, the exemplary structure is shown after formation of a plurality of electrically conductive layers 46, which can be any of the electrically conductive layers 46 according to the first through ninth embodiments as described above.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Figure 16:
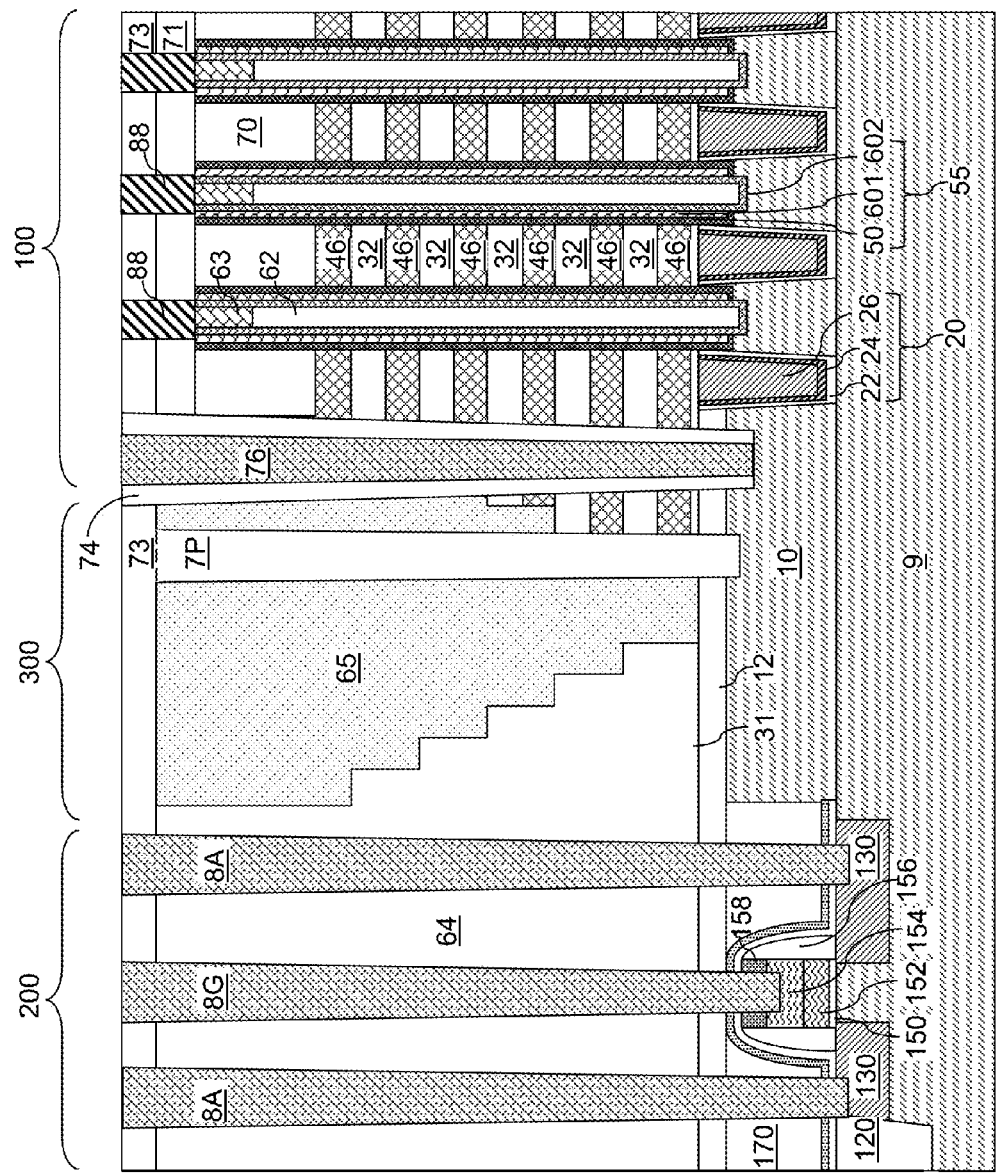
FIG. 16 is a vertical cross-sectional view of the exemplary structure after formation of a backside via space and a backside contact via structure according to an embodiment of the present disclosure.

Referring to FIG. 16, an insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the exemplary structure, and can be lithographically patterned to form openings within the contact region 300 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

In addition, another photoresist layer (not shown) can be applied over the exemplary structure, and can be lithographically patterned to form openings that overlie the array of drain regions 63 in the device region 100. Drain contact via cavities can be formed through the dielectric pillar material layer 73 and the at least one dielectric cap layer 71.

The cavity laterally surrounded by the insulating spacer 74, the various via cavities in the peripheral device region 200, the control gate contact via cavities in the contact region 300, and the drain contact via cavities in the device region 100 can be filled with a conductive material to form various contact via structures. For example, a backside contact via structure 76 can be formed in the cavity surrounded by the insulating spacer 74. A gate contact via structure 8G can be formed in each gate via cavity in the peripheral device region 200. An active region via structure 8A is formed in each active region via cavity in the peripheral device region 200. Drain contact via structures 88 can be formed in the drain contact via cavities in the device region 100. Further, control gate contact via structures (not shown) can be formed within each contact via cavity that extends to a top surface of the electrically conductive layers 46 in the contact region 300. Similarly, drain contact via structures 88 can be formed to provide electrical contact to the drain regions 63.

Figure 17A:
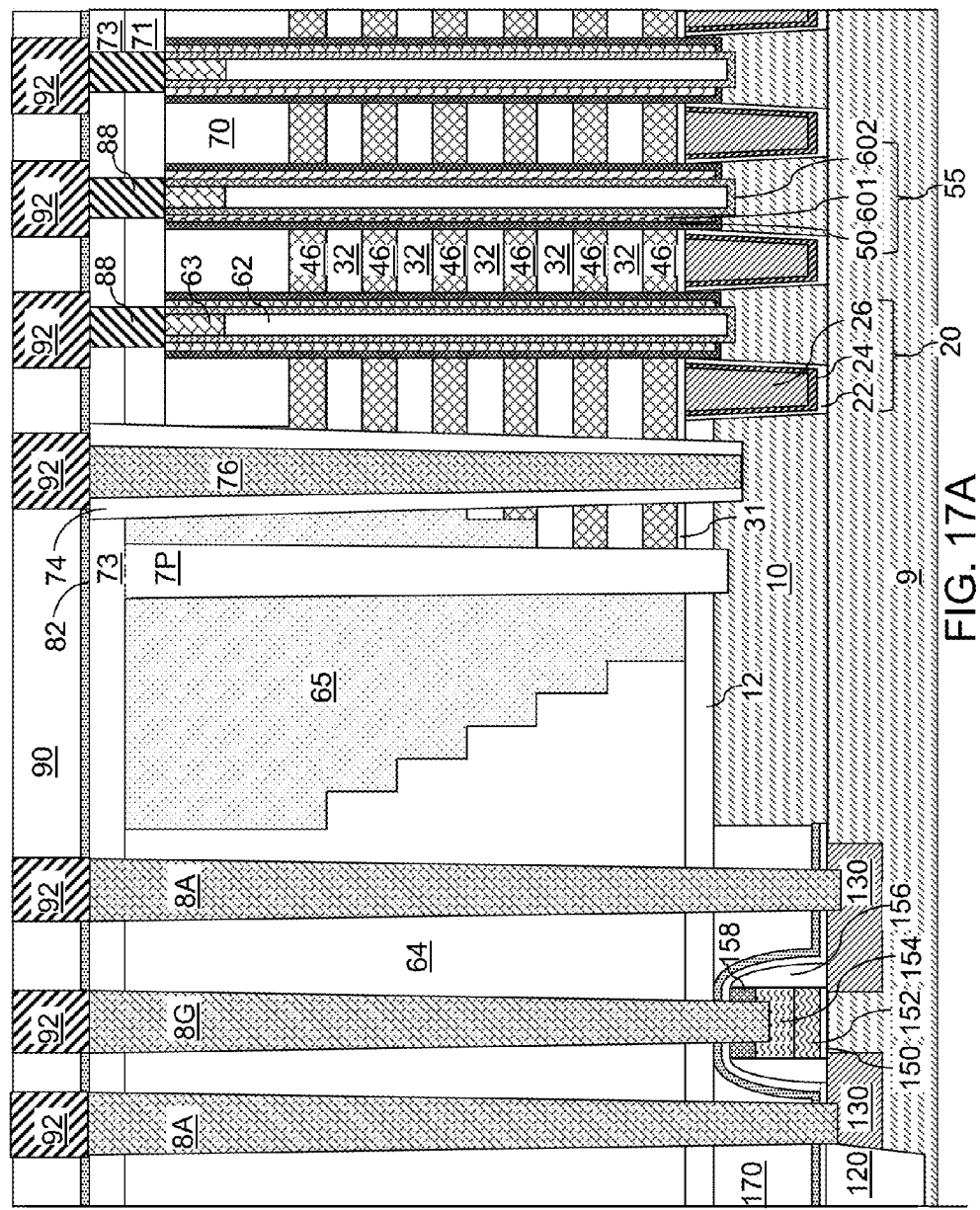
FIGS. 17A and 17B are vertical cross-sectional views of regions of the exemplary structure after formation of conductive line structures according to an embodiment of the present disclosure.
Figure 17B:
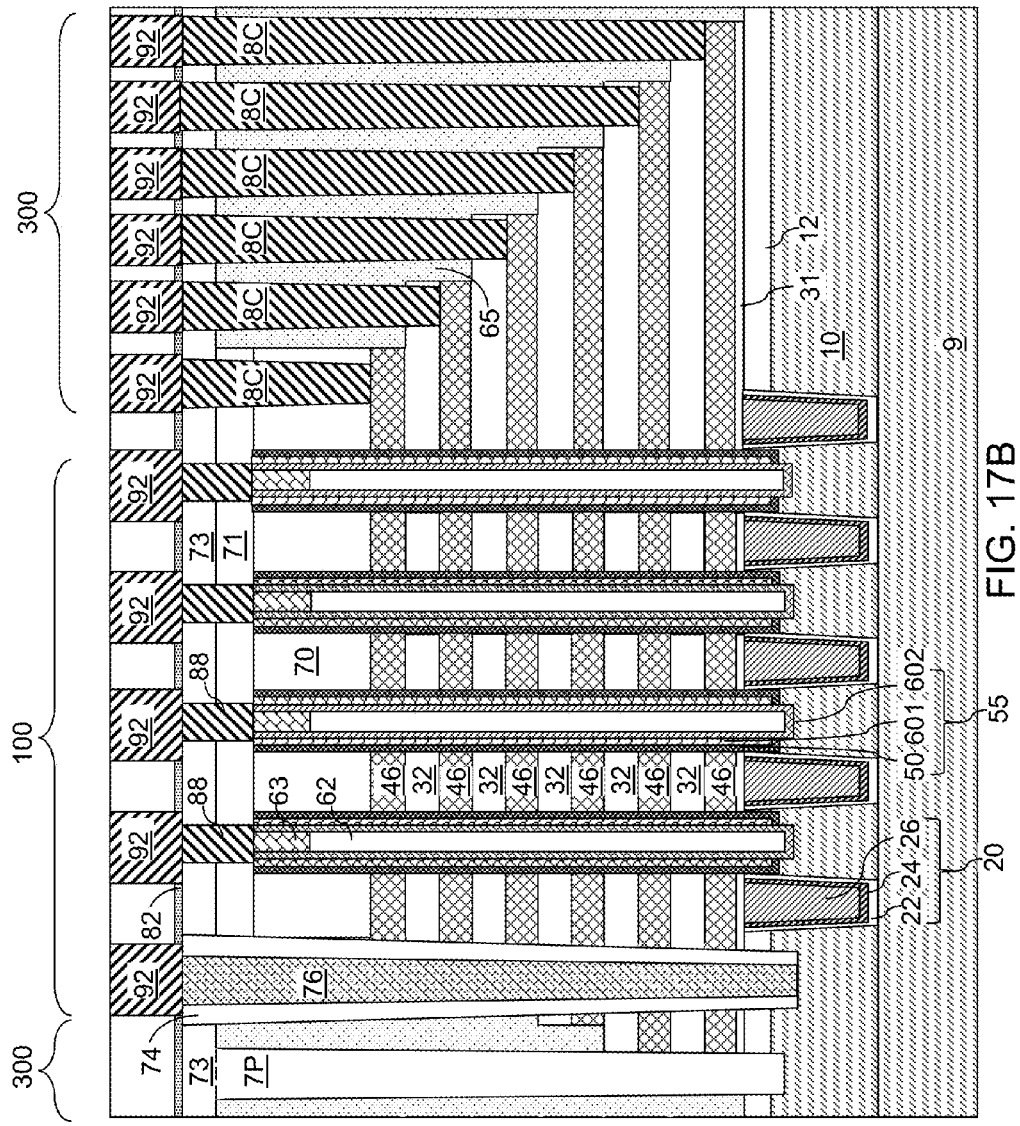

Referring to FIGS. 17A and 17B, an optional passivation layer 82 and a line-level dielectric layer 90 can be formed over the dielectric pillar material layer 73. The optional passivation layer 82 can include a low permeability material such as silicon nitride. The thickness of the passivation layer 82 can be in a range from 3 nm to 30 nm, although lesser and greater thicknesses can also be employed. The line-level dielectric layer 90 can include silicon oxide or organosilicate glass. The thickness of the line-level dielectric layer 90 can be in a range from 30 nm to 1,000 nm, although lesser and greater thicknesses can also be employed. Control gate contact via structures 8C can contact the electrically conductive layers 46.

Various conductive line structures 92 can be formed in the line-level dielectric layer 90 to provide electrical contact to the various contact via structures (76, 8G, 8A, 88, 8C). A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

Additional metal interconnect structures (not shown) can be optionally formed, which can include at least one dielectric material layer, at least one conductive via structure, and at least one additional conductive line structure. The additional metal interconnect structure can be formed on the top surface of the conductive line structure 92 and the line-level dielectric layer 90.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten, ruthenium, a combination or an alloy of ruthenium and tungsten, or a combination of titanium nitride, ruthenium, and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10.

A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element. An array of drain regions 63 contacts a respective semiconductor channel (601, 602) within the array of memory stack structures 55. A top surface of the dielectric material layer, i.e., the insulating cap layer 70, can be coplanar with top surfaces of the drain regions 63.

The exemplary structure of the present disclosure can comprise a three-dimensional memory device, which comprises a stack (32, 46) of alternating layers comprising insulator layers 32 and electrically conductive layers 46 and located over a substrate (9, 10), a memory opening extending through the stack (32, 46), and a memory film 50 and a semiconductor channel (601, 602) located within the memory opening. Each of the electrically conductive layers 46 comprises at least a cobalt portion 48. The electrically conductive layers 46 comprise a first control gate electrode located in a first device level, and a second control gate electrode located in a second device level that is located below the first device level.

In lieu of forming first through ninth electrically conductive layers 46 including cobalt portions 46 as described above, electrically conductive layers containing a molybdenum-containing material can be formed instead. Various exemplary electrically conductive layers including molybdenum-containing portions are described below. The exemplary structure of FIGS. 5A and 5B can be employed to form the various exemplary electrically conductive layers described below.

FIGS. 18A-18D illustrate processing steps which can be employed to form tenth exemplary electrically conductive layers according to a tenth embodiment of the present disclosure. Referring to FIG. 18A, a vertical cross-sectional magnified view of a magnified region M in FIGS. 5A and 5B is illustrated, which includes a portion of the backside contact trench 79 and a plurality of backside recesses 43. In one embodiment, a sidewall surface of at least one blocking dielectric (501, 503) can be physically exposed at end portions of backside recesses 43. The sidewall surface of the at least one blocking dielectric (501, 503) is an outer sidewall surface of a memory film 50 illustrated in FIG. 2F. Optionally, a backside blocking dielectric layer (not shown) including a blocking dielectric material can be formed on the physically exposed surfaces of the insulator layers 32 and the physically exposed sidewalls of the memory film 50 (See FIG. 2F).

An optional metallic barrier material layer 148L can be deposited in the backside recesses 43 and over the sidewall of the backside contact trench 79 in the same manner as in the processing steps of FIG. 6A. The metallic barrier material layer 148L can be the same as in the first through ninth embodiments. A backside cavity 43' is present in each unfilled volume of the backside recess 43, i.e., in each volume of the backside recess 43 that is not filled with the metallic barrier material layer 148L.

Referring to FIG. 18B, an anisotropic etch is performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Vertical portions of the metallic barrier material layer 148L are removed from the sidewall of the backside contact trench 79. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148. Each metallic barrier material portion 148 can be a conformal material portion having a uniform thickness throughout. Sidewalls of the insulator layers 32 are physically exposed within each backside contact trench 79. The metallic barrier material portions 148 are formed as a plurality structures that are vertically disjoined from one another. The same process can be employed as the process of FIG. 6B.

Referring to FIG. 18C, a molybdenum-containing material can be selectively deposited inside the backside cavities to form molybdenum-containing portions 38. Deposition of the molybdenum-containing material can be performed by chemical vapor deposition (CVD) or atomic layer deposition (ALD). Chemical vapor deposition or atomic layer deposition of the molybdenum-containing material employs a molybdenum-containing precursor, such as a molybdenum halide precursor. In a non-limiting example, $MoCl_6$ or $MoF_6$ can be employed as a molybdenum-containing precursor gas in a CVD or ALD process.

In one embodiment, $MoCl_6$ can be employed as the molybdenum-containing precursor gas, hydrogen can be employed as the reduction gas. A deposition process employing the combination of $MoCl_6$ and hydrogen can deposit a fluorine-free molybdenum-containing material. Absence of fluorine in the deposited molybdenum-containing material can prevent formation of voids in silicon oxide portions, and improve device performance by preventing formation of leakage paths.

In case $MoF_6$ can be employed as the molybdenum-containing precursor gas, silane can be employed as the reduction gas. In this case, a molybdenum-silicon alloy can be deposited as the molybdenum-containing material.

In one embodiment, the deposition process can employ only $MoCl_6$ and hydrogen as reaction gases (with optional carrier gases) to deposit pure molybdenum as the deposited molybdenum-containing material portions. Alternatively, additional metal precursor gas(es) may be employed to deposit an intermetallic alloy of molybdenum and at least one metallic element, i.e., a molybdenum-containing metallic alloy, as the deposited molybdenum-containing material portions. The additional precursors that may be employed to deposit the molybdenum-containing metallic alloy include, but are not limited to, precursors for cobalt deposition as described above, precursors for ruthenium deposition, precursors for tungsten deposition, and precursors for deposition of another elemental metal, such as copper, titanium, phosphorus and/or manganese. For example, the molybdenum-containing metallic alloy which comprises the molybdenum-containing material portions may be selected from a molybdenum tungsten alloy, a molybdenum tungsten and phosphorus alloy, a molybdenum manganese alloy and/or a molybdenum titanium alloy. In these alloys, molybdenum comprises greater than 50 atomic percent, such as 60 to 99 at. %, for example 70 to 90 at. % of the alloy, and the alloying element(s), such as W, P, Mn and/or Ti comprises less than 50 atomic percent, such as 1 to 40 at. %, for example 10 to 30 at. % of the alloy.

The molybdenum-containing material may be selectively nucleated on a metallic surface such as the surfaces of the metallic barrier material portions 148 if the precursors employed for deposition of the molybdenum-containing material induce a selective deposition process. For example, if the combination of $MoCl_6$ and hydrogen is employed to deposit pure molybdenum, or if additional precursor gases that selectively deposit a metal only on metallic surfaces are employed, the molybdenum-containing material can be deposited only on metallic surfaces. Precursor gases known to selectively deposit cobalt, ruthenium, or tungsten can be employed simultaneously, or sequentially, in conjunction with a molybdenum-containing precursor gas, to selectively deposit a molybdenum-containing metallic alloy.

The molybdenum-containing portions 38 can grow selectively only from the surfaces of the metallic barrier material portions 148, and do not grow from the sidewalls of the insulator layers 32. As such, the molybdenum-containing material deposition process can be a selective deposition process that proceeds from the surfaces of the metallic barrier material portions 148, while molybdenum-containing material is not deposited on the surfaces of the insulator layers 32. Each molybdenum-containing portion 38 can be formed on surfaces of a respective metallic barrier material portion 148, and specifically, on a pair of horizontal surfaces of the respective metallic barrier material portion 148 and an outer sidewall of the respective metallic barrier material portion 148. Each deposited portion of the molybdenum-containing material constitutes one of the molybdenum-containing portions 38.

The duration of the molybdenum-containing material deposition process can be selected such that the molybdenum-containing portions 38 completely fill the backside cavities 43'. In one embodiment, a convex sidewall of each molybdenum-containing portion 38 can protrude into the backside contact trench 79 due to the selective nature of the molybdenum-containing material deposition process. A combination of a metallic barrier material portion 148 and a molybdenum-containing portion 38 embedded within the metallic barrier material portion 148 constitutes an electrically conductive layer 46 at each level. Thus, each electrically conductive layer 46 can consist of a molybdenum-containing portion 38 and a metallic barrier material portion 148. Each electrically conductive layer 46 can be formed directly on horizontal surfaces of the insulating layers 32 and directly on an outer sidewall of the memory film 50. In one embodiment, the electrically conductive layers 46 can be employed as is, and subsequent processing steps of FIG. 16 can be performed.

Alternatively, the molybdenum-containing portions 38 can be laterally recessed. FIG. 18D illustrates the optional step of laterally recessing the molybdenum-containing portions 38, in which the molybdenum-containing material can be isotropically etched employing an isotropic etch chemistry. The lateral recessing of the molybdenum-containing portions 38 can be performed by an isotropic dry etch or a wet etch. The lateral recess distance lrd, as measured between a vertical plane including a sidewall of the backside contact trench 79 and a sidewall of a molybdenum-containing portion 38 after the lateral recess, can be in a range from 3 nm to 5 nm, although lesser and greater thickness can be employed. A proximal sidewall of each molybdenum-containing portion 38 is laterally spaced from the memory film 50 (See FIG. 2F) by a vertical portion of a respective metallic barrier material portion 148. Each molybdenum-containing portion 38 can be laterally recessed from the backside contact trench 79. Specifically, a distal sidewall of each molybdenum-containing portion 38 (e.g., a left side sidewall in FIG. 18D) is more proximal to the memory film 50 than the sidewall of the backside contact trench 79 is to the memory film 50 by the lateral recess distance lrd. The lateral recessing of the sidewalls of the molybdenum-containing portions 38 is an optional process.

FIGS. 19A and 19B illustrate processing steps for forming eleventh exemplary electrically conductive layers according to an eleventh embodiment of the present disclosure. The structure of FIG. 19A can be derived from the structure of FIG. 18A by depositing a molybdenum-containing layer 38L on the metallic barrier material layer 148L. The molybdenum-containing layer 38L can be deposited employing the same deposition methods as the deposition methods employed to deposit the molybdenum-containing portions 38. Because the surfaces of the metallic barrier material layer 148L are present within the backside recesses 43 and in the backside contact trench 79, the molybdenum-containing layer 38L can be deposited as a contiguous layer filling the backside cavities 43' and extending through the entire height of the backside contact trench 79.

Referring to FIG. 19B, the molybdenum-containing layer 38L can be etched to physically expose sidewalls of the insulator layers 32. The etching of the molybdenum-containing material can be performed by an isotropic dry etch process or a wet etch process. The isotropic etch of the molybdenum-containing material may, or may not, be selective to the material of the metallic barrier material layer 148L. The molybdenum-containing layer 38L can be divided into disjoined discrete material portions located within each respective level. Each disjoined discrete material portion of the molybdenum-containing layer 38L is herein referred to as a molybdenum-containing portion 38. In one embodiment, an outer sidewall of each molybdenum-containing portion 38 can be laterally recessed from the sidewall of the backside contact trench 79 by a lateral recess distance lrd. A proximal sidewall of each molybdenum-containing portion 38 is laterally spaced from the memory film 50 (See FIG. 2F) by a vertical portion of a respective metallic barrier material portion 148. Each molybdenum-containing portion 38 can be laterally recessed from the backside contact trench 79. Specifically, a distal sidewall of each molybdenum-containing portion 38 is more proximal to the memory film 50 than the sidewall of the backside contact trench 79 is to the memory film 50 by the lateral recess distance lrd.

Subsequent to the etching of the molybdenum-containing layer 38L or concurrently with etching of the molybdenum-containing layer 38L, an anisotropic etch can be performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148.

Thus, portions of the contiguous molybdenum-containing layer 38L are etched back prior to removing the vertical portions of the metallic barrier material layer 148L. Each remaining portion of the contiguous molybdenum-containing layer 38L constitutes a molybdenum-containing portion 38 of the electrically conductive layers 46. The molybdenum-containing portions 38 may have distal sidewalls that are laterally recessed from the sidewalls of the backside trench 79, or may have distal sidewalls that are vertically coincident with the sidewalls of the backside trench 79. Each metallic barrier material portion 148 can be a conformal material portion having a uniform thickness throughout. Sidewalls of the insulator layers 32 are physically exposed within each backside contact trench 79. Each molybdenum-containing portion 38 can be formed on surfaces of a respective metallic barrier material portion 148, and specifically, on a pair of horizontal surfaces of the respective metallic barrier material portion 148 and an outer sidewall of the respective metallic barrier material portion 148. A combination of a metallic barrier material portion 148 and a molybdenum-containing portion 38 embedded within the metallic barrier material portion 148 constitutes an electrically conductive layer 46 at each level. Each electrically conductive layer 46 can consist of a molybdenum-containing portion 38 and a metallic barrier material portion 148.

Figure 20C:
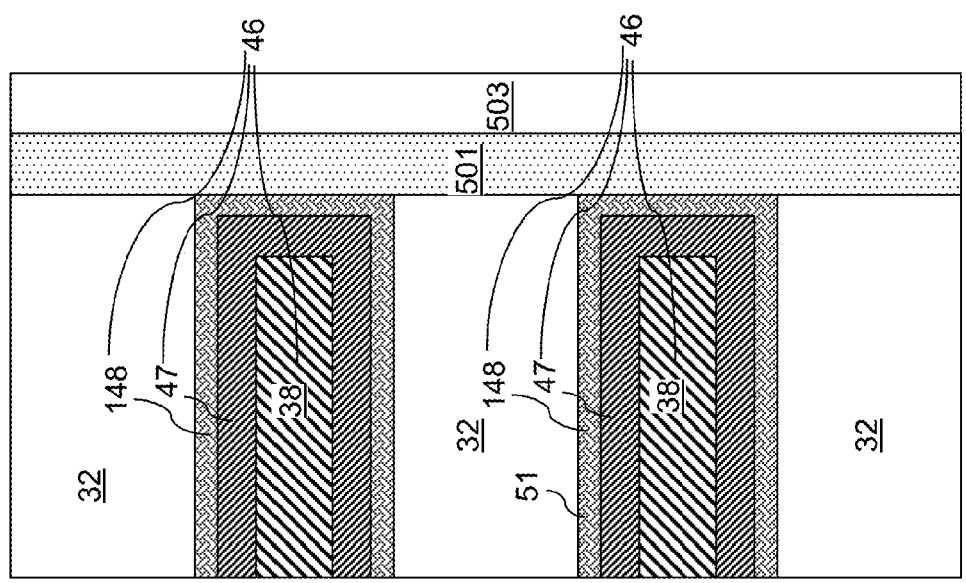

FIGS. 20A-20C illustrate processing steps for forming twelfth exemplary electrically conductive layers according to a twelfth embodiment of the present disclosure. The structure of FIG. 20A can be derived from the structure of FIG. 18A by depositing a metallic material layer 47L on the metallic barrier material layer 148L. The metallic material layer 47L can be a contiguous layer extending through the entire vertical height of the backside contact trench 79. The metallic material layer 47L can include any metallic material other than molybdenum. In one embodiment, the metallic material layer 47L can consist essentially of a single elemental metal or an intermetallic alloy of at least two elemental metals. For example, the metallic material layer 47L can comprise cobalt, tungsten, copper, ruthenium, or titanium, or a combination thereof. In one embodiment, the metallic material layer 47L can comprise tungsten or a tungsten-containing intermetallic alloy. The thickness of the metallic material layer 47L can be selected such that the backside cavities 43' are not completely filled with the metallic material layer 47L.

Referring to FIG. 20B, an anisotropic etch is performed to remove vertical portions of the metallic barrier material layer 148L and the metallic material layer 47L from the sidewalls of each backside contact trench 79. The anisotropic etch can be a reactive ion etch that removes the materials of the metallic barrier material layer 148L and the metallic material layer 47L selective to the material of the insulator layers 32 and the material of the semiconductor material layer 10. Portions of the metallic barrier material layer 148L and the metallic material layer 47L inside the backside recesses 43 are not removed by the anisotropic etch. Each remaining portion of the metallic barrier material layer 148L inside the backside recesses 43 constitutes a metallic barrier portion 148. Each remaining portion of the metallic material layer 47L inside the backside recesses 43 constitutes a metallic material portion 47. Each metallic barrier material portion 148 can be a conformal material portion having a uniform thickness throughout. Likewise, each metallic material portion 47 can be a conformal material portion having another uniform thickness throughout. Sidewalls of the insulator layers 32 are physically exposed within each backside contact trench 79. The metallic barrier material portions 148 are formed as a plurality structures that are vertically disjoined from one another. Further, the metallic material portions 47 are formed as a plurality structures that are vertically disjoined from one another. Alternately, the processing steps of FIGS. 18A and 1B can be performed, and the metallic material portions 47 can be deposited by a selective deposition process.

Referring to FIG. 20C, the molybdenum-containing material can be deposited inside the backside cavities 43' to form molybdenum-containing portions 38. Deposition of the molybdenum-containing material can be performed employing the same methods as in the tenth embodiment. Molybdenum-containing portions 38 can grow only from the surfaces of the metallic material portions 47 and the metallic barrier material portions 148, and do not grow from the sidewalls of the insulator layers 32. As such, the molybdenum-containing material deposition process is a selective deposition process that proceeds from the surfaces of the metallic material portions 47, while molybdenum-containing material is not deposited on the surfaces of the insulator layers 32. Each molybdenum-containing portion 38 can be formed on surfaces of a respective metallic material portion 47, and specifically, on a pair of horizontal surfaces of the respective metallic material portion 47 and an outer sidewall of the respective metallic material portion 47. Each deposited portion of the molybdenum-containing material constitutes one of the molybdenum-containing portions 38.

The duration of the molybdenum-containing material deposition process can be selected such that the molybdenum-containing portions 38 completely fill the backside cavities 43'. A combination of a metallic barrier material portion 148, a metallic material portion 47 embedded within the metallic barrier material portion 148, and a molybdenum-containing portion 38 embedded within the metallic material portion 47 constitutes an electrically conductive layer 46 at each level. Thus, each electrically conductive layer 46 can comprise a molybdenum-containing portion 38, a metallic material portion 47 including a metallic material other than molybdenum, and a metallic barrier material portion 148. Each electrically conductive layer 46 can be formed directly on horizontal surfaces of the insulating layers 32 and directly on an outer sidewall of the memory film 50. Optionally, the molybdenum-containing portions 38 and/or the metallic material portions 47 can be laterally recessed from the sidewall of the backside contact trench 79. In this case, each of the electrically conductive layers 46 comprises a metallic barrier material portion 148 contacting an outer sidewall of the memory film 50, a metallic material portion 47 containing a material other than molybdenum and contacting the metallic barrier material portion 148, and a respective molybdenum-containing portion 38 contacting horizontal surfaces of the metallic material portion 47 and not contacting the metallic barrier material portion 148.

Figure 21B:
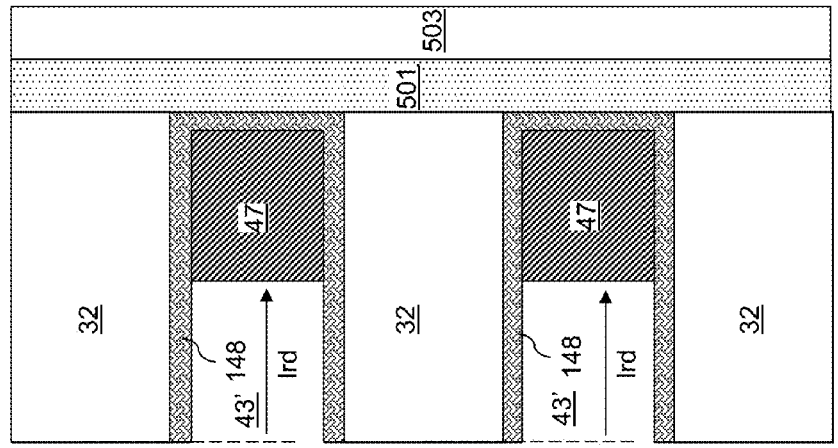
FIGS. 21A-21C are sequential vertical cross-sectional views of a magnified region M in FIGS. 5A and 5B during formation of thirteenth exemplary electrically conductive layers according to a thirteenth embodiment of the present disclosure.
Figure 21A:
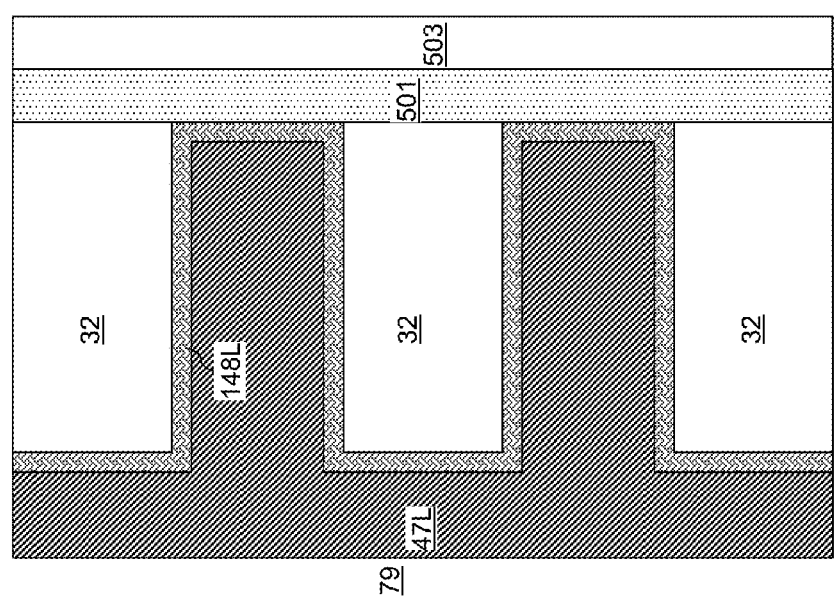
Figure 21C:
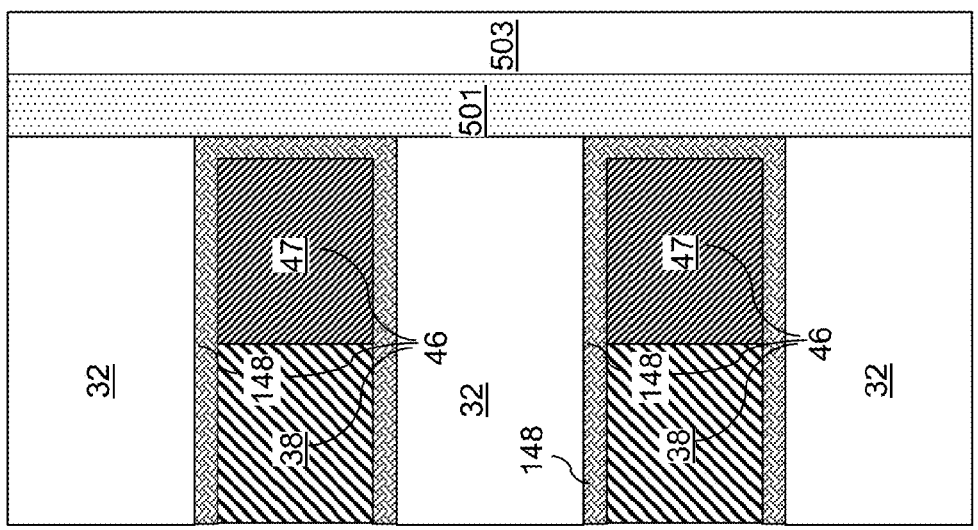

FIGS. 21A-21C illustrate processing steps for forming thirteenth exemplary electrically conductive layers according to a thirteenth embodiment of the present disclosure. The structure of FIG. 21A can be derived from the structure of FIG. 18A by depositing a metallic material layer 47L on the metallic barrier material layer 148L. The metallic material layer 47L can include any metallic material other than molybdenum. In one embodiment, the metallic material layer 47L can consist essentially of a single elemental metal or an intermetallic alloy of at least two elemental metals. For example, the metallic material layer 47L can comprise cobalt, tungsten, copper, titanium, ruthenium, or a combination thereof. In one embodiment, the metallic material layer 47L can comprise tungsten or a tungsten-containing intermetallic alloy. The thickness of the metallic material layer 47L can be selected such that the backside cavities 43' are completely filled with the metallic material layer 47L.

Referring to FIG. 21B, vertical portions of the metallic material layer 47L and the metallic barrier material layer 148L are removed from the sidewall of the backside contact trench 79. The metallic material layer 47L can be isotropically etched to physically expose the sidewall of the metallic barrier material layer 148L located adjacent to the sidewall of each backside contact trench 79. The isotropic etch of tungsten can be performed by an isotropic dry etch process or a wet etch process. The isotropic etch of the metallic material layer 47L can be selective to the material of the metallic barrier material layer 148L. The duration of the isotropic etch can be selected such that remaining portions of the metallic material layer 47L are laterally recessed from the sidewall of the backside contact trench 79 by a lateral recess distance lrd. The metallic material layer 47L is divided into disjoined discrete material portions located within each respective level. Each disjoined discrete material portion of the metallic material layer 47L constitutes a metallic material portion 47.

Subsequently, an anisotropic etch is performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148. Thus, portions of the metallic material layer 47L are etched back prior to removing the vertical portions of the metallic barrier material layer 148L. Each remaining portion of the metallic material layer 47L constitutes a metallic material portion 47 of electrically conductive layers to be formed. Alternately, an anisotropic etch may be employed to remove the vertical portions of the metallic material layer 47L and the metallic barrier material layer 148L, and an isotropic etch may be employed to laterally recess the metallic material portions 47.

In one embodiment, the lateral recess distance lrd can be greater than the height of a backside recess 43, which is the same as the height of a metallic barrier material portion 148 within the backside recess 43. In one embodiment, the lateral recess distance lrd can be in a range from 15% to 85% of the lateral distance between the sidewall of the backside contact trench 79 and the outer sidewall of the memory film 50, e.g., the outer sidewall of the at least one blocking dielectric layer (501L, 503L). In one embodiment, the lateral recess distance lrd can be determined to optimize the resistance of the electrically conductive layers to be formed in the backside recesses and the overall stress that the electrically conductive layers will generate. A distal sidewall of each metallic material portion 47 is more proximal to the memory film 50 than the sidewall of the backside contact trench 79 is to the memory film 50 by the lateral recess distance lrd. A proximal sidewall of each metallic material portion 47 can contact an outer sidewall of a metallic barrier material portion 148.

Referring to FIG. 21C, the molybdenum-containing material can be deposited inside the backside cavities 43' to form molybdenum-containing portions 38. Deposition of the molybdenum-containing material can be performed employing the same methods as in the tenth embodiment. Molybdenum-containing portions 38 can grow only from the surfaces of the metallic material portions 47 and the metallic barrier material portions 148, and do not grow from the sidewalls of the insulator layers 32. As such, the molybdenum-containing material deposition process is a selective deposition process that proceeds from the surfaces of the metallic barrier material portions 148 and the surfaces of the metallic material portions 47, while molybdenum-containing material is not deposited on the surfaces of the insulator layers 32. Thus, each molybdenum-containing portion 38 can be formed on a respective metallic material portion 47 and a respective metallic barrier material portion 148, and specifically, on a pair of horizontal surfaces of the respective metallic barrier material portion 148 and an outer sidewall of the respective metallic material portion 47. Each deposited portion of the molybdenum-containing material constitutes one of the molybdenum-containing portions 38.

In one embodiment, the duration of the molybdenum-containing material deposition process can be selected such that the molybdenum-containing portions 38 completely fill the backside cavities 43'. A combination of a metallic barrier material portion 148, a molybdenum-containing portion 38 contacting horizontal surfaces of the metallic barrier material portion 148, and a metallic material portion 47 encapsulated by the metallic barrier material portion 148 and the molybdenum-containing portion 38 constitutes an electrically conductive layer 46 at each level. Thus, each electrically conductive layer 46 can comprise a molybdenum-containing portion 38, a metallic material portion 47 including a metallic material other than molybdenum, and a metallic barrier material portion 148. Each electrically conductive layer 46 can be formed directly on horizontal surfaces of the insulating layers 32 and directly on an outer sidewall of the memory film 50. Optionally, an anisotropic etch or an isotropic etch can be performed to remove regions of the molybdenum-containing portions 38 inside backside contact trench 79. In this case, the molybdenum-containing portions 38 can have sidewalls that are vertically coincident with sidewalls of the insulator layers 32 around the backside contact trench 79. Optionally, the molybdenum-containing portions 38 may be laterally recessed from the sidewall of the backside contact trench 79, for example, by a recess etch.

In one embodiment, each molybdenum-containing portion 38 is laterally spaced from a vertical portion of a metallic barrier material portion 148 located at a same level by a respective metallic material portion 47 that comprises tungsten or a tungsten alloy.

Figure 22A:
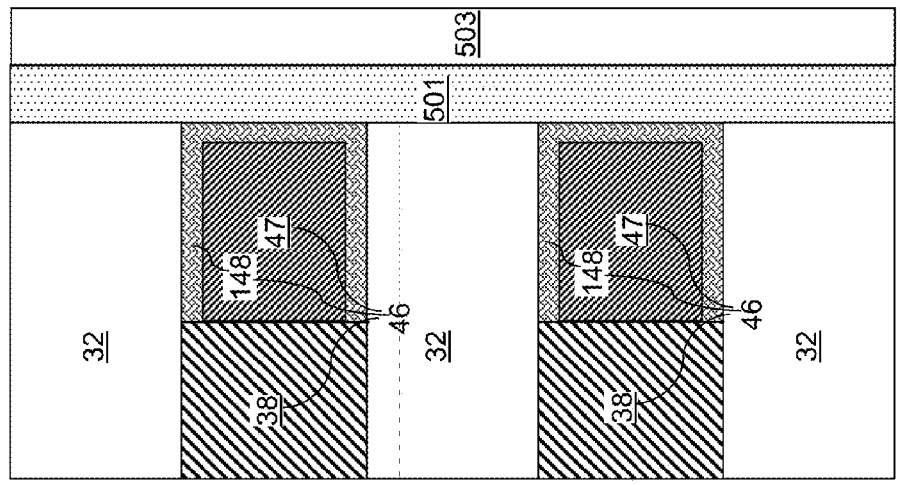
FIGS. 22A and 22B are sequential vertical cross-sectional views of a magnified region M in FIGS. 5A and 5B during formation of fourteenth exemplary electrically conductive layers according to a fourteenth embodiment of the present disclosure.
Figure 22B:
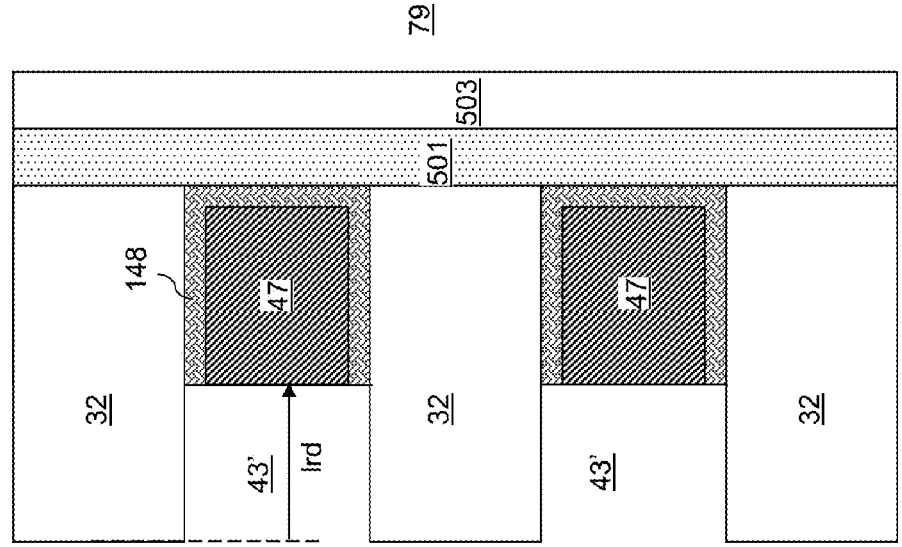

FIGS. 22A and 22B illustrate processing steps for forming fourteenth exemplary electrically conductive layers according to a fourteenth embodiment of the present disclosure. The structure of FIG. 22A can be derived from the structure of FIG. 21B by etching physically exposed portions of the metallic barrier material portions 148.

Alternatively, the structure of FIG. 22A can be derived from the structure of FIG. 21A by simultaneously etching, or by sequentially etching, the metallic material layer 47L and the metallic barrier material layer 148L. At least one isotropic etch process can be employed to laterally recess the metallic material layer 47L and the metallic barrier material layer 148L, and to form backside recesses 43'. After the isotropic etching of the metallic material layer 47L, the metallic material layer 47L can be divided into disjoined discrete material portions located within each respective level. Each disjoined discrete material portion of the metallic material layer 47L is herein referred to as a metallic material portion 47.

Subsequently, an isotropic etch process is employed to etch the physically exposed portions of the metallic barrier material layer 148L. In other words, an isotropic etch is employed to remove physically exposed portions of the metallic barrier material layer 148L at the processing step of FIG. 22A in lieu of an anisotropic etch that is employed to remove the portions of the metallic barrier material layer 148L within the backside contact trench 79 at the processing steps of FIG. 21B. The isotropic etch process that etches the physically exposed portions of the metallic barrier material layer 148L can be an isotropic dry etch or a wet etch.

The isotropic etch divides the metallic barrier material layer 148L into disjoined discrete material portions located within each respective level. Each disjoined discrete material portion of the metallic barrier material layer 148L is herein referred to as a metallic barrier material portion 148. Thus, portions of the metallic material layer 47L are etched back prior to removing the physically exposed portions of the metallic barrier material layer 148L. A distal sidewall of each metallic material portion 47 and a distal sidewall of each metallic barrier material portion 148 can be more proximal to the memory film 50 than the sidewall of the backside contact trench 79 is to the memory film 50 by the lateral recess distance lrd. A proximal sidewall of each metallic material portion 47 can contact an outer sidewall of a metallic barrier material portion 148.

Referring to FIG. 22B, the molybdenum-containing material can be deposited inside the backside cavities 43' to form molybdenum-containing portions 38. Deposition of the molybdenum-containing material can be performed employing the same methods as in the tenth embodiment. Molybdenum-containing portions 38 can grow only from the surfaces of the metallic material portions 47 and the metallic barrier material portions 148, and do not grow from the sidewalls of the insulator layers 32. As such, the molybdenum-containing material deposition process is a selective deposition process that proceeds from the surfaces of the metallic barrier material portions 148 and the surfaces of the metallic material portions 47, while molybdenum-containing material is not deposited on the surfaces of the insulator layers 32. Thus, each molybdenum-containing portion 38 can be formed on a respective metallic material portion 47 and a respective metallic barrier material portion 148, and specifically, on vertical sidewalls of the respective metallic material portion 47 and the respective metallic barrier material portion 148. Each deposited portion of the molybdenum-containing material constitutes one of the molybdenum-containing portions 38.

In one embodiment, the duration of the molybdenum-containing material deposition process can be selected such that the molybdenum-containing portions 38 completely fill the backside cavities 43'. A combination of a metallic barrier material portion 148, a molybdenum-containing portion 38 contacting horizontal surfaces of a pair of insulator layers 32, and a metallic material portion 47 encapsulated by the metallic barrier material portion 148 and the molybdenum-containing portion 38 constitutes an electrically conductive layer 46 at each level. Thus, each electrically conductive layer 46 can comprise a molybdenum-containing portion 38, a metallic material portion 47 including a metallic material other than molybdenum, and a metallic barrier material portion 148. Each electrically conductive layer 46 can be formed directly on horizontal surfaces of the insulating layers 32 and directly on an outer sidewall of the memory film 50. Optionally, an anisotropic etch or an isotropic etch can be performed to remove regions of the molybdenum-containing portions 38 inside backside contact trench 79. In this case, the molybdenum-containing portions 38 can have sidewalls that are vertically coincident with sidewalls of the insulator layers 32 around the backside contact trench 79. Optionally, the molybdenum-containing portions 38 may be laterally recessed from the sidewall of the backside contact trench 79, for example, by a recess etch. Each molybdenum-containing portion 38 contacts a horizontal surface of an overlying dielectric layer (e.g., an overlying insulator layer 32) and a horizontal surface of an underlying dielectric layer (e.g., an underlying insulator layer 32).

FIGS. 23A and 23B illustrate processing steps for forming fifteenth exemplary electrically conductive layers according to a fifteenth embodiment of the present disclosure. The structure of FIG. 23A can be derived from the structure of FIG. 18A by depositing a molybdenum-containing layer 38L on the metallic barrier material layer 148L. The molybdenum-containing layer 38L can be deposited employing the same deposition methods as the deposition methods employed to deposit the molybdenum-containing portions 38 of FIG. 18C or the molybdenum-containing layer 38L of FIG. 19A. The thickness of the molybdenum-containing layer 38L can be selected such that the backside cavities 43' are not completely filled with the molybdenum-containing layer 38L. For example, the duration of the molybdenum-containing material deposition process in a chemical vapor deposition process or the number of cycles in an atomic layer deposition process can be selected such that the backside recesses 43 are not completely filled at the end of the deposition process. Thus, a backside cavity 43' is present within each backside recess 43 after formation of the molybdenum-containing layer 38L.

Referring to FIG. 23B, an anisotropic etch is performed to remove vertical portions of the metallic barrier material layer 148L and the molybdenum-containing layer 38L from the sidewalls of each backside contact trench 79. The anisotropic etch can be a reactive ion etch that removes the materials of the metallic barrier material layer 148L and the molybdenum-containing layer 38L selective to the material of the insulator layers 32 and the material of the semiconductor material layer 10. Portions of the metallic barrier material layer 148L and the molybdenum-containing layer 38L inside the backside recesses 43 are not removed by the anisotropic etch. Each remaining portion of the metallic barrier material layer 148L inside the backside recesses 43 constitutes a metallic barrier portion 148. Each remaining portion of the molybdenum-containing layer 38L inside the backside recesses 43 constitutes a molybdenum-containing portion 38. Each metallic barrier material portion 148 can be a conformal material portion having a uniform thickness throughout. Likewise, each molybdenum-containing portion 38 can be a conformal material portion having another uniform thickness throughout. Sidewalls of the insulator layers 32 are physically exposed within each backside contact trench 79. The metallic barrier material portions 148 are formed as a plurality structures that are vertically disjoined from one another. Further, the molybdenum-containing portions 38 are formed as a plurality structures that are vertically disjoined from one another. Each molybdenum-containing portion 38 of the electrically conductive layers 46 is formed on surfaces of a respective metallic barrier material portion 148.

Figure 23C:
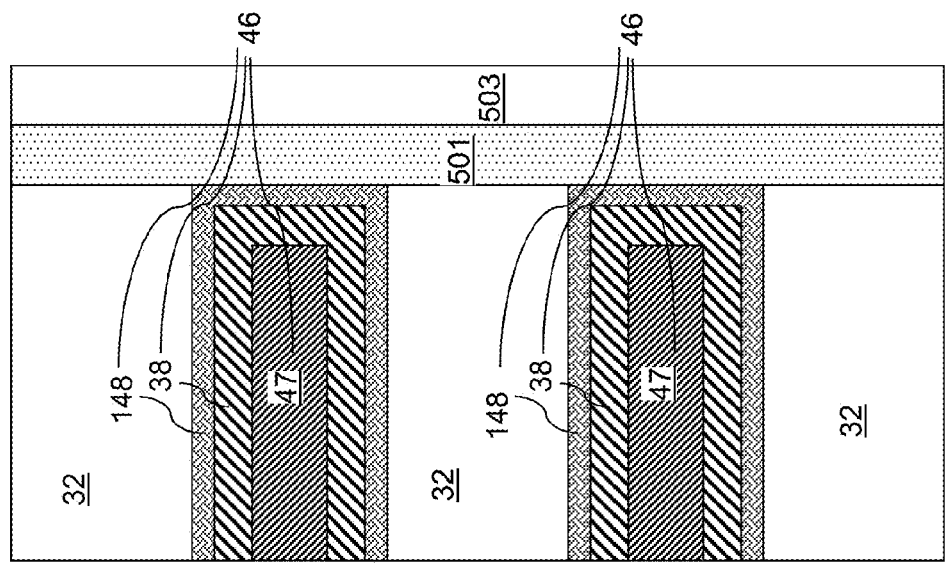

Referring to FIG. 23C, a metallic material can be deposited inside the backside cavities 43' to form metallic material portions 47. The metallic material portions 47 can include any metallic material other than molybdenum. In one embodiment, the metallic material portions 47 can consist essentially of a single elemental metal or an intermetallic alloy of at least two elemental metals. For example, the metallic material portions 47 can comprise cobalt, tungsten, copper, titanium, ruthenium, or a combination thereof. In one embodiment, the metallic material portions 47 can comprise tungsten or a tungsten-containing intermetallic alloy.

Deposition of the metallic material can be performed employing the same methods as in the twelfth embodiment. In one embodiment, the metallic material portions 47 can grow from the surfaces of the molybdenum-containing portions 38, and do not grow from the sidewalls of the insulator layers 32. As such, the metallic material deposition process is a selective deposition process that proceeds from the surfaces of the molybdenum-containing portions 38, while the metallic material is not deposited on the surfaces of the insulator layers 32. Thus, each metallic material portion 47 can be formed on surfaces of a respective molybdenum-containing portion 38, and specifically, on a pair of horizontal surfaces of the respective molybdenum-containing portion 38 and an outer sidewall of the respective molybdenum-containing portion 38. Each deposited portion of metallic material constitutes one of the metallic material portions 47.

The duration of the metallic material deposition process can be selected such that the metallic material portions 47 completely fill the backside cavities 43'. A metallic material portion 47 is formed on a respective molybdenum-containing portion 38 in each backside cavity 43', i.e., in the vacant portion of each backside recess. A combination of a metallic barrier material portion 148, a molybdenum-containing portion 38 embedded within the metallic barrier material portion 148, and a metallic material portion 47 embedded within the molybdenum-containing portion 38 constitutes an electrically conductive layer 46 at each level. Thus, each electrically conductive layer 46 can comprise a molybdenum-containing portion 38, a metallic material portion 47 including a metallic material other than molybdenum, and a metallic barrier material portion 148. Each electrically conductive layer 46 can be formed directly on horizontal surfaces of the insulating layers 32 and directly on an outer sidewall of the memory film 50. Each metallic material portion 47 is vertically and laterally spaced from a metallic barrier material portion 148 located at a same level by a respective molybdenum-containing portion 38. Optionally, the molybdenum-containing portions 38 and/or the metallic material portions 47 can be laterally recessed from the sidewall of the backside contact trench 79.

Figure 24B:
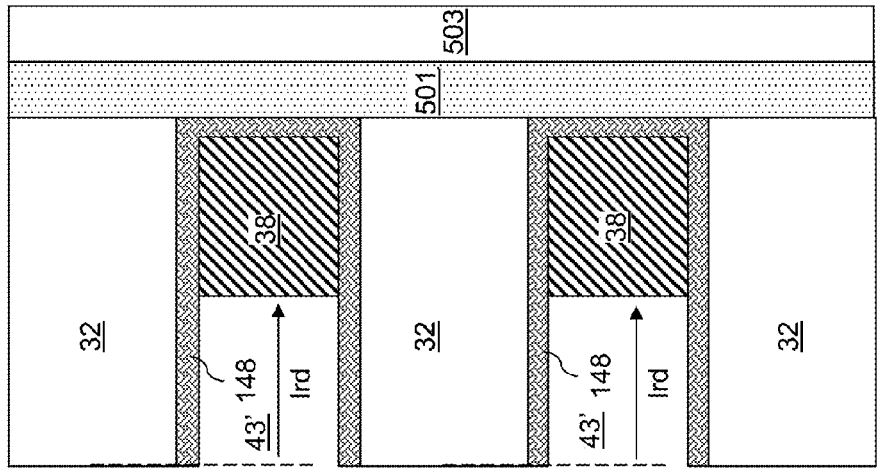
FIGS. 24A-24C are sequential vertical cross-sectional views of a magnified region M in FIGS. 5A and 5B during formation of sixteenth exemplary electrically conductive layers according to a sixteenth embodiment of the present disclosure.
Figure 24A:
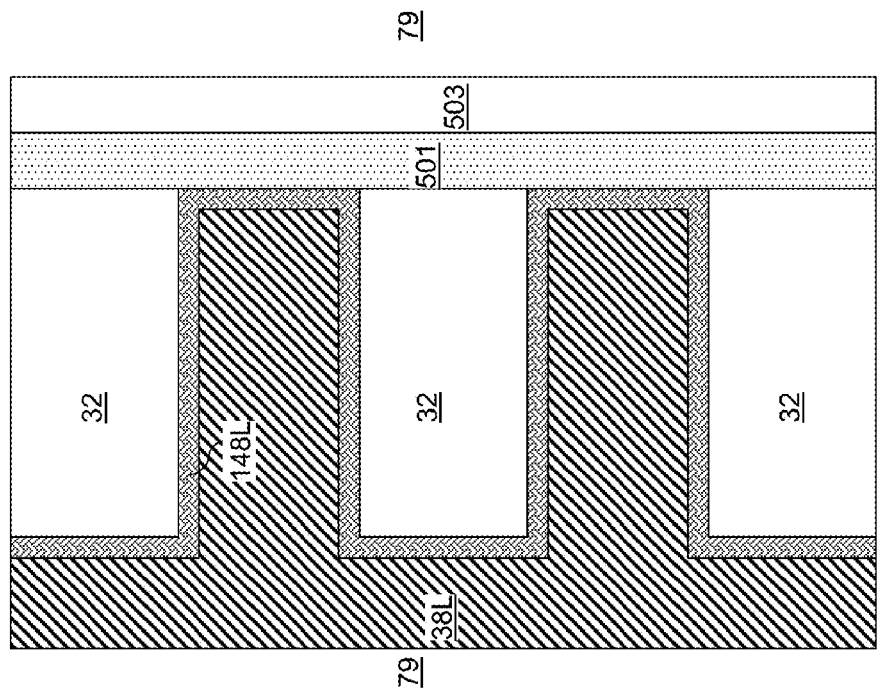
Figure 24C:
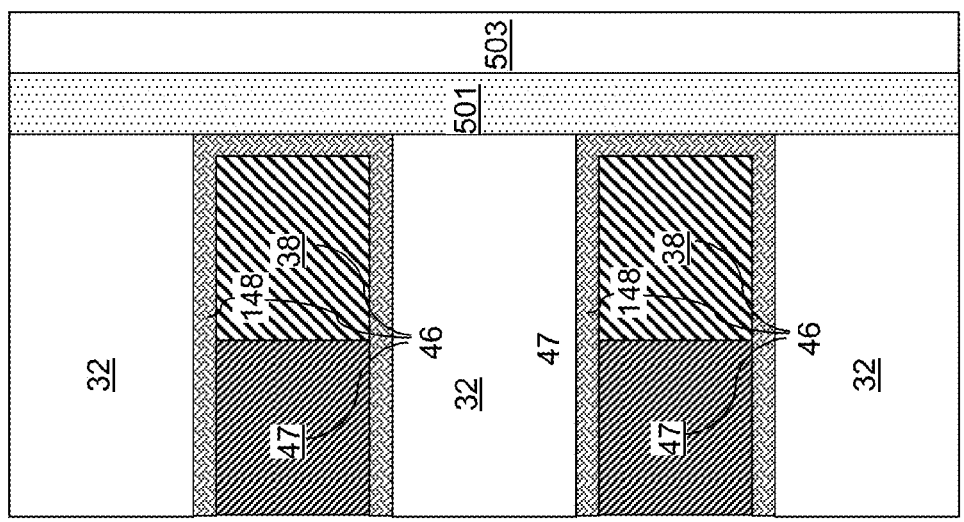

FIGS. 24A-24C illustrate processing steps for forming sixteenth exemplary electrically conductive layers according to a sixteenth embodiment of the present disclosure. The structure of FIG. 24A can be the same as the structure of FIG. 19A according to the eleventh embodiment, and can be formed employing the same method as the eleventh embodiment. In one embodiment, the molybdenum-containing layer 38L can consist essentially of molybdenum-containing.

Referring to FIG. 24B, the molybdenum-containing layer 38L can be isotropically etched to physically expose the sidewall of the metallic barrier material layer 148L located adjacent to the sidewall of each backside contact trench 79. The isotropic etch of the molybdenum-containing material can be performed by an isotropic dry etch process or a wet etch process. The isotropic etch of the molybdenum-containing layer 38L can be selective to the material of the metallic barrier material layer 148L. The duration of the isotropic etch can be selected such that remaining portions of the molybdenum-containing layer 38L are laterally recessed from the sidewall of the backside contact trench 79 by a lateral recess distance lrd. The molybdenum-containing layer 38L is divided into disjoined discrete material portions located within each respective level. Each disjoined discrete material portion of the molybdenum-containing layer 38L is herein referred to as a molybdenum-containing portion 38. Each molybdenum-containing portion 38 of the electrically conductive layers 46 is formed on surfaces of a respective metallic barrier material portion 148. Alternatively, a combination of an anisotropic etch and an isotropic etch can be employed to form the structure of FIG. 24B.

In one embodiment, the lateral recess distance lrd can be greater than the height of a backside recess 43, which is the same as the height of a metallic barrier material portion 148 within the backside recess 43. In one embodiment, the lateral recess distance lrd can be in a range from 15% to 85% of the lateral distance between the sidewall of the backside contact trench 79 and the outer sidewall of the memory film 50, e.g., the outer sidewall of the at least one blocking dielectric layer (501L, 503L). In one embodiment, the lateral recess distance lrd can be determined to optimize the resistance of the electrically conductive layers to be formed in the backside recesses and the overall stress that the electrically conductive layers will generate. A distal sidewall of each molybdenum-containing portion 38 is more proximal to the memory film 50 than the sidewall of the backside contact trench 79 is to the memory film 50 by the lateral recess distance lrd. A proximal sidewall of each molybdenum-containing portion 38 can contact an outer sidewall of a metallic barrier material portion 148. A proximal sidewall of each molybdenum-containing portion 38 is laterally spaced from the memory film 50 by a vertical portion of a respective metallic barrier material portion 148, and each molybdenum-containing portion 38 is laterally recessed from the backside contact trench 79.

Subsequently, an anisotropic etch is performed to remove vertical portions of the metallic barrier material layer 148L from the sidewalls of each backside contact trench 79. The anisotropic etch can be a reactive ion etch that removes the material of the metallic barrier material layer 148L selective to the material of the insulator layers 32 and the material of the semiconductor material layer 10. Portions of the metallic barrier material layer 148L inside the backside recesses 43 are not removed by the anisotropic etch. Each remaining portion of the metallic barrier material layer 148L inside the backside recesses 43 constitutes a metallic barrier portion 148. Thus, portions of the molybdenum-containing layer 38L are etched back prior to removing the vertical portions of the metallic barrier material layer 148L. Each remaining portion of the molybdenum-containing layer 38L constitutes a molybdenum-containing portion 38 of electrically conductive layers to be formed.

Referring to FIG. 24C, a metallic material can be deposited inside the backside cavities 43' to form metallic material portions 47. The metallic material portions 47 can include any metallic material other than molybdenum. In one embodiment, the metallic material portions 47 can consist essentially of a single elemental metal or an intermetallic alloy of at least two elemental metals. For example, the metallic material portions 47 can comprise cobalt, tungsten, copper, titanium, ruthenium, or a combination thereof. In one embodiment, the metallic material portions 47 can comprise tungsten or a tungsten-containing intermetallic alloy. Deposition of metallic material can be performed employing the same methods as in the twelfth embodiment. The metallic material portions 47 can grow only from the surfaces of the molybdenum-containing portions 38 and the metallic barrier material portions 148, and do not grow from the sidewalls of the insulator layers 32. As such, the metallic material deposition process is a selective deposition process that proceeds from the surfaces of the metallic barrier material portions 148 and the surfaces of the molybdenum-containing portions 38, while the metallic material is not deposited on the surfaces of the insulator layers 32. Thus, each metallic material portion 47 can be formed on a respective molybdenum-containing portion 38 and a respective metallic barrier material portion 148, and specifically, on a pair of horizontal surfaces of the respective metallic barrier material portion 148 and an outer sidewall of the respective molybdenum-containing portion 38. Each deposited portion of metallic material constitutes one of the metallic material portions 47.

In one embodiment, the duration of the metallic material deposition process can be selected such that the metallic material portions 47 completely fill the backside cavities 43'. A metallic material portion 47 is formed on a respective molybdenum-containing portion 38 in each backside cavity 43', i.e., in the vacant portion of each backside recess. A combination of a metallic barrier material portion 148, a metallic material portion 47 contacting horizontal surfaces of the metallic barrier material portion 148, and a molybdenum-containing portion 38 encapsulated by the metallic barrier material portion 148 and the metallic material portion 47 constitutes an electrically conductive layer 46 at each level. Thus, each electrically conductive layer 46 can comprise a metallic material portion 47, a molybdenum-containing portion 38 including molybdenum-containing, and a metallic barrier material portion 148 including a metallic material other than molybdenum. Each electrically conductive layer 46 can be formed directly on horizontal surfaces of the insulating layers 32 and directly on an outer sidewall of the memory film 50. Each metallic material portion 47 contacts a pair of horizontal surfaces of a metallic barrier material portion 148 located at the same level and a distal sidewall of the molybdenum-containing portion 38 located at the same level. Optionally, an anisotropic etch can be performed to remove regions of the metallic material portions 47 inside backside contact trench 79. In this case, the metallic material portions 47 can have sidewalls that are vertically coincident with sidewalls of the insulator layers 32 around the backside contact trench 79. Optionally, the metallic material portions 47 may be laterally recessed from the sidewall of the backside contact trench 79, for example, by a recess etch.

Figure 25A:
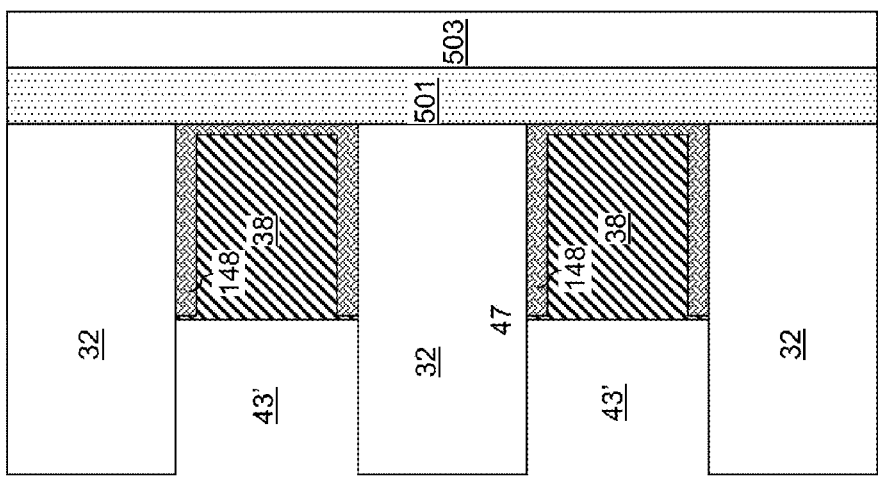
FIGS. 25A and 25B are sequential vertical cross-sectional views of a magnified region M in FIGS. 5A and 5B during formation of seventeenth exemplary electrically conductive layers according to a seventeenth embodiment of the present disclosure.
Figure 25B:
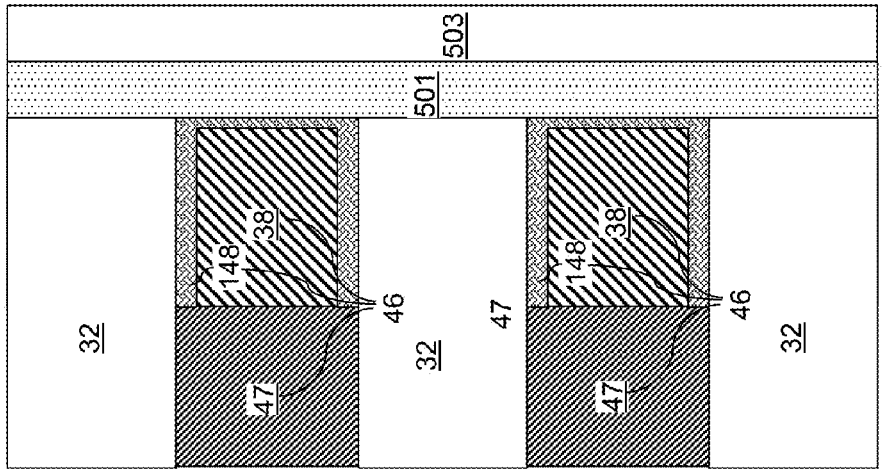

FIGS. 25A-25B illustrate processing steps for forming seventeenth exemplary electrically conductive layers according to a seventeenth embodiment of the present disclosure. The structure of FIG. 25A can be derived from the exemplary structure of FIG. 24B by isotropically etching physically exposed portions of each metallic barrier material portion 148. Alternately, the metallic barrier material portions 148 can be laterally recessed at about the same etch rate as the molybdenum-containing portion 38 from the exemplary structure of FIG. 24A.

Referring to FIG. 25B, the processing steps of FIG. 24C can be performed to form the metallic material portions 47, which can be, for example, tungsten portions. The metallic material portions 47 grow from the respective vertical metallic surfaces of the metallic barrier material portion 148 and the molybdenum-containing portion 38 at each level. Each metallic material portion 47 can contact a horizontal surface of an underlying dielectric layer (which can be, for example, an underlying insulator layer 32) and a horizontal surface of an overlying dielectric layer (which can be, for example, an overlying insulator layer 32).

FIGS. 26A-26E illustrate processing steps for forming eighteenth exemplary electrically conductive layers according to an eighteenth embodiment of the present disclosure. The structure of FIG. 26A can be derived from the structure of FIGS. 5A and 5B by forming a backside blocking dielectric layer 51 prior to formation of a metallic barrier material layer 148L. The backside blocking dielectric layer 51 includes a dielectric material, which can comprise a high dielectric constant (high-k) dielectric material having a dielectric constant greater than 7.9 (such as aluminum oxide), and/or silicon oxide and/or silicon nitride. The backside blocking dielectric layer 51 can be formed, for example, by chemical vapor deposition (CVD) or atomic layer deposition (ALD). The thickness of the backside blocking dielectric layer 51 can be in a range from 0.5 nm to 1.5 nm, although lesser and greater thicknesses can also be employed. The metallic barrier material layer 148L can be formed in the same manner as in the tenth embodiment.

Figure 26B:
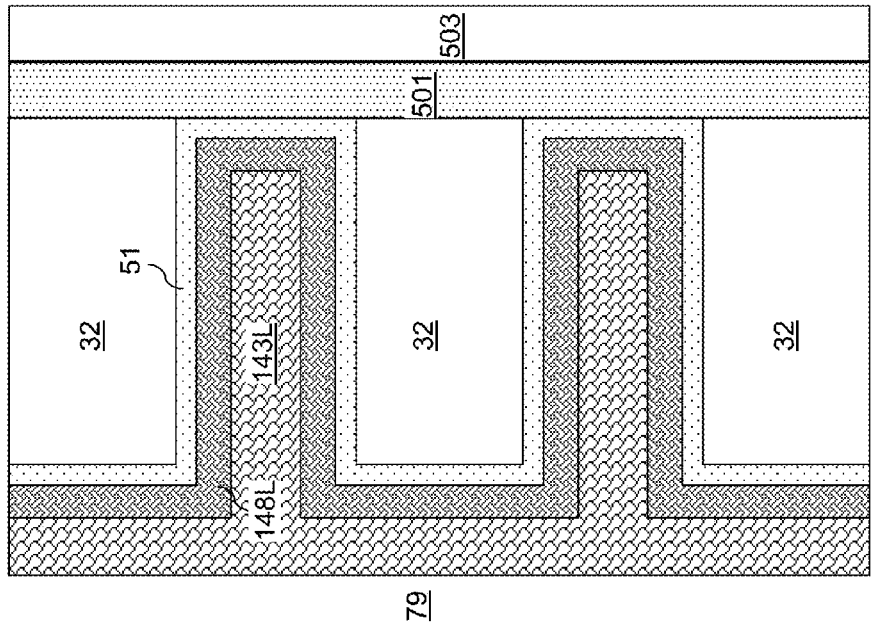
Figure 26A:
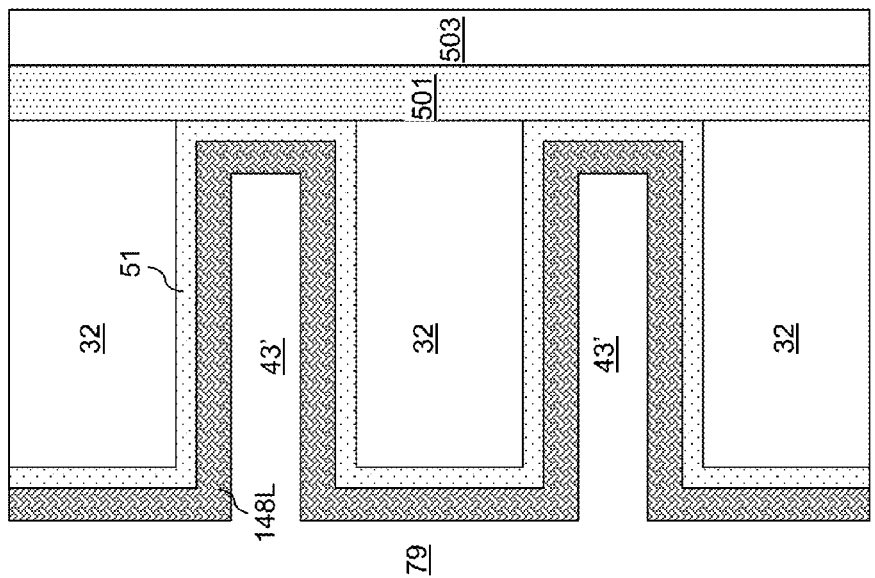

Referring to FIG. 26B, a disposable material layer 143L is formed in the backside cavities 43'. The disposable material layer 143L can fill the entirety of the backside cavities 43'. As used herein, a "disposable" material refers to a temporary material that is subsequently removed. The disposable material layer 143L includes a material that can be removed selective to the material of the metallic barrier material layer 148L. In one embodiment, the disposable material layer 143L can comprise a semiconductor material such as polysilicon, amorphous silicon, a silicon-germanium alloy, or a combination thereof. The disposable material layer 143L can be deposited, for example, by chemical vapor deposition.

Referring to FIG. 26C, the material of the disposable material layer 143L and the metallic barrier material layer 148L are isotropically or anisotropically etched to physically expose sidewalls of the backside blocking dielectric layer 51. The etching of the disposable material layer 143L can be performed by a dry etch or a wet etch. For example, if the disposable material layer 143L comprises silicon, the disposable material layer 143L can be etched by an etch process employing one or more of BCl3; a combination of SiCl4, Cl2, and HCl; a combination of O2, SiCl4, and HCl; SF6; and NF3. Each remaining portion of the disposable material layer 143L within a backside recess is herein referred to as a disposable material portion 143.

Subsequent to, or concurrently with, the etch of the vertical portion of the disposable material layer 143L, physically exposed portions of the metallic barrier material layer 148L is removed by an etch selective to the backside blocking dielectric layer 51. Each remaining portion of the metallic barrier material layer 148L constitutes a metallic barrier material portion 148. In other words, a metallic barrier material portion 148 and a disposable material portion 143 can be formed at each level of the of backside recesses by removing vertical portions of the disposable material layer 143L and the metallic barrier material layer 148L, respectively.

Referring to FIG. 26D, the disposable material portions 143 can be removed by an isotropic etch that etches the material of the disposable material portions 143. A backside cavity 43' can be formed within the volume of each backside recess.

Figure 26E:
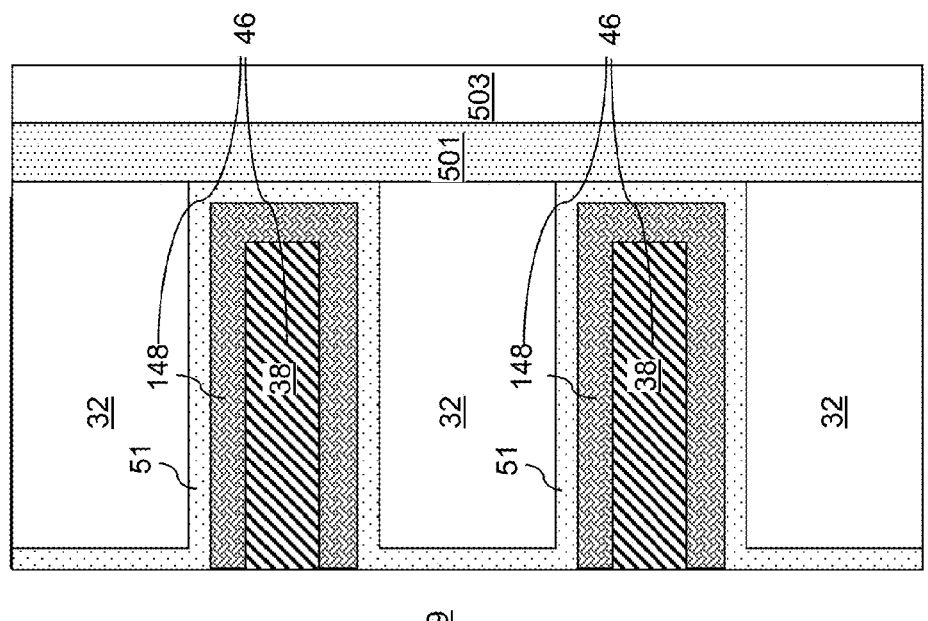

Referring to FIG. 26E, the processing step of FIG. 18C can be performed to form molybdenum-containing portions 38. Each molybdenum-containing portion 38 is embedded within a metallic barrier material portion 148. Optionally, the processing steps of FIG. 18D may be performed.

A combination of a metallic barrier material portion 148 and a molybdenum-containing portion 38 embedded within the metallic barrier material portion 148 constitutes an electrically conductive layer 46 at each level. Thus, each electrically conductive layer 46 can consist of a molybdenum-containing portion 38 and a metallic barrier material portion 148. Each electrically conductive layer 46 can be vertically spaced from an overlying insulating layer 32, an underlying insulating layer 32, and the memory film 50 by the backside blocking dielectric layer 51. Each molybdenum-containing portion 38 of the electrically conductive layers 46 is formed on surfaces of a respective metallic barrier material portion 148. Specifically, each molybdenum-containing portion 38 of the electrically conductive layers 46 is formed on a pair of horizontal surfaces of the respective metallic barrier material portion and an outer sidewall of the respective metallic barrier material portions. The disposable material layer 143L may be used in conjunction with other embodiments.

After formation of any of the electrically conductive layers according to any of the tenth to eighteenth embodiments, the processing steps of FIGS. 15, 16, and 17A and 17B can be sequentially performed to provide a three-dimensional memory device of additional embodiments of the present disclosure, which differs from the three-dimensional memory device employing any of the first through ninth exemplary conductive layers by the composition of the electrically conductive layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a stack of alternating layers comprising insulator layers and electrically conductive layers and located over a substrate;
memory stack structures extending through the stack of alternating layers, wherein each of the memory stack structures includes a memory film and a semiconductor channel located inside the memory film, and the memory film comprises a blocking dielectric, at least one charge storage element, and a tunneling dielectric contacting the semiconductor channel; and
a backside contact trench laterally offset from the memory stack structures and vertically extending through the stack of alternating layers and including a backside contact structure comprising a conductive material therein, wherein the conductive material of the backside contact structure extends through the stack of alternating layers, is electrically isolated from the electrically conductive layers by an insulating spacer that laterally surrounds the backside contact structure and continuously extends from a topmost layer of the stack of alternating layers to a bottommost layer of the stack of alternating layers, and wherein the backside contact structure and the insulating spacer physically contact a semiconductor material portion in the substrate,
wherein:
each of the electrically conductive layers comprises a molybdenum containing portion, a metallic material portion consisting essentially of tungsten or an intermetallic alloy of tungsten and the molybdenum-containing portion, and a metallic barrier material portion;
the metallic barrier material portion embeds a combination of the molybdenum containing portion and the metallic material portion;

the molybdenum containing, portion is spaced from the metallic barrier material portion by the metallic material portion;
the metallic barrier material portion includes a upper horizontal portion and a lower horizontal portion that laterally extend parallel to a top surface of the substrate and a vertical portion adjoined to the upper horizontal portion and the lower horizontal portion of the metallic barrier material portion;
the metallic material portion includes a upper horizontal portion and a lower horizontal portion that laterally extend parallel to the top surface of the substrate and a vertical portion adjoined to the upper horizontal portion and the lower horizontal portion of the metallic material portion, wherein the upper horizontal portion of the metallic material portion contacts a bottom surface of the upper horizontal portion of the metallic barrier material portion, the lower horizontal portion of the metallic material portion contacts a top surface of the lower horizontal portion of the metallic barrier material portion, and a first sidewall of the vertical portion of the metallic material portion contacts a sidewall of the vertical portion of the metallic barrier material portion; and
the molybdenum-containing portion including a top surface that contacts a bottom surface of the upper horizontal portion of the metallic material portion, a bottom surface that contacts a top surface of the lower horizontal portion of the metallic material portion, and a first sidewall that contacts a second sidewall of the vertical portion of the metallic material portion; and
an outer sidewall of the insulating spacer physically contacts a sidewall of each upper horizontal portion of the metallic barrier material portions, a sidewall of each lower horizontal portion of the metallic barrier material portions, a sidewall of each upper horizontal portion of the metallic material portions, a sidewall of each lower horizontal portion of the metallic material portions, and a second sidewall of each of the molybdenum-containing portions.

2. The three-dimensional memory device of claim 1, wherein the electrically conductive layers comprise:
a first control gate electrode located in a first device level; and
a second control gate electrode located in a second device level that is located below the first device level.

3. The three-dimensional memory device of claim 1, wherein:
the three-dimensional memory device comprises a vertical NAND device located in a device region; and
the electrically conductive layers comprise, or are electrically connected to a respective word line of the vertical NAND device.

4. The three-dimensional memory device of claim 3, wherein:
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the stack are in electrical contact with the plurality of control gate electrodes and extend from the device region to a contact region including a plurality of electrically conductive via connections; and the substrate comprises a silicon substrate containing a driver circuit for the NAND device.

5. The three-dimensional memory device of claim 1, wherein the molybdenum-containing portion is selected from pure molybdenum, a molybdenum tungsten alloy, a molybdenum tungsten and phosphorus alloy, a molybdenum manganese alloy or a molybdenum titanium alloy.

6. The three-dimensional memory device of claim 1, wherein each of the metallic barrier material portions is a metal nitride barrier material layer having a thickness of 1 to 2 nm which is located between the molybdenum-containing portion and the blocking dielectric.

7. The three-dimensional memory device of claim 1, wherein the molybdenum-containing portion does not physically contact the metallic barrier material portion.

8. The three-dimensional memory device of claim 1, wherein each of the metallic barrier material portions is a conductive metallic nitride layer.

9. The three-dimensional memory device of claim 8, wherein each of the metallic barrier material portions consists essentially of a material selected from TiN, TaN, WN, a combination thereof, and an alloy thereof.

10. The three-dimensional memory device of claim 1, wherein each of the metallic barrier material portions consists essentially of cobalt, tungsten, copper, ruthenium, or titanium, or a combination thereof.

11. The three-dimensional memory device of claim 1, wherein each of the molybdenum-containing portions is laterally spaced from the blocking dielectric by the vertical portions of the metallic barrier material portions and the metallic material portions.

12. The three-dimensional memory device of claim 1, wherein the molybdenum-containing portion consists essentially of molybdenum.

13. The three-dimensional memory device of claim 1, wherein each of the metallic barrier material portions physically contacts a portion of a sidewall of the blocking dielectric.

14. The three-dimensional memory device of claim 1, wherein each of the metallic barrier material portions physically contacts an overlying insulator layer in the stack of alternating layers and physically contacts an underlying insulator layer in the stack of alternating layers.

15. The three-dimensional memory device of claim 1, wherein the metallic material portion consists essentially of the tungsten.

16. The three-dimensional memory device of claim 1, wherein the metallic material portion consists essentially of the intermetallic alloy of the tungsten and the molybdenum-containing portion.

* * * * *